(12) United States Patent
Park et al.

(10) Patent No.: US 10,698,367 B2
(45) Date of Patent: Jun. 30, 2020

(54) ELECTRONIC DEVICE INCLUDING WATERPROOF STRUCTURE

(71) Applicant: Samsung Electronics Co., Ltd., Gyeonggi-do (KR)

(72) Inventors: Sung-Eun Park, Gyeonggi-do (KR); Jong-Chun Wee, Gyeonggi-do (KR); Wook-Jin Lee, Suwon-si (KR); Jae-Uk Ahn, Incheon (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 115 days.

(21) Appl. No.: 16/115,683

(22) Filed: Aug. 29, 2018

(65) Prior Publication Data

US 2019/0072903 A1 Mar. 7, 2019

(30) Foreign Application Priority Data

Sep. 5, 2017 (KR) .......................... 10-2017-0113408

(51) Int. Cl.
*H05K 5/06* (2006.01)
*G04B 37/08* (2006.01)
(Continued)

(52) U.S. Cl.
CPC .............. *G04B 37/08* (2013.01); *G04G 13/00* (2013.01); *G04G 17/02* (2013.01); *G04G 17/04* (2013.01);
(Continued)

(58) Field of Classification Search
CPC .......... H02G 3/08; H02G 3/081; H02G 3/088; G04B 37/088; G04B 37/08; G04B 37/082;
(Continued)

(56) References Cited

U.S. PATENT DOCUMENTS 5,638,256 A * 6/1997 Leach ...................... H02B 1/50
361/641
7,166,024 B2 * 1/2007 Mashiko .................. H02K 5/10
454/370
(Continued)

FOREIGN PATENT DOCUMENTS

JP 2001-128272 A 5/2001
KR 10-2011-0021481 A 3/2011
(Continued)

OTHER PUBLICATIONS

International Search Report dated Dec. 6, 2018.

*Primary Examiner* — Angel R Estrada
(74) *Attorney, Agent, or Firm* — Cha & Reiter, LLC.

(57) ABSTRACT

An electronic device is disclosed including a housing including an outer wall, an inner, and a first through hole formed in the inner space, an audio module located in the inner space, a support structure located in the inner space between the audio module and the first through hole and including a second through hole; and a waterproof structure located in the inner space between the support structure and the outer wall including a flexible gasket. The gasket may include an outer rim, a recess portion moveable between the first through hole and the second through hole, and a connection portion between the rim and the recess portion, including at least one opening around the recess portion, such that the opening and the second through-hole form a sound path between the audio module and the first through-hole in the absence of pressure from an external liquid.

20 Claims, 36 Drawing Sheets

(51) Int. Cl.
*G04G 17/02* (2006.01)
*H04R 1/44* (2006.01)
*G04G 17/08* (2006.01)
*G04G 17/04* (2006.01)
*G04G 13/00* (2006.01)
*H04R 1/02* (2006.01)
*H04R 1/10* (2006.01)

(52) U.S. Cl.
CPC ............. *G04G 17/08* (2013.01); *H04R 1/023* (2013.01); *H04R 1/44* (2013.01); *H05K 5/061* (2013.01); *H04R 1/025* (2013.01); *H04R 1/1041* (2013.01); *H04R 2420/07* (2013.01); *H04R 2420/09* (2013.01)

(58) Field of Classification Search
CPC .... G04B 37/081; G04B 37/084; G04B 17/00; G04B 17/08; H04R 1/023; H04R 1/44; H04R 1/025; H04R 1/1041; H04R 2420/07; H04R 2420/09
USPC ....... 174/50, 520, 53, 57, 58, 152 G, 153 G, 174/152 R, 135, 535, 539; 220/3.2–3.9, 220/4.02; 361/600, 601, 641, 724, 730; 277/590, 596, 602, 644, 647
See application file for complete search history.

(56) References Cited

U.S. PATENT DOCUMENTS

| | | | |
|---|---|---|---|
| 7,189,918 B2* | 3/2007 | Sakata | B60R 16/0239 174/17 VA |
| 7,737,360 B2* | 6/2010 | Wiemeyer | H04Q 1/13 174/481 |
| 7,829,786 B2* | 11/2010 | Fuerstenberg | H05K 5/06 174/50 |
| 8,253,015 B2* | 8/2012 | Chang | G06F 1/181 174/50 |
| 9,510,097 B1* | 11/2016 | Tsai | H04R 1/086 |
| 9,820,033 B2* | 11/2017 | Dix | H04R 1/2826 |
| 9,832,567 B2* | 11/2017 | Zhang | H05K 5/0213 |
| 9,886,005 B2* | 2/2018 | White | G04B 37/08 |
| 10,285,643 B2* | 5/2019 | Perkins | G04B 37/00 |
| 2016/0212526 A1 | 7/2016 | Salvatti et al. | |
| 2017/0180850 A1 | 6/2017 | Hsu et al. | |

FOREIGN PATENT DOCUMENTS

| | | |
|---|---|---|
| KR | 10-2013-0017198 A | 2/2013 |
| KR | 10-2017-0045090 A | 4/2017 |

* cited by examiner

ELECTRONIC DEVICE INCLUDING WATERPROOF STRUCTURE

CROSS-REFERENCE TO RELATED APPLICATION

This application is based on and claims priority under 35 U.S.C. § 119 of Korean Patent Application No. 10-2017-0113408, filed on Sep. 5, 2017, in the Korean Intellectual Property Office, the disclosure of which is incorporated herein by reference in its entirety.

BACKGROUND

1. Field

Various embodiments relate to an electronic device, and more particularly, to an electronic device including a waterproof structure.

2. Description of the Related Art

The term "electronic device" refers to a device that performs a specific function according to an equipped program, such as an electronic scheduler, a portable multimedia reproducer, a mobile communication terminal, a tablet PC, an image/sound device, a desktop/laptop PC, or a vehicular navigation system, as well as home appliances. For example, such an electronic device may output information stored therein as sound or an image. As the integration degree of such electronic devices has increased, and super-high speed and large-capacity wireless communication has become popular, various functions have recently been provided in a single mobile communication terminal. For example, not only a communication function, but also various functions, such as an entertainment function (e.g., a game function), a multimedia function (e.g., a music/video reproducing function), a communication and security function for mobile banking, or a function for schedule management or an e-wallet, are integrated in a single electronic device.

Recently, as electronic communication technology has advanced, electronic devices have been miniaturized, and as a result, electronic devices, which are wearable on a portion of a human body, such as a wrist or a head, have become commercially available.

In recent years, wearable electronic devices, which are worn on a human body, have been added to electronic devices, starting with mobile communication terminals. The electronic devices have been gradually reduced in weight, thickness, length, and size, and have been provided with various functions so as to satisfy consumer demand. Various functions provided by the electronic devices include functions that are executed using audio modules and sensors. These audio modules (e.g., speakers and/or microphones) are capable of transmitting and receiving sound signals associated with an electronic device, outside of an electronic device, or a user.

SUMMARY

An electronic device includes a waterproof structure in an internal electronic component itself or in an electronic device structure in order to protect internal electronic components (e.g., a speaker, a microphone, and/or a sensor) from an external fluid or the like. However, when certain levels of external pressure (for example, a high water pressure of 3 atm or more) is generated, the internal electronic components may be damaged due to breakage of the waterproof structure. As a result, deterioration of sound quality of reproduced sound of, for example, the speaker and/or the microphone included in the electronic device, or reduction in sound pressure may occur. In addition, when a strong pressure is applied to the inside of the electronic device from the outside, the fluid or the like that has flowed into a conduit in each component may be unable to escape the interior of the electronic device, and thus, components may be damaged, which may cause the functions of the components to be lost.

According to various embodiments, an electronic device may include a waterproof structure that is capable of preventing internal components from being damaged by a high pressure applied from the outside of the electronic device to the inside of the electronic device.

According to various embodiments, an electronic device may include a waterproof structure that is capable of easily discharging foreign matter such as fluid or the like that has flowed into the electronic device, to the outside.

According to various embodiments, electronic device is disclosed, including a housing including an outer wall at least partially defining an inner space, the outer wall defining a first through hole allowing access into the inner space, an audio module disposed within the inner space, a support structure disposed within the inner space between the audio module and the first through hole, wherein the support structure defines a second through-hole, and a waterproof structure disposed within the inner space between the support structure and the outer wall, wherein the waterproof structure includes a flexible gasket. The flexible gasket includes an outer rim fixed between the support structure and a portion of the outer wall as to circumferentially surround the first through hole, a recess portion movably interposed between the first through hole and the second through hole, wherein the recess portion is oriented towards the second through-hole, and a connection portion formed between the rim and the recess portion, wherein the connection portion is disposed circumferentially surrounding the recess portion and defines at least one opening, such that the at least one opening and the second through-hole form at least part of a path through which sound can propagate between the audio module and the first through hole in the absence of pressure applied against the recess portion by an external liquid.

According to various embodiments, an electronic device is disclosed including a housing including at least one first through hole opening to an exterior of the electronic device, an audio module disposed within the housing, a support structure disposed adjacent to the audio module and defining a second through hole corresponding to the first through hole, and a waterproof structure disposed on a seating portion formed around the second through hole of the support structure. The waterproof structure includes: a bracket including at least one hole connected to a conduit in communication with an interior of the support structure, a flexible gasket including an outer rim disposed to provide a seal along a periphery of the first through hole, and a recess portion made of an elastic material at least partially inserted into the at least one hole of the bracket such that the recess portion is moveable according to compression by an external fluid; and a membrane disposed opposite the flexible gasket such that the bracket is interposed between the membrane and the flexible gasket. According to various embodiments, an electronic device including a waterproof structure is capable of preventing a speaker component disposed therein from being damaged or a sealed region around the speaker from being broken, against a high pressure applied to the inside of the electronic device from the outside.

According to various embodiments, an electronic device including a waterproof structure is capable of preventing a microphone component disposed therein from being damaged, against a high pressure applied to the inside of the electronic device from the outside. For example, it is possible to prevent a high pressure from being transferred to a membrane.

According to various embodiments, an electronic device including a waterproof structure is capable of preventing components such as a sensor disposed therein from being damaged, against a high pressure applied to the inside of the electronic device from the outside, and capable of easily discharging foreign matter such as a fluid, which has flowed into the inside of the electronic device.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
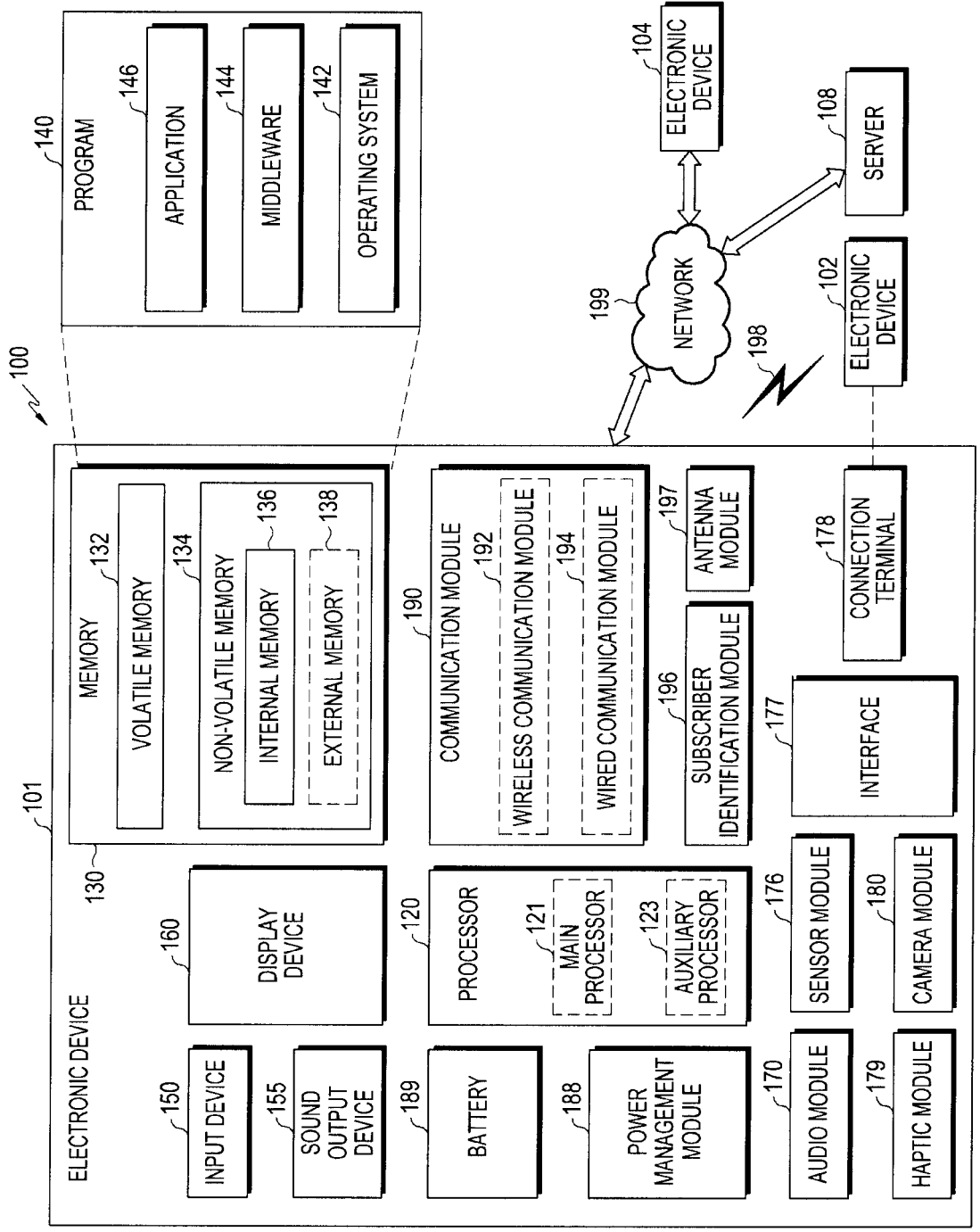
FIG. 1 is a block diagram illustrating an electronic device within a network environment 100 according to various embodiments.

An electronic device according to various embodiments disclosed herein may be various types of devices. The electronic device may, for example, include at least one of a portable communication device (e.g., smartphone) a computer device, a portable multimedia device, a portable medical device, a camera, a wearable device, and a home appliance. The electronic device according to an embodiment is not limited to the above described devices.

The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. The terms "A or B", "one or more of A and/or B", "A, B, or C", or "one or more of A, B and/or C" may include all possible combinations of them. The expression "a first", "a second", "the first", or "the second" used in various embodiments may modify various components regardless of the order and/or the importance but does not limit the corresponding components. When an element (e.g., first element) is referred to as being "(functionally or communicatively) connected," or "directly coupled" to another element (second element), the element may be connected directly to the another element or connected to the another element through yet another element (e.g., third element).

The term "module" as used herein may include a unit including hardware, software, or firmware, and may, for example, be used interchangeably with the term "logic", "logical block", "component", "circuit", or the like. The "module" may be an integrated component, or a minimum unit for performing one or more functions or a part thereof. For example, a module may be an Application-Specific Integrated Circuit (ASIC).

Various embodiments disclosed herein may be implemented by software (e.g., program 140) including an instruction stored in machine-readable storage media (e.g., internal memory 136 or external memory 138). The machine is a device that calls the stored instruction from the storage media and can operate according to the called instruction, and may include an electronic device (e.g., electronic device 101) according to the disclosed embodiments. The instruction, when executed by a processor (e.g., processor 120), may cause the processor to directly execute a function corresponding to the instruction or cause other elements to execute the function under the control of the processor. The instruction may include a code that is generated or executed by a compiler or interpreter. The machine-readable storage media may be provided in the form of non-transitory storage media. Here, the term "non-transitory" means only that the storage media is tangible without including a signal, irrespective of whether data is semi-permanently or transitorily stored in the storage media.

According to an embodiment, a method according to various embodiments disclosed herein may be provided in the manner of being included in a computer program product. A computer program product may be traded between a seller and a purchaser as a commodity. The computer program product may be distributed in the form of a machine-readable storage medium (e.g., a compact disc read only memory (CD-ROM)) or on-line via an application store (e.g., Play Store™). In the case of on-line distribution, at least a part of the computer program product may be temporarily stored in or temporarily produced from a storage medium such as a manufacturer's server, a server of an application store, or a memory of a relay server.

According to various embodiments, each component (e.g., a module or a program) may be configured as a single entity or a plurality of entities, and some of the aforementioned sub-components may be omitted, or other sub-components may be further included in various embodiments. Alternatively or additionally, some components (e.g., a module or a program) may be integrated as a single entity so as to perform the functions performed by respective components prior to integration in a similar or same manner. Operations performed by a module, a programming module, or other elements according to various embodiments may be executed sequentially, in parallel, repeatedly, or in a heuristic manner. At least some operations may be executed according to another sequence, may be omitted, or may further include other operations. Hereinafter, an electronic device according to various embodiments will be described with reference to the accompanying drawings. In the present disclosure, the term "user" may indicate a person using an electronic device or a device (e.g., an artificial intelligence electronic device) using an electronic device.

FIG. 1 is a block diagram illustrating an electronic device 101 in a network environment 100, according to various embodiments. Referring to FIG. 1, the electronic device 101 in the network environment 100 may communicate with an electronic device 102 via a first network 198 (e.g., short-range wireless communication), or may communicate with an electronic device 104 or a server 108 via a second network 199 (e.g., long-range wireless communication). According to an embodiment, the electronic device 101 may communicate with the electronic device 104 via the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, and an antenna module 197. In some embodiments, at least one (e.g., the display device 160 or the camera module 180) of these components may be eliminated from the electronic device 101 (e.g., not included or implemented in the electronic device) and/or other components may be added to the electronic device 101. In some embodiments, some components may be implemented in an integrated form like, for example, the sensor module 176 (e.g., a fingerprint sensor, an iris sensor, or an illuminance sensor), which is embedded in, for example, the display device 160 (e.g., a display).

The processor 120 may control one or more other components (e.g., a hardware or software component) of the electronic device 101, which are connected to the processor 120, and may perform various data processing and arithmetic operations by driving, for example, software (e.g., a program 140). The processor 120 may load one or more instructions or data, which are received from other components (e.g., the sensor module 176 or the communication module 190), into a volatile memory 132 so as to process the one or more instructions or data, and may store resulting data into a non-volatile memory 134. According to an embodiment, the processor 120 may include a main processor 121 (e.g., a central processing unit or an application processor), and an auxiliary processor 123, which operates independently from the main processor 121, additionally or alternatively uses a lower power than the main processor 121, or includes an auxiliary processor 123 specialized for a designated function (e.g., a graphic processor device, an image signal processor, a sensor hub processor, or a communication processor). Here, the auxiliary processor 123 may be operated separately from the main processor 121 or in the manner of being embedded with the main processor 121.

In this case, the auxiliary processor 123 may control at least some functions or states associated with at least one of the components of the electronic device 101 (e.g., the display device 160, the sensor module 176, or the communication module 190), on behalf of the main processor 121, for example, while the main processor 121 is in an inactive (e.g., sleep) state, or together with the main processor 121 while the main processor 121 is in an active (e.g., application execution) state. According to an embodiment, the auxiliary processor 123 (e.g., an image signal processor or a communication processor) may be implemented as some of other functionally related components (e.g., camera module 180 or communication module 190). The memory 130 may store various data used by at least one component (e.g., the processor 120 or the sensor module 176) of electronic device 101, for example, software (e.g., the program 140) and input or output data for one or more instructions which are associated with the software. The memory 130 may include, for example, a volatile memory 132 or a non-volatile memory 134.

The program 140 may be software stored in the memory 130 and may include, for example, an operating system 142, middleware 144, or application 146.

The input device 150 is a device from the outside (e.g., user) for receiving one or more instructions or data to be used in a component (e.g., the processor 120) of the electronic device 101, and may include, for example, a microphone, a mouse, or a keyboard.

The sound output device 155 is a device for outputting a sound signal to the outside of the electronic device 101. The sound output device 155 may include, for example, a speaker for general use such as multimedia reproduction or sound reproduction and a receiver used for telephone reception. According to an embodiment, the receiver may be formed integrally with or separately from the speaker.

The display device 160 is a device for visually providing information to a user of the electronic device 101 and may include, for example, a display, a hologram device, or a projector and a control circuit for controlling the corresponding device. According to an embodiment, the display device 160 may include a touch circuit or a pressure sensor capable of measuring the intensity of the pressure for touch.

The audio module 170 may bidirectionally convert sound and electrical signals. According to an embodiment, the audio module 170 may acquire sound through the input device 150 or may output sound through the sound output device 155 or an external electronic device (e.g., the electronic device 102 (e.g., a speaker or headphone)) connected with the electronic device 101 in a wireless or wired manner.

The sensor module 176 may generate an electrical signal or a data value corresponding to an internal operating state (e.g., power or temperature) of the electronic device 101 or an external environmental condition. The sensor module 176 may include, for example, a gesture sensor, a gyro sensor, an atmospheric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support a designated protocol that may be connected to an external electronic device (e.g., the electronic device 102) in a wired or wireless manner. According to an embodiment, the interface 177 may include a High Definition Multimedia Interface (HDMI), a Universal Serial Bus (USB) interface, an SD card interface, or an audio interface.

The connection terminal 178 may be a connector capable of physically interconnecting the electronic device 101 and an external electronic device (e.g., the electronic device 102), such as an HDMI connector, a USB connector, an SD card connector, or an audio connector (e.g., a headphone connector).

The haptic module 179 may convert an electrical signal into a mechanical stimulus (e.g., vibration or motion) or an electrical stimulus that the user can perceive through a tactile or kinesthetic sense. The haptic module 179 may include, for example, a motor, a piezoelectric element, or an electrical stimulation device.

The camera module 180 is a device that is capable of capturing, for example, a still image and a video image. According to an embodiment, the camera module 180 may include one or more lenses, an image sensor, an image signal processor, or a flash.

The power management module 188 is a module for managing power supplied to the electronic device 101, and may be configured as at least a part of, for example, a Power Management Integrated Circuit (PMIC).

The battery 189 is a device for supplying power to at least one component of the electronic device 101 and may include, for example, a non-rechargeable primary battery, a rechargeable secondary battery, or a fuel cell.

The communication module 190 may establish a wired or wireless communication channel between the electronic device 101 and an external electronic device (e.g., the electronic device 102, the electronic device 104, or the server 108) and may support communication via the established communication channel. The communication module 190 may include a processor 120 (e.g., an application processor) and one or more communication processors, which are independently operated and support wired communication or wireless communication. According to an embodiment, the communication module 190 may include a wireless communication module 192 (e.g., a cellular communication module, a short range wireless communication module, or a Global Navigation Satellite System (GNSS) communication module) or a wired communication module 194 (e.g., a Local Area Network (LAN) communication module or a power line communication module), and may communicate with an external electronic device via a first network 198 (e.g., a short-range communication network, such as Bluetooth, WiFi direct, or Infrared Data Association (IrDA)) or a second network 199 (e.g., a long-range communication network, such as a cellular network, the Internet, or a computer network (e.g., a LAN or a WAN)), using a corresponding communication module among the above-mentioned communication modules. Various types of communication modules 190 described above may be implemented as a single chip or may be implemented as separate chips, respectively.

According to an embodiment, the wireless communication module 192 may identify and authenticate the electronic device 101 within the communication network using the user information stored in the subscriber identification module 196.

The antenna module 197 may include one or more antennas configured to transmit/receive signals or power to/from the outside. According to an embodiment, the communication module 190 (e.g., the wireless communication module 192) may transmit/receive signals to/from an external electronic device via an antenna suitable for the communication scheme thereof.

Among the components described above, some components may be connected to each other via a communication scheme (e.g., a bus, a General-Purpose Input/Output (GPIO), a Serial Peripheral Interface (SPI), or a Mobile Industry Processor Interface (MIPI) and may exchange signals (e.g., one or more instructions or data) therebetween.

According to an embodiment, the one or more instructions or data may be transmitted or received between the electronic device 101 and the external electronic device 104 via the server 108 connected to a second network 199. Each of the electronic devices 102 and 104 may be of a type, which is the same as or different from the electronic device 101. According to an embodiment, all or some of the operations executed in the electronic device 101 may be executed in another external electronic device or a plurality of external electronic devices. According to an embodiment, in the case where the electronic device 101 should perform a certain function or service automatically or by a request, the electronic device 101 may request an external electronic device to provide some functions, which are associated with the function or service, instead of, or in addition to, executing the functions or the service by itself. The external electronic device, which receives the request, may execute the requested functions or additional functions, and may transmit the results to the electronic device 101. The electronic device 101 may provide the requested functions or services by processing the received results as they are or additionally. For this purpose, for example, a cloud computing technique, a distributed computing technique, or a client-server computing technique may be used.

Figure 2A:
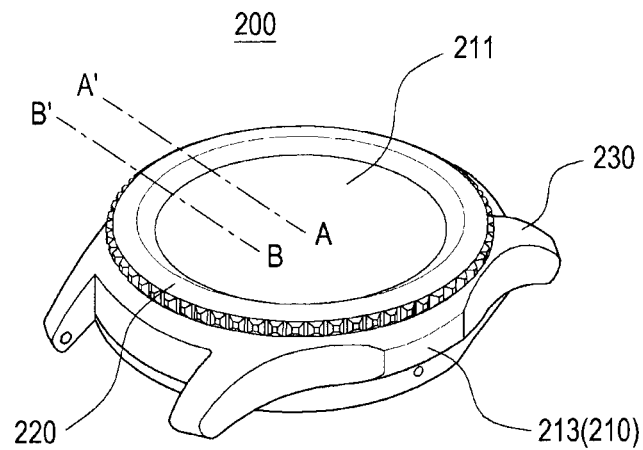
FIG. 2A is a perspective view illustrating the front face of an electronic device 200 according to one of various embodiments.
Figure 2B:
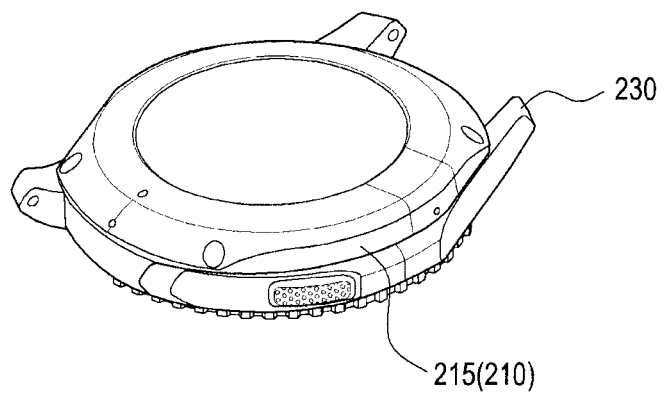
FIG. 2B is a perspective view illustrating the rear face of the electronic device 200 according to one of various embodiments.

FIG. 2A is a perspective view illustrating the front face of an electronic device 200 according to one of various embodiments. FIG. 2B is a perspective view illustrating the rear face of the electronic device 200 according to one of various embodiments.

According to various embodiments, the electronic device 200 may be a portable electronic device such as a mobile communication terminal, or a wearable electronic device that is wearable on a user's body. According to various embodiments, an electronic device will be described with reference to a smart watch as an example.

Referring to FIGS. 2A and 2B, an electronic device 200 according to various embodiments includes a housing 210 including a transparent plate 211, a bezel 220, and detachable portions 230. The "first direction" used for describing various embodiments may mean a direction perpendicular to one face of the transparent plate 211, and the "second direction" may mean a direction opposite the "first direction." The "third direction" may mean a direction perpendicular to the "first direction" and/or the "second direction."

According to various embodiments, the housing 210 may include a first housing 213 that is oriented in the first direction and/or the third direction and a second housing 215 that is oriented in the second direction and/or the third direction that is opposite the first direction. The front face of the housing 210 may be opened, and a transparent plate 211 may be mounted to form at least a portion of the first housing 213 corresponding to the front face of the housing 210, and may close at least a portion of the opened front face of the housing 210.

According to various embodiments, within the housing 210 various circuit devices such as a processor 120 (e.g., an Application Processor (AP) illustrated in FIG. 1), a memory 130, an interface 177, a communication module 190, or a battery (not illustrated) may be included.

According to various embodiments, the housing 210 may be formed of a metal material, ceramic, glass, or a plastic material. For example, a portion (e.g., a rim) of the housing 210 may be made of a metal material, and the remaining portion of the housing 210 may be made of a plastic material.

According to various embodiments, the transparent plate 211 may be disposed on the front face of the first housing 213. The transparent plate 211 may be formed of a transparent material, for example, glass or a resin (e.g., acryl or polycarbonate).

According to various embodiments, the bezel 220 may be disposed in the rim of the transparent plate 211. The bezel 220 may be relatively rotatably coupled with the housing 210 to rotate along the rim of the transparent plate 211. For example, the bezel 220 may be made of a metal material so as to achieve a beautiful appearance of the electronic device 200. According to an embodiment, when the bezel 220 is made of a metal material, the bezel 220 may be utilized as an antenna radiator.

According to various embodiments, the detachable portions 230 may be disposed to extend and protrude from the opposite ends of the housing 210 in directions away from each other. The detachable portions 230 may be coupled with a wearing unit (not illustrated) arranged to be worn on, for example, the user's wrist. According to an embodiment, the detachable portions 230 may have a fastening groove to be engaged with the wearing unit. The of fastening groove may be formed in a plural number on the side face of the housing 210, or may have a closed curve shape extending along the periphery of the housing 210. The wearing unit may be formed of various materials (e.g., a rubber material, a plastic material, and a metal).

Figure 3:
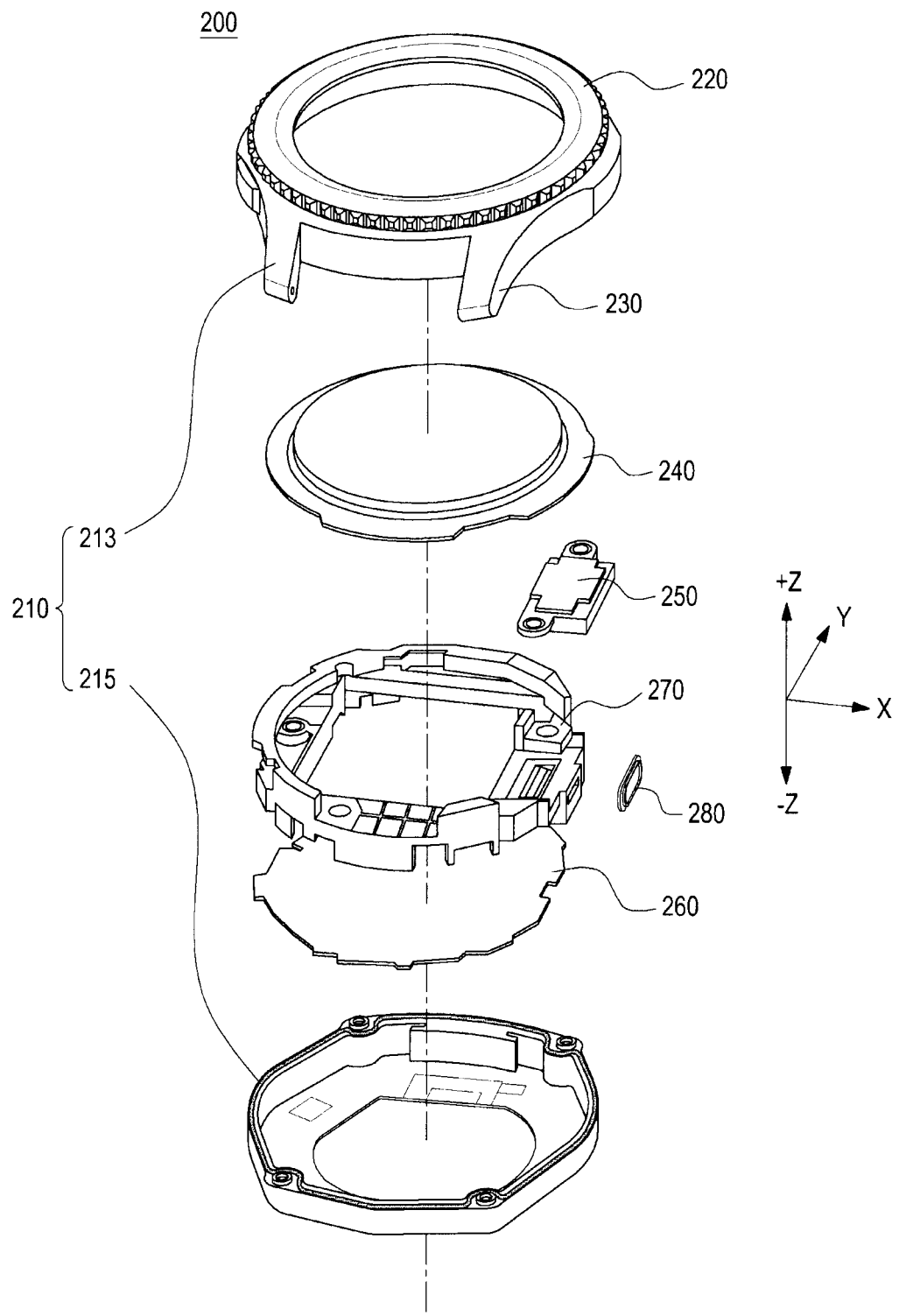
FIG. 3 is an exploded perspective view illustrating the internal structure of the electronic device 200 according to one of various embodiments.
Figure 4:
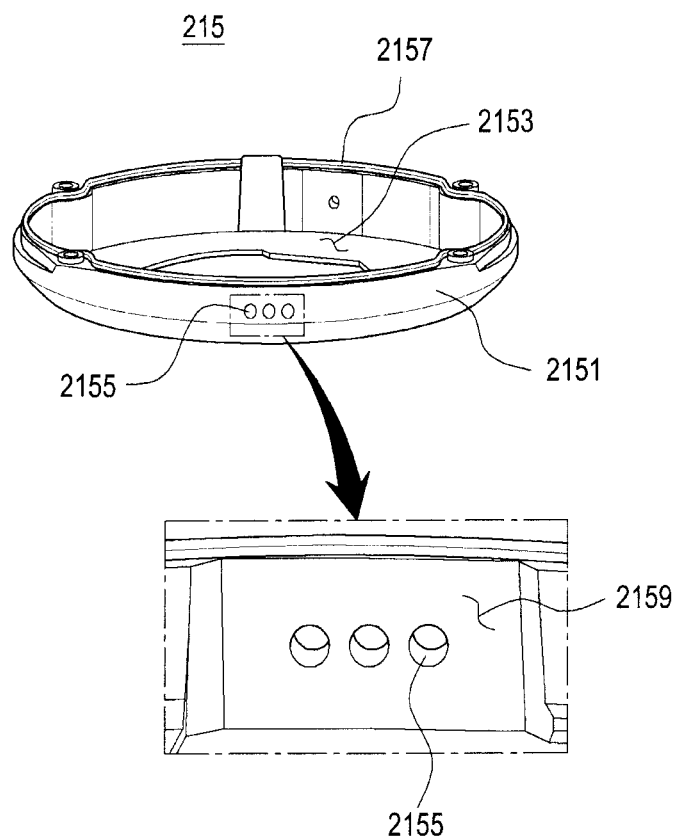
FIG. 4 is a perspective view illustrating a second housing 215 of the electronic device according to various embodiments.

FIG. 3 is an exploded perspective view illustrating the internal structure of the electronic device 200 according to one of various embodiments. FIG. 4 is a perspective view illustrating a second housing 215 of the electronic device according to various embodiments.

In FIG. 3, in an orthogonal coordinate system of three axes, an "X-axis" may correspond to the width direction of the electronic device 200, a "Y-axis" may correspond to the length direction of the electronic device 200, a "Z-axis" may correspond to the thickness direction of the electronic device 200.

Referring to FIG. 3, an electronic device 200 according to one of various embodiments may include a housing 210, a bezel 220, a display device 240, an electronic component, a main circuit board 260, a support structure 270, or a gasket 280. The structure of the housing 210 and/or the bezel 220 of the electronic device 200 illustrated in FIG. 3 may be the same as or similar to the structure of the housing 210 and/or the bezel 220 illustrated in FIG. 2

According to various embodiments, the housing 210 may accommodate various electronic components such as the display device 240 and/or the main circuit board 260. A portion of the housing 210, for example, the side face of the housing 210, may be at least partially made of a material that transmits a wireless signal or a magnetic field. The electronic components may include an audio module 250 and/or a biometric sensor.

According to various embodiments, the display device 240 may be disposed in a second (−Z) direction of the transparent plate (the transparent plate 211 in FIG. 2). The display device 240 may display image information (e.g., a photograph, a video image) to the outside through the transparent plate 211, and may output an executing screen for various applications (e.g., a game, internet banking, and schedule management) according to the user's operation.

According to various embodiments, the display device 240 may include a Liquid Crystal Display (LCD), a Light-Emitting Diode (LED) display, an Organic Light-Emitting Diode (OLED) display, a MicroElectroMechanical System (MEMS) display, or an electronic paper display. The display device 240 may include a touch screen panel integrated therewith to perform a touch screen function.

According to various embodiments, the display device 240 may be electrically connected to a display circuit board (not illustrated). The display circuit board may be inside the housing 210. The display circuit board may be connected to the main circuit board 260, and may transmit an electrical signal for driving the display device 240.

According to various embodiments, the support structure 270 is disposed inside the housing 210 and may provide a space in which internal electronic components can be mounted. The support structure 270 may include a seating face on which at least a portion of the waterproof structure including a gasket 280 is seated, and a conduit leading from an opening formed in the housing 210 may be disposed.

According to various embodiments, the main circuit board 260 may be disposed to face a battery (not shown). On the main circuit board 260, a processor, a communication module, or the like may be mounted in the form of an integrated circuit chip. The main circuit board 260 may be electrically connected to the battery. According to various embodiments, the main circuit board 260 may be electrically connected to the electronic part including the antenna radiator or the like through a connector.

According to various embodiments, electronic components may be disposed on the main circuit board 260. For example, the audio module 250, sensors, or the like may be included in the main circuit board 260. As another example, the electronic components may include an antenna radiator and/or a wireless charging antenna. According to an embodiment, the antenna radiator may transmit and receive a wireless signal in a Magnetic Security Transmission (MST) manner. For example, the antenna radiator may be at least a portion of an MST antenna. As another example, the antenna radiator may be at least a portion of a Near-Field Communication (NFC) antenna that transmits and receives a wireless signal in an NFC manner.

According to an embodiment, the wireless charging antenna may be attached to one face of the main circuit board 260. The wireless charging antenna may be in the form of, for example, a flat coil. The wireless charging antenna may be made of a conductive material, and may be electrically connected to the main circuit board 260. The wireless charging antenna may generate current by electromagnetic induction generated from an external electronic device. The current generated in the wireless charging antenna is able to charge the battery (not shown) through the main circuit board 260.

According to various embodiments, a heat dissipation structure (not shown) may be provided between the main circuit board 260 and the battery. For example, the heat dissipation structure may receive heat generated from the main circuit board 260, thereby preventing the main circuit board 260 from being overheated.

According to various embodiments, the second housing 215 formed in the second (−Z) direction of the housing 210 may form a rear cover of the electronic device 200. The rear cover may be made of, for example, a glass material. At least a portion of the rear cover may come into contact with a portion of a human body (e.g., a wrist). According to various embodiments, the rear cover may be made of a transparent material, such as transparent reinforced plastic, without being limited to the glass material.

According to various embodiments, the electronic device may include a waterproof structure including a gasket 280 on a conduit penetrated from the outside. The gasket 280 of the waterproof structure may be disposed between the support structure 270 and the housing 210.

FIG. 4 is a perspective view illustrating the structure of the second housing 215 with an enlarged view of a portion of the inner face of the second housing 215.

Referring to FIG. 4, the second housing 215 may be a rear cover of an electronic device and may include therein a region where a support structure (e.g., the support structure 270 of FIG. 3) and a gasket (e.g., the gasket 280 of FIG. 3) is mounted.

According to various embodiments, the second housing 215 may include an outer wall 2151, an inner space 2153 at least partially defined by the outer wall 2151, and a through hole 2155 formed in the inner space 2153 through the outer wall 2151. As another example, on the upper end of the outer wall 2151 of the second housing 215, a sealing member 2157 may be disposed to be engaged with and seal the first housing (e.g., the first housing 213 of FIG. 3). For example, the sealing member 2157 may be in the shape of a closed curve and may be disposed along the edge of the second housing 215.

According to various embodiments, the outer wall 2151 may include a metal or plastic material and form the external appearance of the electronic device. The inner space 2153 may provide space for a support structure (e.g., the support structure 270 of FIG. 3) and a main circuit board (e.g., the main circuit board 260 of FIG. 3). As another example, one or more first through holes 2155 may be arranged in order to transmit/receive signals such as voice to/from the outside. As another example, the peripheral region of the first through holes 2155 may be provided with a seating groove 2159 in which a waterproof structure such as a gasket can be seated. An audio module (e.g., the audio module 250 of FIG. 3) may be located within the inner space adjacent to the first through holes 2155.

Figure 5A:
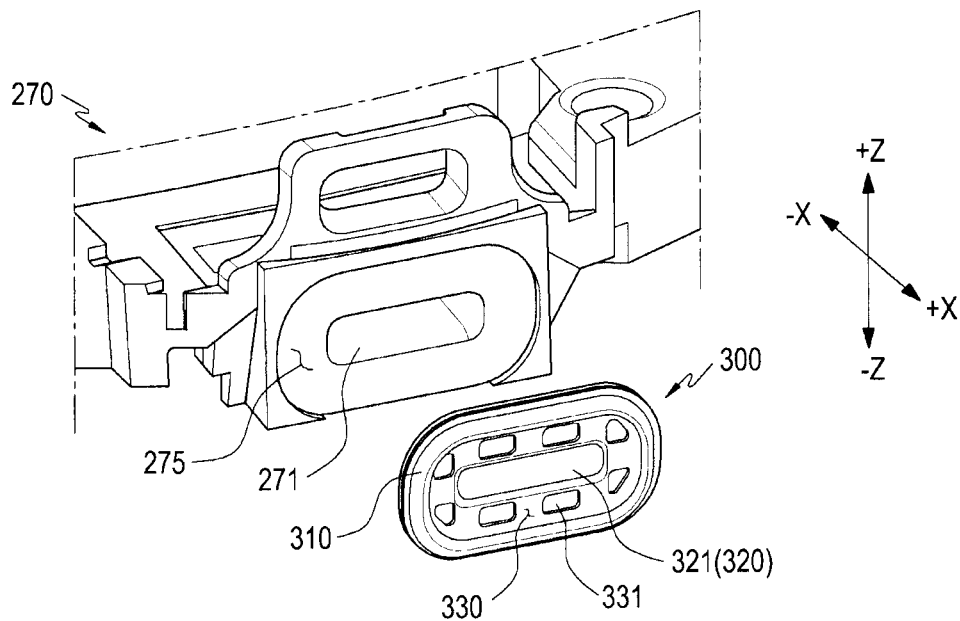
FIG. 5A is a view illustrating a waterproof structure 300, which is viewed from the outside of a support structure 270
Figure 5B:
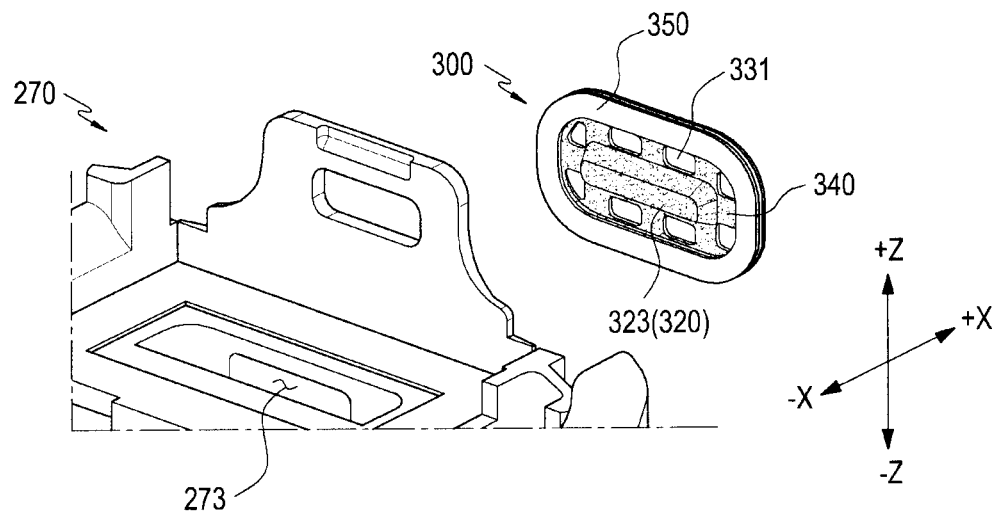
FIG. 5B is a view illustrating the waterproof structure 300, which is viewed from the inside of the support structure 270.
Figure 6A:
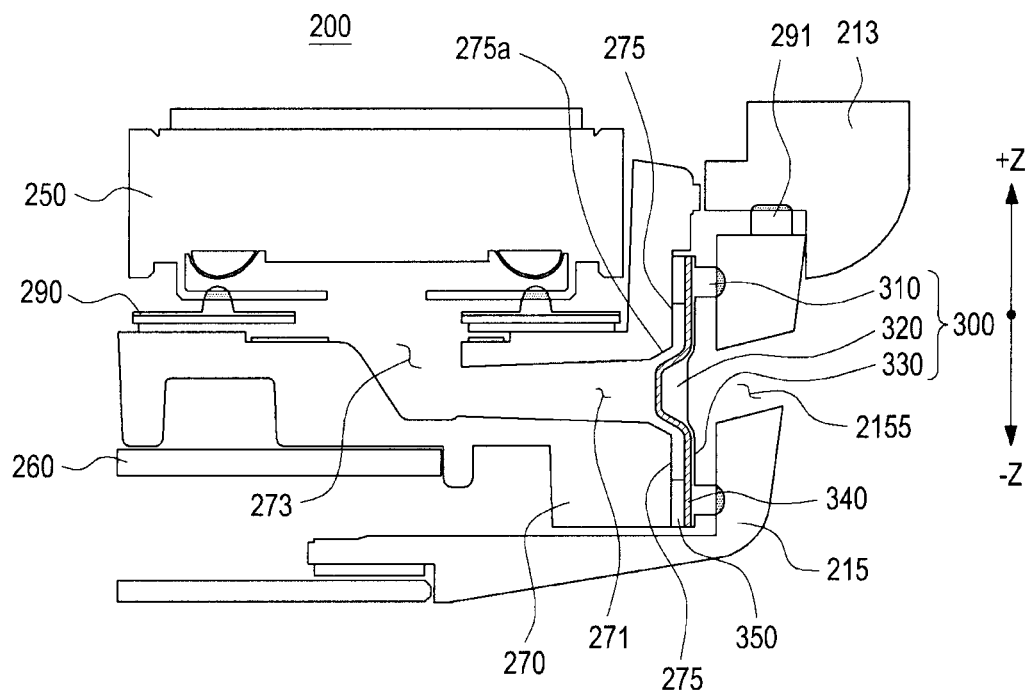
FIG. 6A and FIG. 6B are sectional views of the electronic device 200, which are taken along line A-A' of FIG. 2A, according to various embodiments.
Figure 6B:
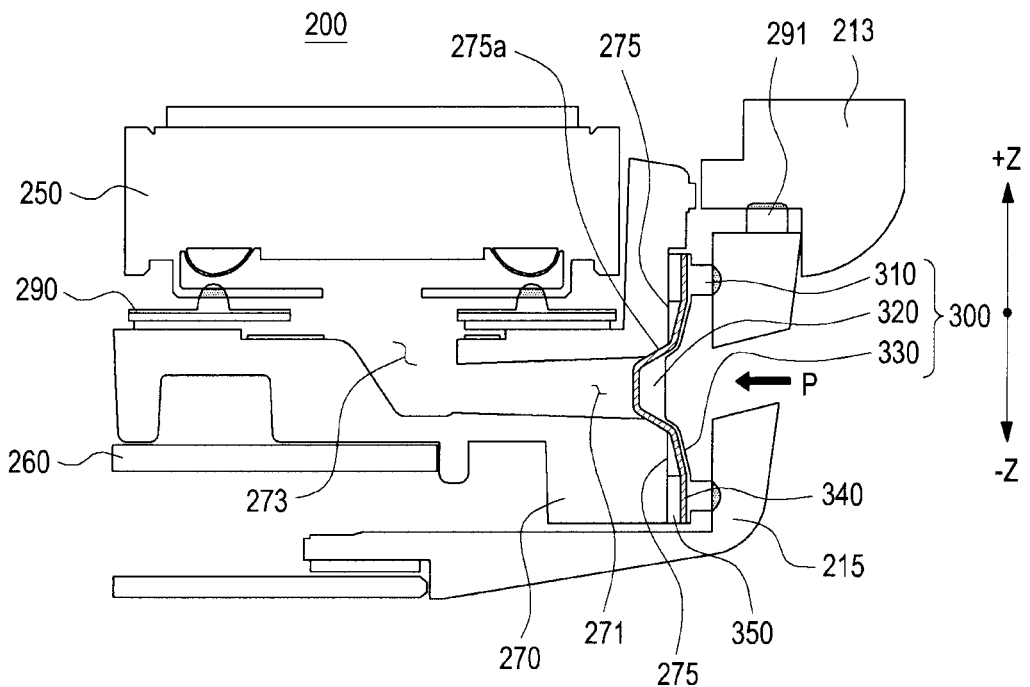
Figure 7:
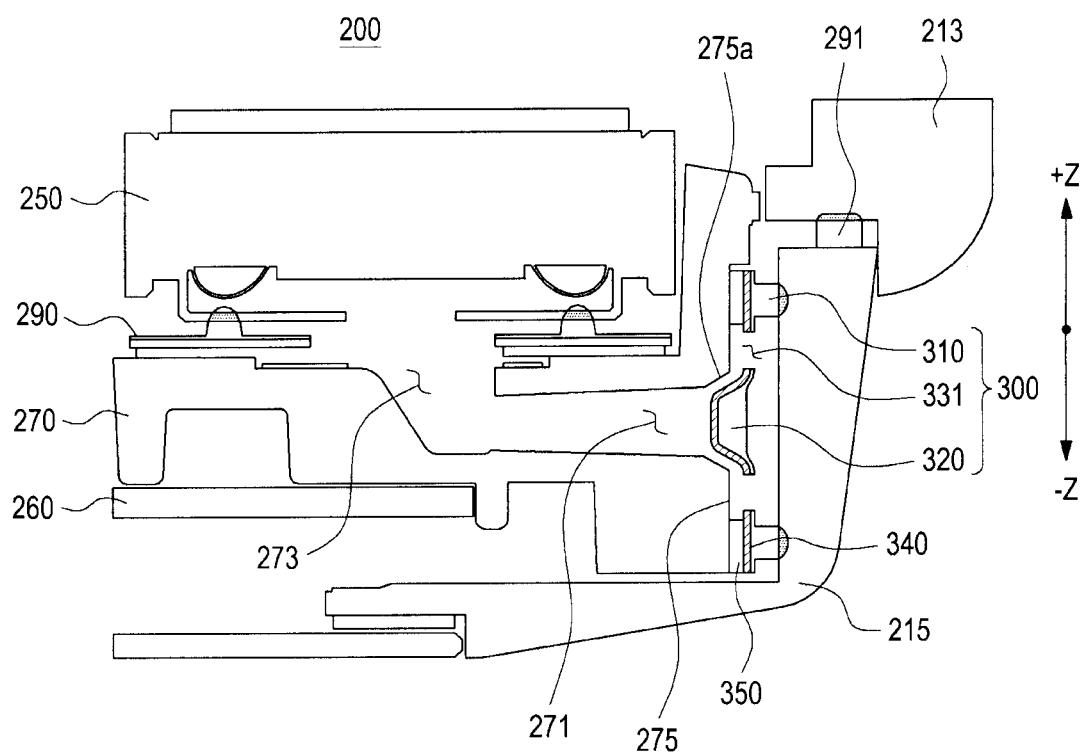
FIG. 7 is a sectional view of the electronic device 200, which is taken along line B-B' of FIG. 2A according to various embodiments.

FIGS. 5A and 5B are views illustrating a waterproof structure 300 including a gasket according to various embodiments. FIG. 5A is a view illustrating a waterproof structure 300, which is viewed from the outside of a support structure 270 and FIG. 5B is a view illustrating the waterproof structure 300, which is viewed from the inside of the support structure 270. FIGS. 6A and 6B are sectional views of the electronic device 200, which are taken along line A-A' of FIG. 2A. FIG. 7 is a sectional view of the electronic device 200, which is taken along line B-B' of FIG. 2A.

The support structure 270 and the waterproof structure 300 of FIGS. 5A to 7 may be partly or wholly identical to the waterproof structure including the support structure 270 and the gasket 280 of FIG. 3.

Referring to FIGS. 5A and 5B, the electronic device may include the support structure 270 including a second through hole 271, and a waterproof structure (e.g., a gasket 300) disposed between the support structure 270 and the second housing 215. An adhesive member 350 and a film member 340 may be bonded to one face of the gasket 300.

According to various embodiments, the support structure 270 may include a conduit 273 passing through the second through hole 271, and a seating face 275 provided along the periphery of the second through hole 271 so as to seat the gasket 300 thereon.

According to an embodiment, the conduit 273 is a channel for facilitating the propagation of sound generated by an audio module (e.g., a speaker module) mounted inside the electronic device to an exterior of the electronic device. The second through hole 271 may be disposed in one end of the conduit 273 and an audio module (e.g., the audio module 250 of FIG. 3) may be disposed in the other end of the conduit 273. For example, when the audio module 250 is disposed in the upper end of the conduit 273, the conduit 273 may be formed such that at least a portion of the conduit 273 is inclined as to be directed towards the first (+Z) direction.

According to an embodiment, the seating face 275 may be formed in a shape corresponding to the shape of the rear face of the gasket 300 (e.g., a closed curve). The circumferential face adjacent to the second through hole 271 may be formed as an inclined face (for example, an inclined face 275a of FIG. 6A). For example, the inclined face may be a face on which the protrusion 323 protruding in a fourth (−X) direction of the gasket 300 abuts, and when the protrusion 323 is disposed to be in contact with portions of the second through hole 271 (as seen in FIGS. 6A and 6B), it is possible to seal the interior of the support structure 270 from the outside of the electronic device 200, such that the water pressure applied from an exterior of the device is not transferred to the audio module 250. The inclined face 275a may be formed inwardly to include a predetermined inclination (e.g., between 0 and 90 degrees), and may increase the surface area to be in contact with the edge portion the protrusion of the gasket 300, thereby providing a improved sealing force.

According to various embodiments, the gasket 300 may be located in the inner space 2153 between the support structure 270 and the outer wall 2151 of the second housing 215 and may include a flexible material so as to provide a variable property for adjusting to an external pressure (e.g., an elastic force). The gasket 300 may include an outer rim 310, a recess portion 320, and a connection portion 330.

According to an embodiment, the outer rim 310 may be positioned to be fixed between the support structure 270 and a portion of the outer wall 2151 around the first through hole 2155. For example, the outer rim 310 may have a closed curve shape protruding in a third (+X) direction and may be disposed to overlap at least a portion of the inner wall of the second housing 215. The outer rim 310 is a flexible elastomer and is capable of providing sealing between the second housing 215 and the support structure 270, thereby preventing a fluid from entering the inside of the electronic device.

According to an embodiment, the recess portion 320 is movably inserted between the first through hole 2155 of the second housing 215 and the second through hole 271 of the support structure 270, and may be recessed toward the second through hole 271. For example, the recess portion 320 is formed in the central region of the gasket 300 such that one face of the recess portion 320, oriented in the third (+X) direction, may form a concave groove 321, and another face, oriented in a fourth (−X) direction opposite the third (+X) direction, may include a convex protrusion 323.

According to an embodiment, the recess portion 320 may be disposed on the conduit 273 formed from the first through hole 2155 to the second through hole 271. The recess portion 320 may be formed to have a size corresponding to the second through hole 271 such that when no external pressure is applied, the recess portion 320 may be spaced apart from the peripheral portion of the second through hole 271 by a predetermined distance and when an external pressure is applied, the recess portion 320 may be elastically moved and positioned to be in contact with the peripheral portion of the second through hole 473. For example, when an external pressure is applied, the convex protrusion 323 provides a valve function to block the inlet of the conduit 273 in the support structure 270, so that it is possible to prevent the pressure from being transferred to the audio module 250 disposed in the inside. In an embodiment, the shape of the recess portion 320 may be a rectangular shape including rounded corners, but is not limited thereto. The recess portion 320 may have various shapes such as a circular shape, a square shape and a triangle shape so as to correspond to the shape of the second through hole 271, and an inclined face having a predetermined inclination (e.g., between 0 degrees and 90 degrees) may be formed on a side face of the protrusion 323 to correspond to the inclined face.

According to an embodiment, the connection portion 330 may be disposed between the outer rim 310 and the recess portion 320 to connect the outer rim 310 and the recess portion 320. The connection portion 330 may include a flexible material, and the portion adjacent to the recess portion 320 may be elastically moved as an external pressure is applied thereto. The connection portion 330 may include at least one opening 331. The opening 331 is capable of performing a ventilation function between the conduit 273 in the support structure 270 and the outside of the electronic device and a passage function through which the sound of the speaker is propagated to the outside. For example, the opening 331 may be formed in a plural number so as to be connected to the outside in various directions, and may be arranged radially so as to surround the periphery of the recess portion 320.

According to an embodiment, the adhesive member 350 may be disposed on the face opposite the outer rim 310 of the gasket 300 so as to bond the gasket 300 to the seating face 275 of the support structure 270. The adhesive member 350 may block the fluid entering a gap between the gasket 300 and the support structure 270 so as to seal the inner space from the outside.

According to an embodiment, the film member 340 is disposed between the gasket 300 and the adhesive member 350, and may provide a function of increasing the adhesive force of the adhesive member 350 for the gasket 300, which is made of an elastic material. The film member 340 may be provided on the face opposite the outer rim 310 in a shape corresponding to the adhesive member 350. The film member 340 may be formed in such a manner that, for example, at least a part of the film member 340 includes an elastic material. As another example, the film member 340 may be formed in the form of a thin film of an elastic material. According to an embodiment, the film member 340 may be made of PET or the like so as to reinforce the strength of the gasket 300. According to an embodiment, at least a portion of one face or both faces of the film member 340 may be coated with a material including silicon.

According to an embodiment, the film member 340 may be omitted depending on the material and structure of the gasket 300. For example, when the material of the gasket 300 is formed of silicon or the like, a primer or the like may be directly applied to one face of the gasket 300 so as to improve the adhesive force between the adhesive member 350 and the gasket 300. As another example, when the material of the gasket 300 does not have a problem of adhesion with the adhesive member 350 like urethane or the like, the film member 340 may be omitted.

Referring to FIGS. 6A, 6B, and 7, a cross-sectional view of an electronic device in the region adjacent to the watertight structure and the operation of the waterproof structure will be described. The electronic device 200 may include an audio module 250, a support structure 270, a main circuit board 260, and a second housing 215, which are disposed in the second (−z) direction from the upper first housing 213. A gasket 300 may be disposed between the second housing 215 and the conduit 273 directed toward the support structure 270 from the second housing 215.

According to various embodiments, the audio module 250 is mounted on one face of the support structure 270, oriented in the first (+Z) direction and the sealing member 290 may be disposed between the audio module 250 and the support structure 270, for example, along the peripheral portion of the conduit 273. The sealing member 290 may block a region other than the conduit 273 so as to guide sound propagated from the audio module 250 to be transmitted to the conduit 273. The sealing member 290 may be formed of a material that is sealed or bonded through, for example, a gasket and/or adhesive tape.

According to various embodiments, the main circuit board 260 may be disposed on one face of the support structure 270, oriented in the second (−Z) direction. On the main circuit board 260, a processor, a communication module, or the like may be mounted in the form of an integrated circuit chip.

According to various embodiments, the first housing 213 and the second housing 215 are coupled to each other so as to form an inner space, and a sealing member 291 may be disposed along a joint portion so as to prevent foreign matter including a fluid or the like from flowing into the inner space. The sealing member 291 may be formed of a material that is sealed or bonded through, for example, a gasket and/or adhesive tape.

According to various embodiments, a gasket 300 may be disposed between the first through hole 2155 in the second housing 215 and a region adjacent to the first through hole 2155 and between the second through hole 271 in the support structure 270 and a region adjacent to the second through hole 271. The outer rim 310 of the gasket 300 may overlap the inner face of the second housing 215 while being in contact with the inner face of the second housing 215. The rear face of the outer rim 310 of the gasket 300 may be disposed to be in contact with the seating face 275 of the support structure 270. An adhesive member 350 and/or a film member 340 may be disposed between the gasket 300 and the seating face 275 so that the gasket 300 and the seating face 275 can be bonded to each other. The recess portion 320 in the gasket 300 may be disposed between the first through hole 2155 and the second through hole 271. For example, the center of the recess portion 320 may be disposed on the same line as the center of the first through hole 2155 and the second through hole 271.

According to an embodiment, the opening 331 of the gasket 300 may be disposed between the second housing 215 and the support structure 270 so as to provide a passage that is connected to the outside when no water pressure is provided. The passage may allow sound generated from the audio module 250 to be supplied to the outside through the conduit 273.

Referring to FIG. 6B, the operation of the gasket 300 when the pressure outside the electronic device 200 is higher than the pressure inside the electronic device 200 is illustrated. For example, when the user carries the electronic device 200 and moves into the water, or when a high pressure acts on the electronic device 200, the gasket 300 of the waterproof structure may operate. The recess portion 320 of the gasket 300 may move in the direction of the conduit when a high pressure (e.g., a water pressure) is applied from the first through hole 2155. The side face of the recessed portion 320 moved in the direction of the conduit comes into contact with the seating face 275 (e.g., the inclined face 275a) of the support structure 270, and is able to prevent the fluid, which has entered from the outside, from moving along the conduit 273.

Thereafter, when the electronic device 200 is moved out of a high pressure environment (e.g., coming out from the water), the gasket 300 may elastically return to its original position (FIGS. 6A and 7). For example, the inclined face 275a and the recess portion 320 of the gasket 300 may be maintained in the state of being spaced apart from each other.

Figure 8:
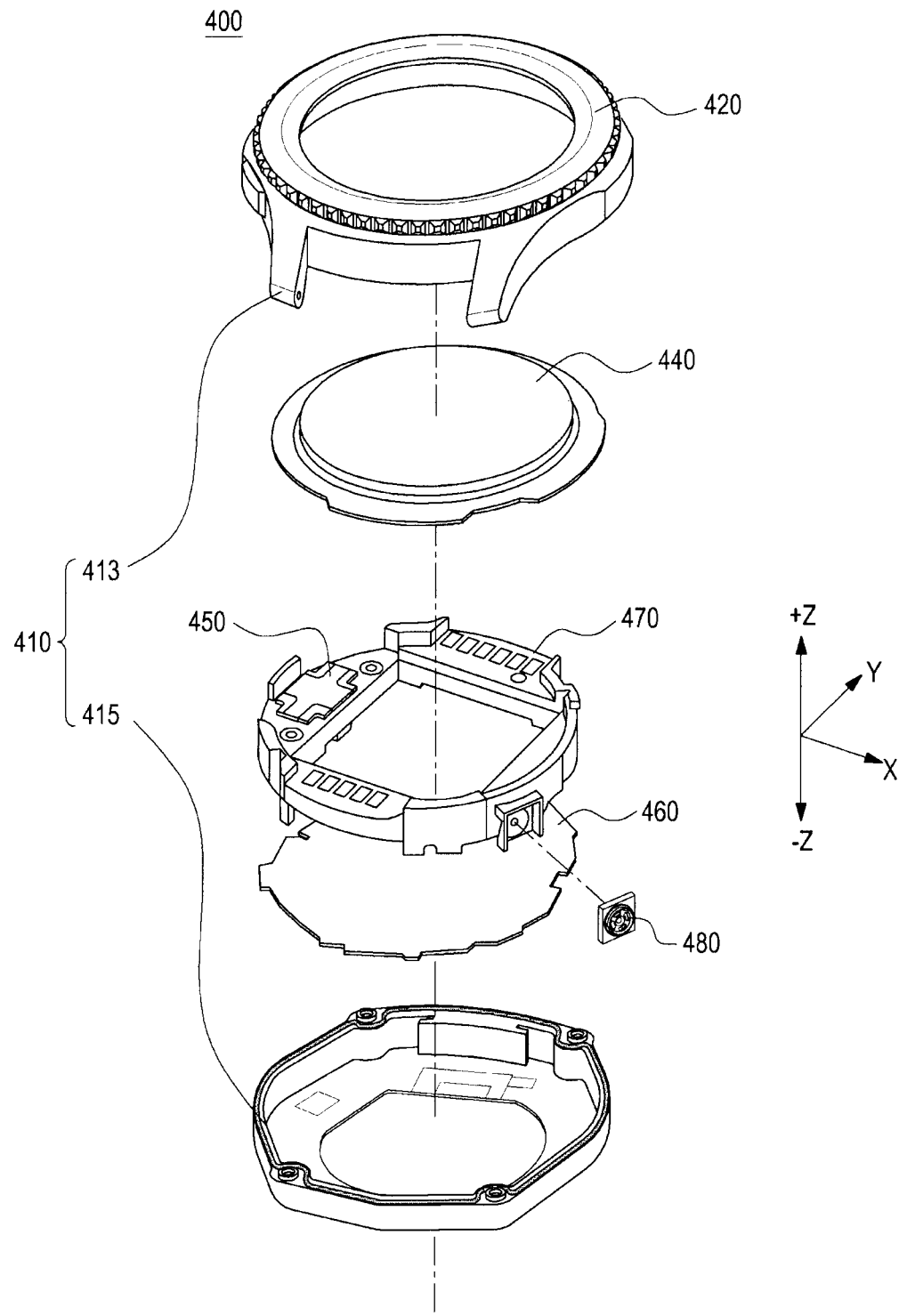
FIG. 8 is an exploded perspective view illustrating the internal structure of the electronic device 400 according to one of various embodiments.

FIG. 8 is an exploded perspective view illustrating the internal structure of the electronic device 400 according to one of various embodiments. In FIG. 8, in an orthogonal coordinate system of three axes, an "X-axis" may correspond to the width direction of the electronic device 400, a "Y-axis" may correspond to the length direction of the electronic device 400, a "Z-axis" may correspond to the thickness direction of the electronic device 400.

Referring to FIG. 8, an electronic device 400 according to one of various embodiments may include a housing 410, a bezel 420, a display device 440, an electronic component, a main circuit board 460, a support structure 470, or a waterproof structure 480. The housing 410, the bezel 420, the display device 440, the main circuit board 460, and the support structure 470 of the electronic device 400 illustrated in FIG. 8 may be partly or wholly the same as the housing 210, the bezel 220, the display device 240, the main circuit board 260, and the support structure 270 illustrated in FIG. 3.

According to various embodiments, the housing 410 may accommodate various electronic components such as the display device 440 and/or the main circuit board 460. The display device 440 may display image information (e.g., a photograph or a video image) to the outside, and may output an executing screen for various applications (e.g., a game, internet banking, and schedule management) according to the user's operation.

According to various embodiments, the display device 440 may be electrically connected to a display circuit board (not illustrated), and the display circuit board may be disposed inside the housing 410. The display circuit board may be connected to the main circuit board 460, and may transmit an electrical signal for driving the display device 440.

According to various embodiments, the main circuit board 460 may be disposed to face a battery (not shown). On the main circuit board 460, a processor, a communication module, or the like may be mounted in the form of an integrated circuit chip. According to various embodiments, the electronic components may be disposed on the main circuit board 460, and may include, for example, the audio module 450, a sensor, or the like.

According to various embodiments, the second housing 415 formed in the second (−Z) direction of the housing 410 may form a rear cover of the electronic device 400. The rear cover may be made of, for example, a glass material. The back cover may come into contact with a portion of a human body (e.g., a wrist). According to various embodiments, the rear cover may be made of various materials, such as transparent reinforced plastic, without being limited to the glass material.

According to various embodiments, the electronic device 400 may include a waterproof structure 480 that includes a gasket on a conduit penetrated from the outside. The waterproof structure 480 is disposed between the support structure 270 and the second housing 215 so as to prevent foreign matter such as a fluid that may flow from the outside. The details of the waterproof structure 480 including the gasket will be described later.

Figure 9A:
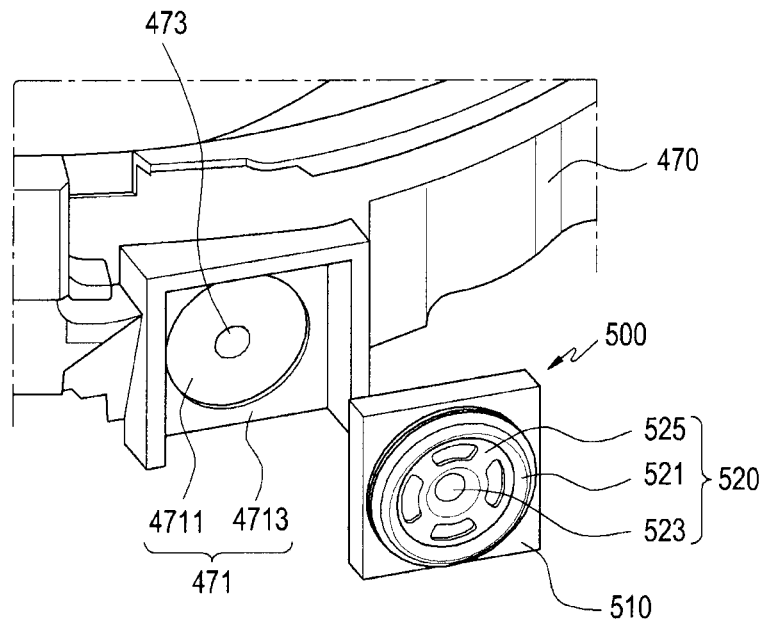
FIG. 9A is a view illustrating a waterproof structure 500, which is viewed from the outside of a support structure 470
Figure 9B:
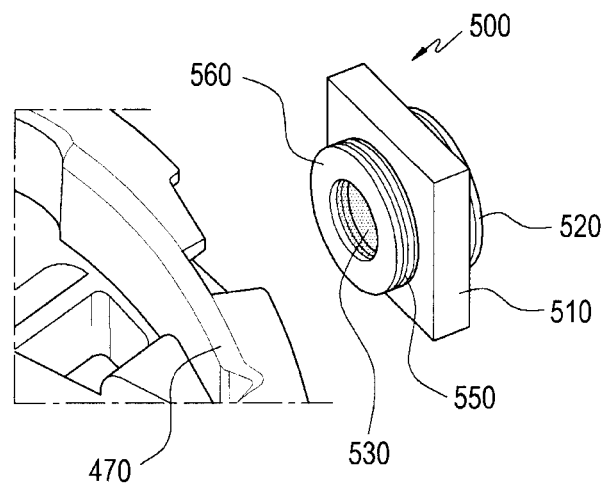
FIG. 9B is a view illustrating the waterproof structure 500, which is viewed from the inside of the support structure 470.

FIGS. 9A and 9B are views illustrating one side of a waterproof structure 500 including a gasket 520 and a support structure 470 according to various embodiments. FIG. 9A is a view illustrating a waterproof structure 500, which is viewed from the outside of a support structure 470 and FIG. 9B is a view illustrating the waterproof structure 500, which is viewed from the inside of the support structure 470.

Figure 10:
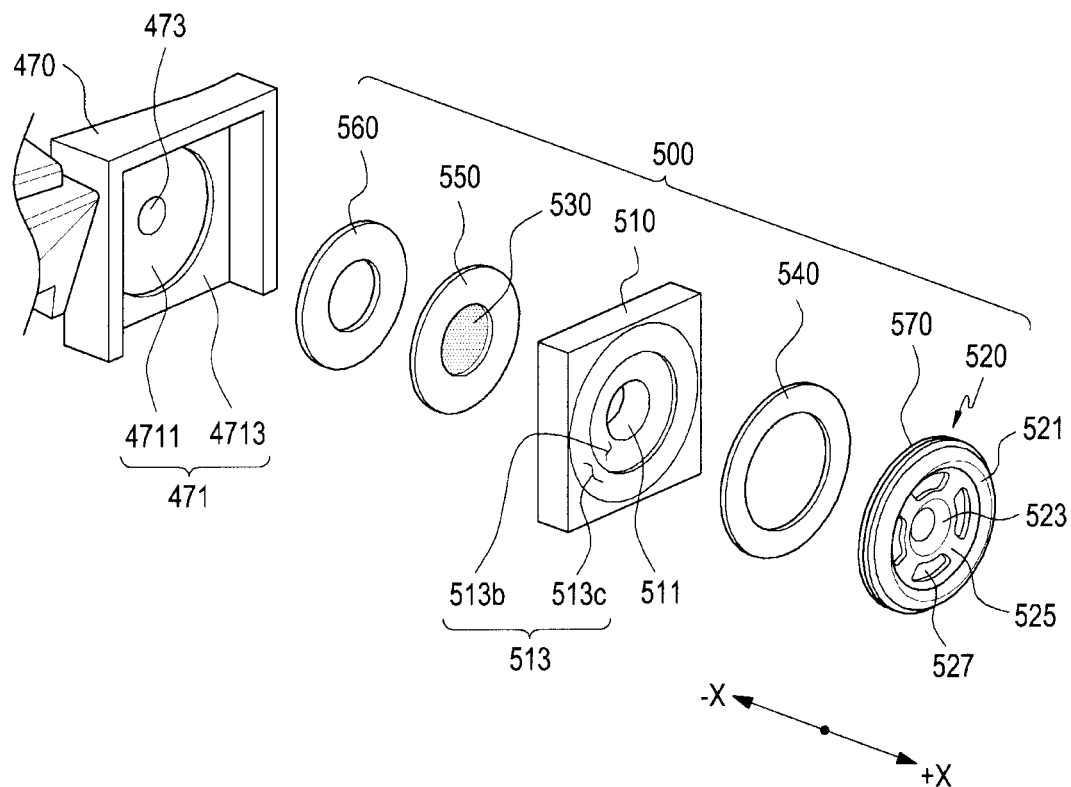
FIG. 10 is an exploded perspective view illustrating the waterproof structure 500 according to various embodiments in a disassembled state.
Figure 11:
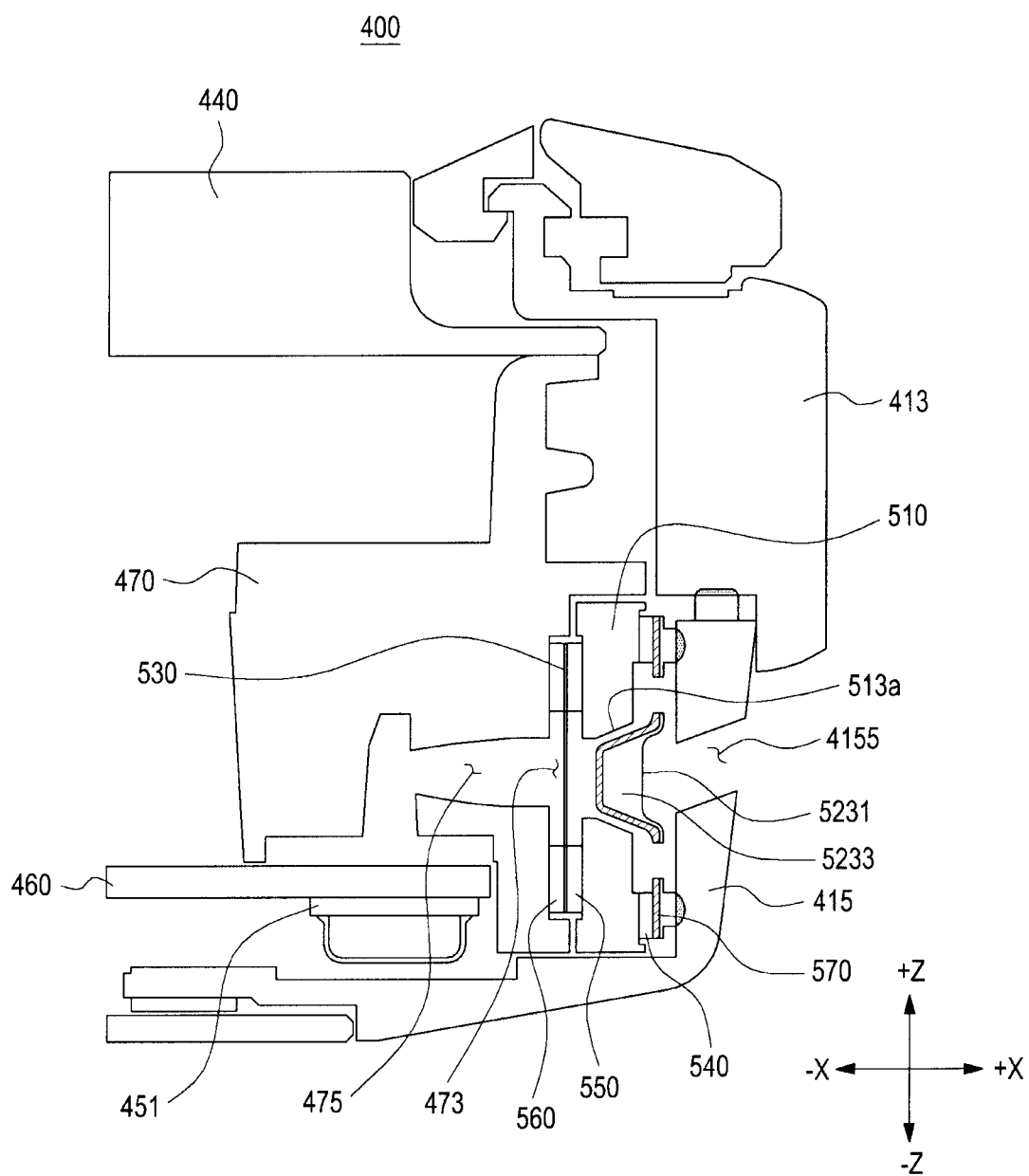
FIG. 11 is a side view illustrating an electronic device including the waterproof structure 500 according to various embodiments.

FIG. 10 is an exploded perspective view illustrating the waterproof structure 500 according to various embodiments in a disassembled state. FIG. 11 is a side view illustrating an electronic device including the waterproof structure 500 according to various embodiments.

The support structure 470 and the waterproof structure 500 of FIGS. 9A to 11 may be partially or wholly identical to the support structure 470 and the waterproof structure 480 of FIG. 8.

Referring to FIGS. 9A, 9B, 10, and 11, the electronic device (e.g., the electronic device 400 of FIG. 11) may include a housing 410, a display device 440, an audio module 450, and a main circuit board 460. According to an embodiment, the housing 410 may include a first housing 413 that covers the front and side faces, and a second housing 415 that covers the rear and side faces and includes a first through hole 4155.

According to various embodiments, the electronic device 400 may include a support structure 470 including a second through hole 473, and a waterproof structure 500 including a gasket 520 disposed between the support structure 470 and the second housing 415.

According to various embodiments, the support structure 470 may include a conduit 475 communicating with the inside through the second through hole 473, and may include a seating portion 471, on which the waterproof structure 500 is seated, along the periphery of the second through hole 473.

According to an embodiment, the second through hole 473 may be configured such that interior sound waves and/or exterior sound waves may propagate therethrough. The conduit 475 is a path for connecting an electronic component (e.g., an audio module (e.g., a microphone) 451) mounted in the inside of the electronic device to the outside of the electronic device. One end of the conduit 475 is connected to the second through hole 473 and the electronic component may be positioned a region adjacent to the other end of the conduit 475.

According to an embodiment, the seating portion 471 may be formed in a shape corresponding to the shape of the rear face of the waterproof structure 500 including the gasket 520. For example, the seating portion 471 may include a first seating face 4711 facing a membrane 530 of the waterproof structure 500 and a second seating face 4713 facing a bracket 510 of the waterproof structure 500. The first seating face 4711 may be formed in a shape corresponding to the shape of the membrane 530, for example. For example, the first seating face 4711 may have a circular groove shape that is depressed inward (in the fourth (−X) direction) of the second seating face 4713, and the second through hole 473 may be located in the center of the first seating face. The second seating face 4713 may be formed to surround the first seating face 4711 and may be formed in a shape corresponding to the outer shape of the bracket 510.

According to various embodiments, the waterproof structure 500 may include a bracket 510 including at least one hole 511, a gasket 520 disposed on one face of the bracket 510, and a membrane 530 disposed on the other face (or opposing face) of the bracket 510. As another example, the waterproof structure 500 may include one or more adhesive members 540, 550, and 560 disposed between the gasket 520 and the bracket 510 and/or between the bracket 510 and the membrane 530.

According to various embodiments, the bracket 510 may include at least one hole 511 connected to the second through hole 473 or a seating face 513, on which the gasket 520 is seated, along the periphery of the hole 511. The at least one hole 511 may be formed to penetrate the bracket 510 in the central region of the bracket 510, for example. The seating face 513 may be formed, for example, in a shape corresponding to the shape of the rear face of the gasket 520 (e.g., a closed curve). The circumferential face adjacent to the hole 511 may be formed as an inclined face 513a. For example, the inclined face 513a may be a face that faces the protrusion 5233 projecting in the fourth (−X) direction of the gasket 520. According to an embodiment, the inclined face 513a may be formed inward to have a predetermined inclination (e.g., between 0 and 90 degrees), and may increase the surface area to be in contact with the edge portion the protrusion of the gasket 520, thereby providing a higher sealing force.

According to an embodiment, the seating face 513 may be formed in a shape corresponding to the shape of the gasket 520, the rear face of which is stepped or inclined. For example, the seating face 513 may include an inner seating face 513b adjacent to the periphery of the hole 511 and an outer seating face 513c surrounding the inner seating face 513b. The inner seating face 513b may have, for example, a groove shape that is relatively more depressed inward than the outer seating face 513c. The inner seating face 513b and the outer seating face 513c may have a structure including a ring shape located on the same center line as the hole 511.

According to various embodiments, the gasket 520 may be located between the bracket 510 and the outer wall of the second housing 415, and may include a flexible material so as to provide a variable property to an external pressure (e.g., resilience). For example, the gasket 520 may be seated on the seating face 513 of the bracket 510. The gasket 520 may include an outer rim 521, a recess portion 523, at least one opening 527, and at least one connection portion 525.

According to an embodiment, the outer rim 521 may be fixedly located between the bracket 510 and a portion of the outer wall of the second housing 415. For example, the outer rim 521 may have a closed curved shape protruding in the third (+X) direction. The outer rim 521 may be disposed to overlap at least a portion of the inner wall of the second housing 415 (e.g., the peripheral portion of the first through hole 4155). The outer rim 521 is a flexible elastomer and is capable of providing sealing between the second housing 415 and the bracket 510, thereby preventing a fluid from entering the inside of the electronic device.

According to an embodiment, the recess portion 523 is movably inserted between the first through hole 4155 of the second housing and the hole 511 of the bracket 510, and may be recessed toward the hole 511. For example, the recess portion 523 is formed in the central region of the gasket 520 such that one face of the recess portion 320, oriented in the third (+X) direction, may form a concave groove 5231, and a convex protrusion 5233 may be formed on another face, oriented in a fourth (−X) direction opposite the third (+X) direction. The recess portion 523 may be disposed between the first through hole 4155 and the hole 511. The recess portion 523 may be formed in a size corresponding to the hole 511. When no external pressure is applied, the recess portion 523 is spaced apart from the peripheral portion of the hole 511 by a predetermined distance and when an external pressure is applied, the recess portion 523 may be elastically moved and positioned to be in contact with the peripheral portion of the hole 511. For example, when an external pressure is applied, the convex protrusion 5233 provides a valve function to block the second through hole 473 in the support structure 470, so that it is possible to prevent the pressure from being transferred to the audio module 451 disposed in the inside. In an embodiment, the shape of the recess portion 523 is circular but not limited thereto. The recess portion 523 may be formed in various shapes such as a square, a triangle, or the like so as to correspond to the shape of the hole 511. The recess portion 523 may have an inclined face formed to have a predetermined inclination (e.g., between 0 degrees and 90 degrees) on the side face of the protrusion 5233 so as to correspond to the inclined face 513a of the bracket 510.

According to an embodiment, the connection portion 525 may be disposed between the outer rim 521 and the recess portion 523 to connect the outer rim 521 and the recess portion 523. The connection portion 525 may include a flexible material, and the portion adjacent to the recess portion 523 may be elastically moved as an external pressure is applied thereto. The connection portion 525 may include at least one opening 527. The opening 527 is capable of performing a ventilation function between the conduit in the support structure 470 and the outside of the electronic device and a passage function through which the sound of the audio module 451 such as a microphone or a speaker is propagated to the outside. For example, the opening 527 may be included in a plural number radially around the hole 511 to be connected to the external environment in various directions, and may be formed to surround the recess portion 523.

According to various embodiments, the membrane 530 is located between the seating portion 471 of the support structure 470 and the bracket 510 and may provide a watertight function capable of blocking an external fluid or the like. For example, the membrane 530 may be disposed on a conduit directed to the audio module 451 disposed in the lower end of the support structure 470 and may include a material such as Gore-Tex. The membrane 530 is a thin film, and an adhesive member may be disposed on the front or rear face of the membrane 530 in order to fixedly dispose the membrane 530 on the seating face 513 in the bracket 510 or the support structure 470.

According to various embodiments, the first adhesive member 540 may be disposed between the bracket 510 and the gasket 520 so as to bond one face of the bracket 510 and the gasket 520 to each other. As another example, the second adhesive member 550 may be disposed between the bracket 510 and the membrane 530 so as to bond the membrane 530 and the other face of the bracket 510 to each other. As another example, the third adhesive member 560 may be disposed between the membrane 530 and the seating portion 471 of the support structure 470 so as to bond the membrane 530 and the support structure 470 to each other. For example, the first adhesive member 540 may have a ring shape to correspond to the shape of the edge face of the gasket 520. The second and third adhesive members 550 and 560 may have a ring shape to correspond to the shape of the edge face of the gasket 530.

According to an embodiment, a film member 570 may be disposed on the rear face of the gasket 520. The film member 570 is disposed between the gasket 520 and the first adhesive member 540, and may provide a function of increasing the adhesive force of the first adhesive member 540 for the gasket 520, which is made of an elastic material. The film member 570 may be provided on the face opposite the outer rim 521 in a shape corresponding to the first adhesive member 540. The film member 570 may be formed, for example, to at least partly include an elastic material, or in the form of a thin film of an elastic material. According to an embodiment, the film member 570 may be made of PET or the like in order to reinforce the strength of the gasket 520, and at least a portion of one or both faces of the film member 570 may be coated with a material including silicon. According to an embodiment, the film member 570 may be omitted depending on the material and structure of the gasket 520. For example, when the material of the gasket 520 is formed of silicon or the like, a primer or the like may be applied to one face of the gasket 520 so as to improve the adhesive force between the adhesive member and the gasket. As another example, when the material of the gasket 520 does not have a problem of adhesion with the first adhesive member 540 like urethane or the like, the film member 570 may be omitted.

Figure 12A:
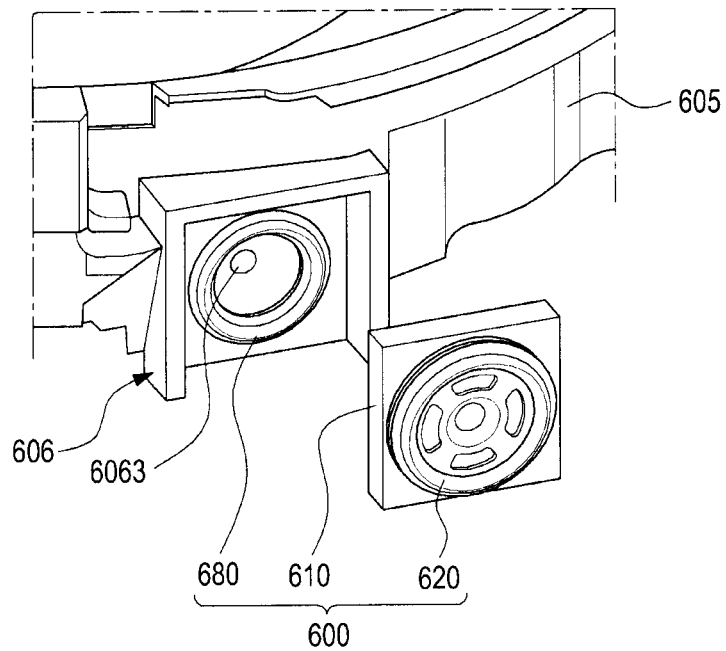
FIG. 12A is a view illustrating a waterproof structure 600, which is viewed from the outside of a support structure 605
Figure 12B:
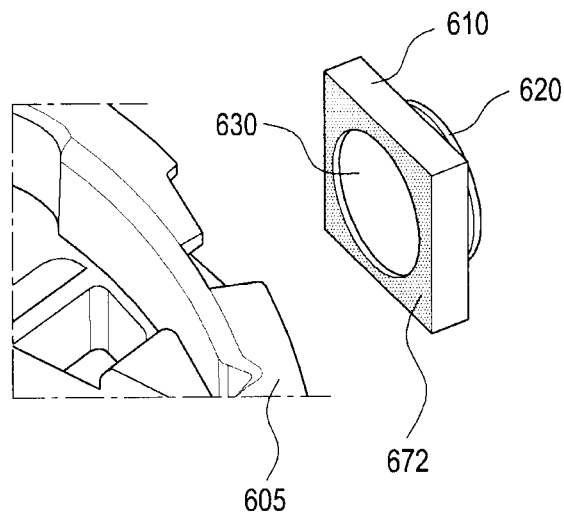
FIG. 12B is a view illustrating the waterproof structure 600, which is viewed from the inside of the support structure 605.

FIGS. 12A and 12B are views illustrating one side of a waterproof structure 605 and a support structure 605 including gaskets 620 and 628 according to various embodiments. FIG. 12A is a view illustrating a waterproof structure 600, which is viewed from the outside of a support structure 605 and FIG. 12B is a view illustrating the waterproof structure 600, which is viewed from the inside of the support structure 605.

Figure 13:
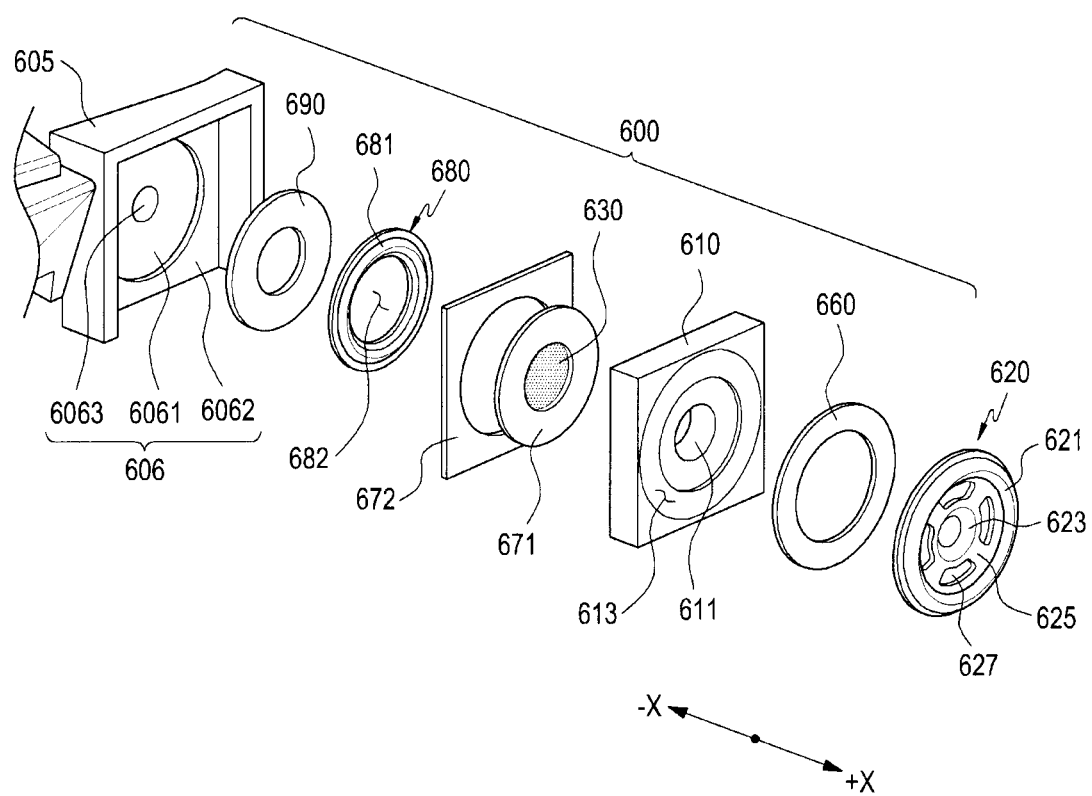
FIG. 13 is an exploded perspective view illustrating the waterproof structure 600 according to various embodiments in a disassembled state.
Figure 14:
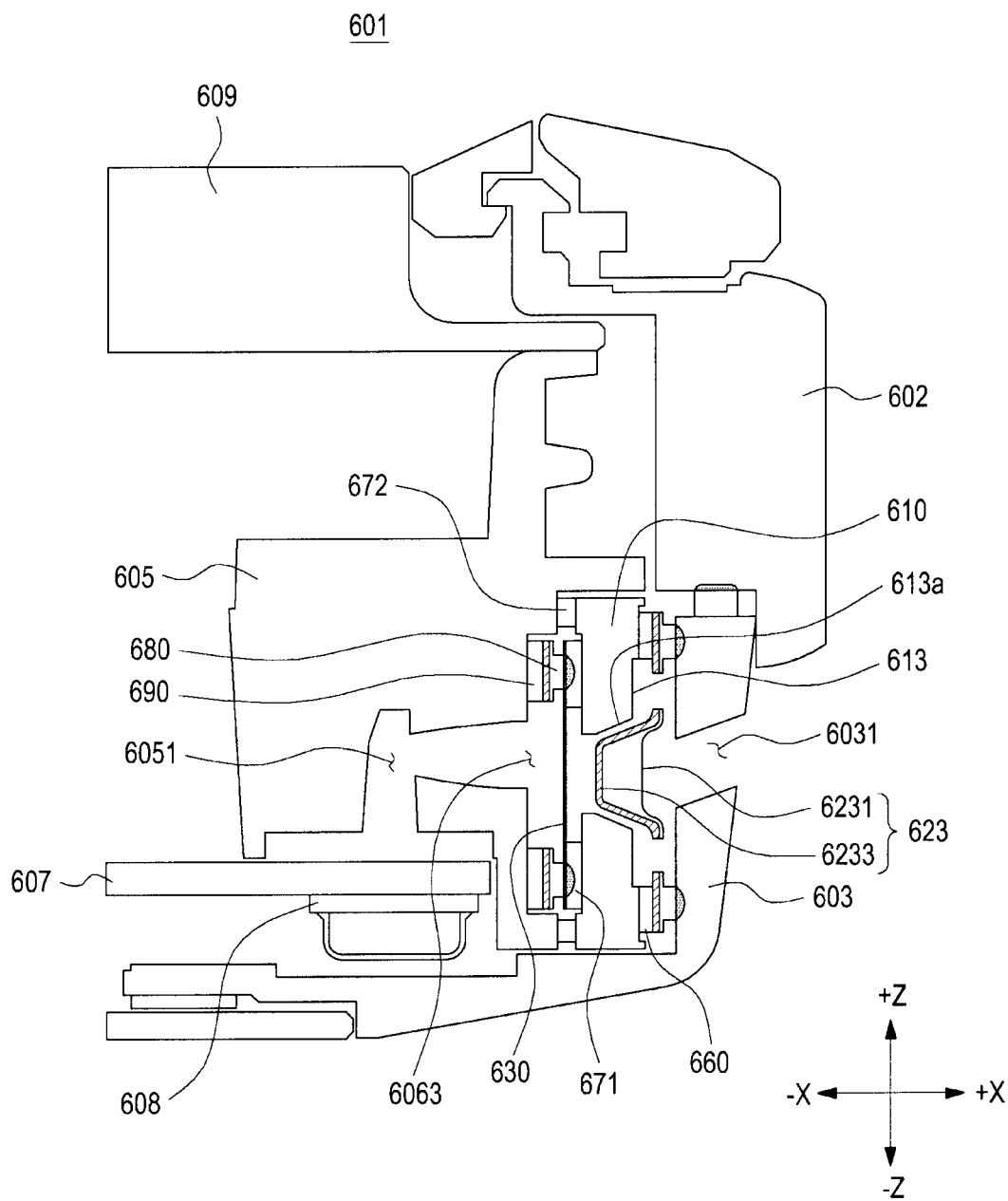
FIG. 14 is a side view illustrating an electronic device 601 including the waterproof structure 600 according to various embodiments.

FIG. 13 is an exploded perspective view illustrating the waterproof structure 600 according to various embodiments in a disassembled state. FIG. 14 is a side view illustrating an electronic device 601 including the waterproof structure 600 according to various embodiments.

The housings 602 and 603, the display device 609, the support structure 605, and the waterproof structure 600 of the electronic device of FIGS. 12A to 14 may be partly or wholly equal to the housing 410, the display device 440, the support structure 470, and the waterproof structure 480 of the electronic device 400 of FIG. 8.

Referring to FIGS. 12A to 14, the electronic device may include the housings 602 and 603, the display device 609, an audio module 608, the support structure 605, and a main circuit board 607. According to an embodiment, the housings 602 and 603 may include a first housing 602 that covers the front and side faces, and a second housing 603 that covers the rear and side faces and includes a first through hole 6031.

According to various embodiments, the electronic device may include a support structure 605 including a second through hole 6063, and a waterproof structure 600 including gaskets 620 and 680 disposed between the support structure 605 and the second housing 603.

According to various embodiments, the support structure 605 may include a conduit 6051 communicating with the inside through the second through hole 6063, and may include a seating portion 606, on which the waterproof structure 600 is seated, along the periphery of the second through hole 6063.

According to an embodiment, the second through hole 6063 may be configured such that inside sound waves and/or outside sound waves may propagate therethrough. The conduit 6051 is a path for connecting an audio module 608 (e.g., a microphone or a speaker) mounted in the inside of the electronic device to the outside of the electronic device. One end of the conduit 6051 is connected to the second through hole 6063 and the audio module 608 may be positioned a region adjacent to the other end of the conduit 6051.

According to an embodiment, the seating portion 606 may be formed in a shape corresponding to the shape of the rear face of the waterproof structure 600 including the gaskets 620 and 680. For example, the seating portion 606 may include a first seating face 6061 facing at least one gasket 680 of the waterproof structure 600 and a second seating face 6062 facing a bracket 610 of the waterproof structure 600. The first seating face 6061 may be formed in a shape corresponding to the shape of the gasket 680. For example, the first seating face 6061 may have a circular groove shape that is depressed inward (in the fourth (−X) direction) of the second seating face 6062. A second through hole 6063 may be located in the center of the first seating face 6061. The second seating face 6062 may be formed to surround the first seating face 6061 and may be formed in a shape corresponding to the outer shape of the bracket 610 (e.g., a rectangular shape).

According to various embodiments, the waterproof structure 600 may include a bracket 610 including at least one hole 611, a plurality of gaskets 620 and 680 disposed on the both faces of the bracket 610, and a membrane 630 disposed on the rear face of the bracket 610. As another example, the waterproof structure 600 may include one or more adhesive members 660, 671, 672, and 690 disposed between the gaskets 620 and 680 and the bracket 610 and/or between the bracket 610 and the membrane 630.

According to various embodiments, the bracket 610 may include at least one hole 611 connected to the second through hole 6063, and may include a seating face 613, on which the first gasket 620 is seated, along the periphery of the hole 611. The at least one hole 611 may be formed to penetrate the bracket 610 in the central region of the bracket 610. The seating face 613 may be formed in a shape corresponding to the shape of the rear face of the first gasket 620 (e.g., a closed curve). The circumferential face adjacent to the hole 611 may be formed as an inclined face 613a. For example, the inclined face 613a may be a face which faces the protrusion 6233 protruding in the fourth (−X) direction of the first gasket 620, and when the inclined face 613a is disposed to be in contact with the protrusion 6233, it is possible to seal the gap between the inside of the support structure 605 and the outside of the electronic device such that the water pressure applied from the outside is not transferred to the audio module 608. The inclined face 613a may be formed inward to have a predetermined inclination (e.g., between 0 and 90 degrees), and may increase the surface area to be in contact with the edge portion of the protrusion of the gaskets 620 and 680, thereby providing a higher sealing force.

According to an embodiment, the seating face 613 may be formed in a shape corresponding to the shape of the gasket 620, the rear face of which is stepped or inclined. For example, the seating face 613 may include an inner seating face adjacent to the periphery of the hole 611 and an outer seating face surrounding the inner seating face 513b. The inner seating face may have, for example, a groove shape that is relatively more depressed inward than the outer seating face. For example, the inner seating face and the outer seating face may have a structure including a ring shape located on the same center line as the hole 611.

According to various embodiments, the gaskets 620 and 680 may include a first gasket 620 disposed between the bracket 610 and the outer wall of the second housing 603 and a second gasket 680 disposed between the bracket 610 and the seating portion 606 of the support structure 605.

According to various embodiments, the first gasket 620 may include a flexible material so as to provide a variable property to an external pressure (e.g., resilience). For example, the first gasket 620 may be seated on the seating surface 613 of the bracket 610. The first gasket 620 may include an outer rim 621, a recess portion 623, a connection portion 625, and at least one opening 627.

According to an embodiment, the outer rim 621 may be fixedly located between the bracket 610 and a portion of the outer wall of the second housing 603. For example, the outer rim 621 may have a closed curved shape protruding in the third (+X) direction and may be disposed to overlap at least a portion of the inner wall of the second housing 603 (e.g., the peripheral portion of the first through hole 6031). The outer rim 621 is a flexible elastomer and is capable of providing sealing between the second housing 603 and the bracket 610, thereby preventing a fluid from entering the inside of the electronic device.

According to an embodiment, the recess portion 623 is movably inserted between the first through hole 6031 of the second housing 603 and the hole 611 of the bracket 610 and may be recessed toward the hole 611. For example, the recess portion 623 is formed in the central region of the gaskets 620 and 680 such that one face of the recess portion 623, oriented in the third (+X) direction, may form a concave groove 6231, and a convex protrusion 6233 may be formed on another face, oriented in the fourth (−X) direction opposite the third (+X) direction. The recess portion 623 may be disposed between the first through hole 6031 and the second through hole 6063. The recess portion 623 may be formed to have a size corresponding to the hole 611 such that, when no external pressure is applied, the recess portion 623 may be spaced apart from the peripheral portion of the hole 611 by a predetermined distance and when an external pressure is applied, the recess portion 623 may be elastically moved and positioned to be in contact with the peripheral portion of the hole 611. For example, when an external pressure is applied, the protrusion 6233 provides a valve function to block the inlet of the hole 611, so that it is possible to prevent the pressure from being transferred to the audio module 608 disposed in the inside. In an embodiment, the shape of the recess portion 623 is circular but not limited thereto. The recess portion 523 may be formed in various shapes such as a square, a triangle, or the like so as to correspond to the shape of the hole 611. The recess portion 623 may have an inclined face formed to have a predetermined inclination (e.g., between 0 degrees and 90 degrees) on the side face of the protrusion 6233 so as to correspond to the inclined face 613a of the bracket 610.

According to an embodiment, the connection portion 625 may be disposed between the outer rim 621 and the recess portion 623 to connect the outer rim 621 and the recess portion 623. The connection portion 625 may include a flexible material, and the portion adjacent to the recess portion 623 may be elastically moved as an external pressure is applied thereto. The connection portion 625 may include at least one opening 627. The opening 627 is capable of providing a ventilation function between the conduit in the support structure 605 and the outside of the electronic device and a passage function through which the sound of the audio module such as a microphone or a speaker is propagated to the outside. For example, the opening 627 may be included in a plural number radially around the hole 611 to be connected to the external environment in various directions, and may be formed to surround the recess portion 623.

According to various embodiments, the second gasket 680 may be disposed to face the first gasket 620 with the bracket 610 interposed therebetween, and may be fixedly disposed on the seating portion 606 of the support structure 605. The second gasket 680 may seal a gap between the bracket 610 and the support structure 605. The second gasket 680 may include a flexible material to provide a variable property to an external pressure (e.g., resilience), and may include an opening 682 and a ring-shaped outer rim 681 in the peripheral portion of the opening 682 so as not to block the second through hole 6063 formed in the support structure 605. For example, the outer rim 681 may have a closed curved shape protruding in the third (+X) direction, and may be disposed to overlap at least a portion of one face of the membrane 630 (e.g., the peripheral portion of the hole 611) disposed on the bracket 610. As another example, an adhesive member 690 may be provided between the second gasket 680 and the support structure 605 so as to bond the second gasket 680 to the seating portion 606.

According to various embodiments, the membrane 630 is located between the second gasket 680 and the bracket 610 and may provide a watertight function capable of blocking an external fluid or the like. For example, the membrane 630 may be disposed on a conduit 6051 directed to the audio module 608 disposed in the lower end of the support structure 605 and may include a material such as Gore-Tex. The membrane 630 is a thin film, and an adhesive member may be disposed on the front or rear face of the membrane 630 in order to fixedly dispose the membrane 630 on the seating face 613 in the bracket 610 or the support structure 605.

According to various embodiments, the waterproof structure 600 may include adhesive members 660, 671, 672, and 690 for bonding the bracket 610, the gaskets 620 and 680, the membrane 630, etc. to each other. The first adhesive member 660 may be disposed between the bracket 610 and the first gasket 620 so as to bond one face of the bracket 610 and the first gasket 620 to each other. As another example, the second adhesive member 671 may be disposed on each of the front and rear faces of the membrane 630 and may bond the membrane 630 to the bracket 610 and the second gasket 680 to be located between the bracket 610 and the second gasket 680. As another example, the third adhesive member 672 may be disposed between the bracket 610 and the seating portion 606 of the support structure 605 so as to bond the bracket 610 and the support structure 605 to each other. As another example, the fourth adhesive member 690 may be disposed between the seating portion 606 of the support structure 605 and the second gasket 680 so as to bond the second gasket 680 to the support structure 605. For example, the first adhesive member 660 and the fourth adhesive member 690 may have a ring shape corresponding to the shape of the edge faces of the first and second gaskets 620 and 680, and the second adhesive member 671 may have a ring shape to correspond to the shape of the edge face of the membrane 630. The third adhesive member 672 may have a rectangular shape with a circular opening formed in the central region thereof to correspond to the edge shape of the bracket 610.

According to an embodiment, a film member (not illustrated) may be disposed on the rear face of the first gasket 620 and/or the rear face of the second gasket 680. For example, the film member may be disposed between the first gasket 620 and the first adhesive member 660, or may be disposed between the second gasket 680 and the fourth adhesive member 690. It is possible to provide a function of increasing the adhesive force of the adhesive member for the first gasket 620 and/or the second gasket 680 made of the elastic material. The film member may be provided on a face opposite the outer rim in a shape corresponding to the adhesive member. The film member may be formed to at least partially include an elastic material. For example, the film member may be formed in the form of a thin film of an elastic material. According to an embodiment, the film member may be made of a material including PET or the like so as to reinforce the strength of the first gasket 620 and/or the second gasket 680. At least a portion of one face or both faces of the film member may be coated with a material including silicon. According to an embodiment, the film member may be omitted depending on the material and structures of the gaskets 620 and 680. For example, when the material of the gaskets 620 and 680 is formed of silicon or the like, a primer or the like may be applied to one face of the gaskets 620 and 680 so as to improve the adhesive force between the adhesive member and the gasket. As another example, when the material of the gaskets 620 and 680 do not have a problem of adhesion with the adhesive member like urethane or the like, the film member may be omitted.

Figure 15A:
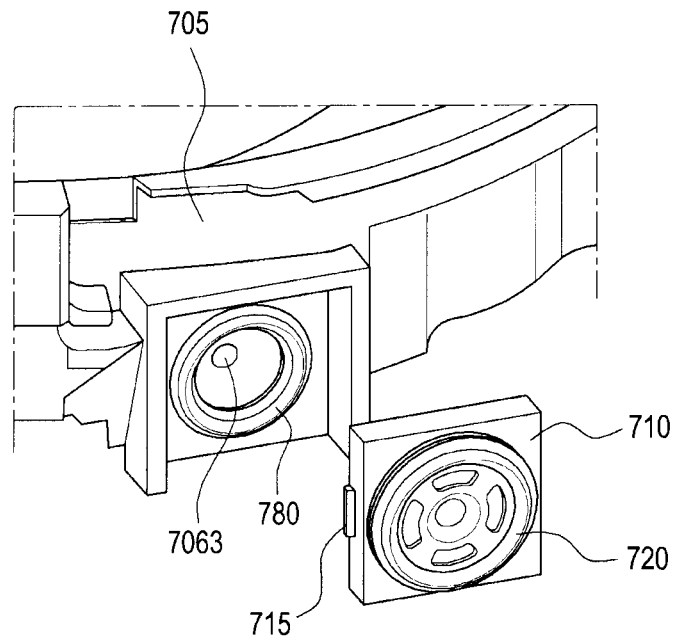
FIG. 15A is a view illustrating a waterproof structure 700, which is viewed from the outside of a support structure 705
Figure 15B:
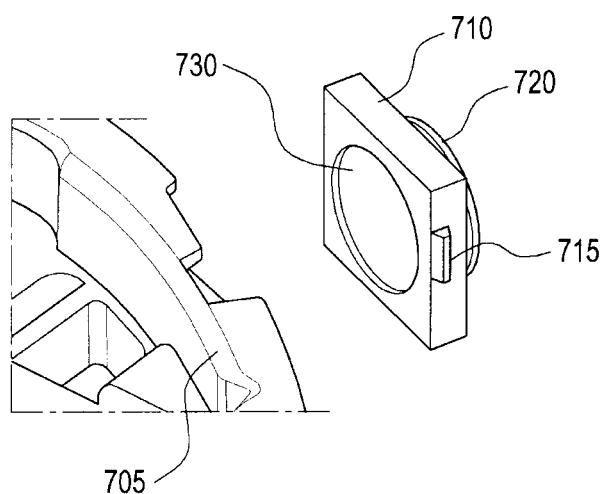
FIG. 15B is a view illustrating the waterproof structure 700, which is viewed from the inside of the support structure 705.
Figure 16:
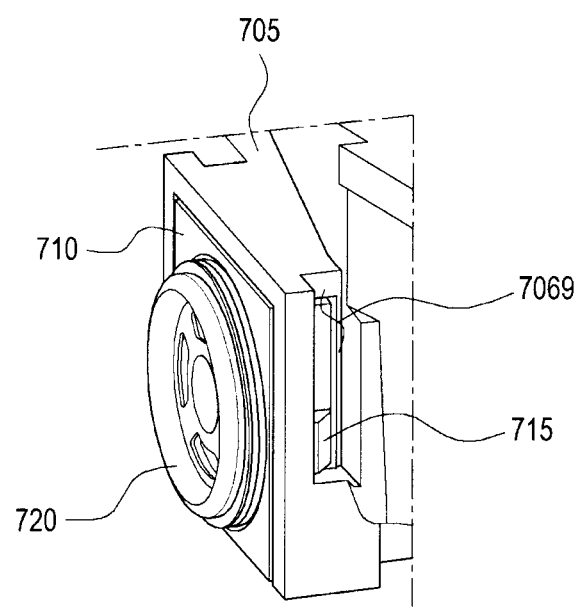
FIG. 16 is a side cross-sectional view illustrating a coupling region of a bracket 710 of the waterproof structure 700 and an assembly unit of the support structure 705.

FIGS. 15A, 15B, and 15B are views illustrating one side of a waterproof structure 700 including gaskets 720 and 780 and a support structure 705, according to various embodiments. FIG. 15A is a view illustrating a waterproof structure 700, which is viewed from the outside of a support structure 705 and FIG. 15B is a view illustrating the waterproof structure 700, which is viewed from the inside of the support structure 705. FIG. 16 is a side cross-sectional view illustrating a coupling region of a bracket 710 of the waterproof structure 700 and an assembly portion 7069 of the support structure 705.

Figure 17:
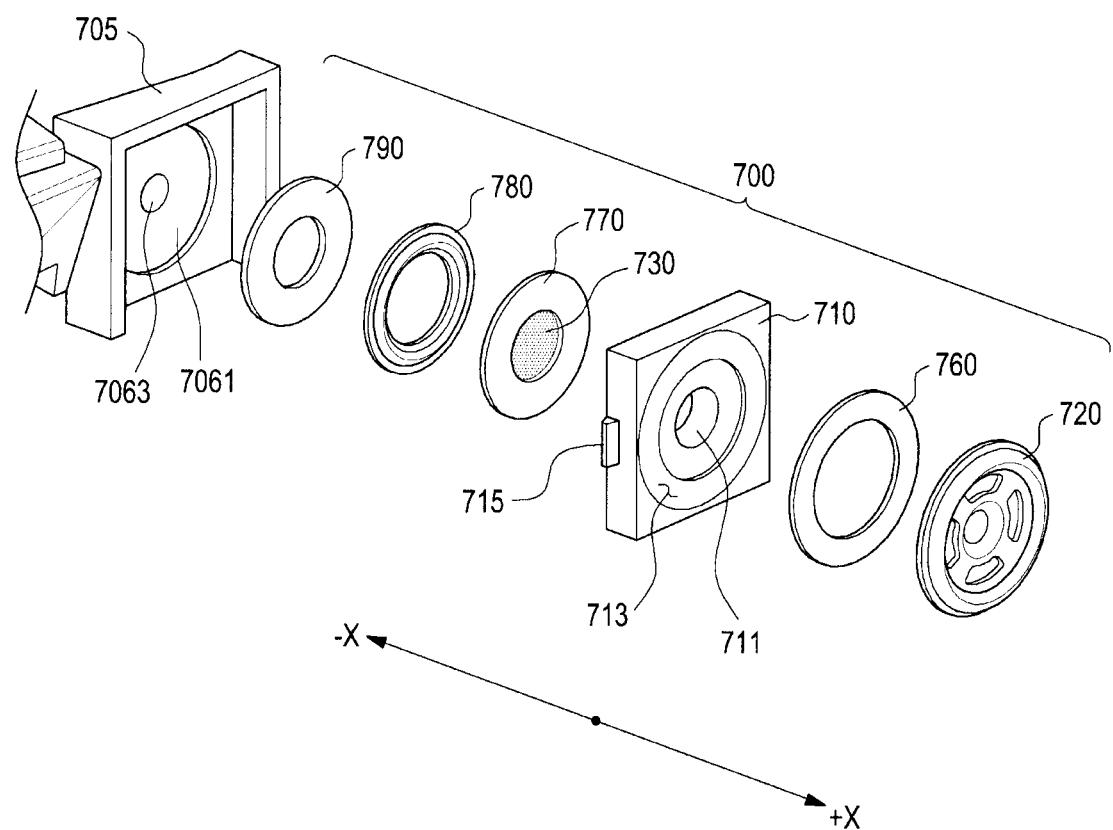
FIG. 17 is an exploded perspective view illustrating the waterproof structure 700 according to various embodiments in a disassembled state.
Figure 18:
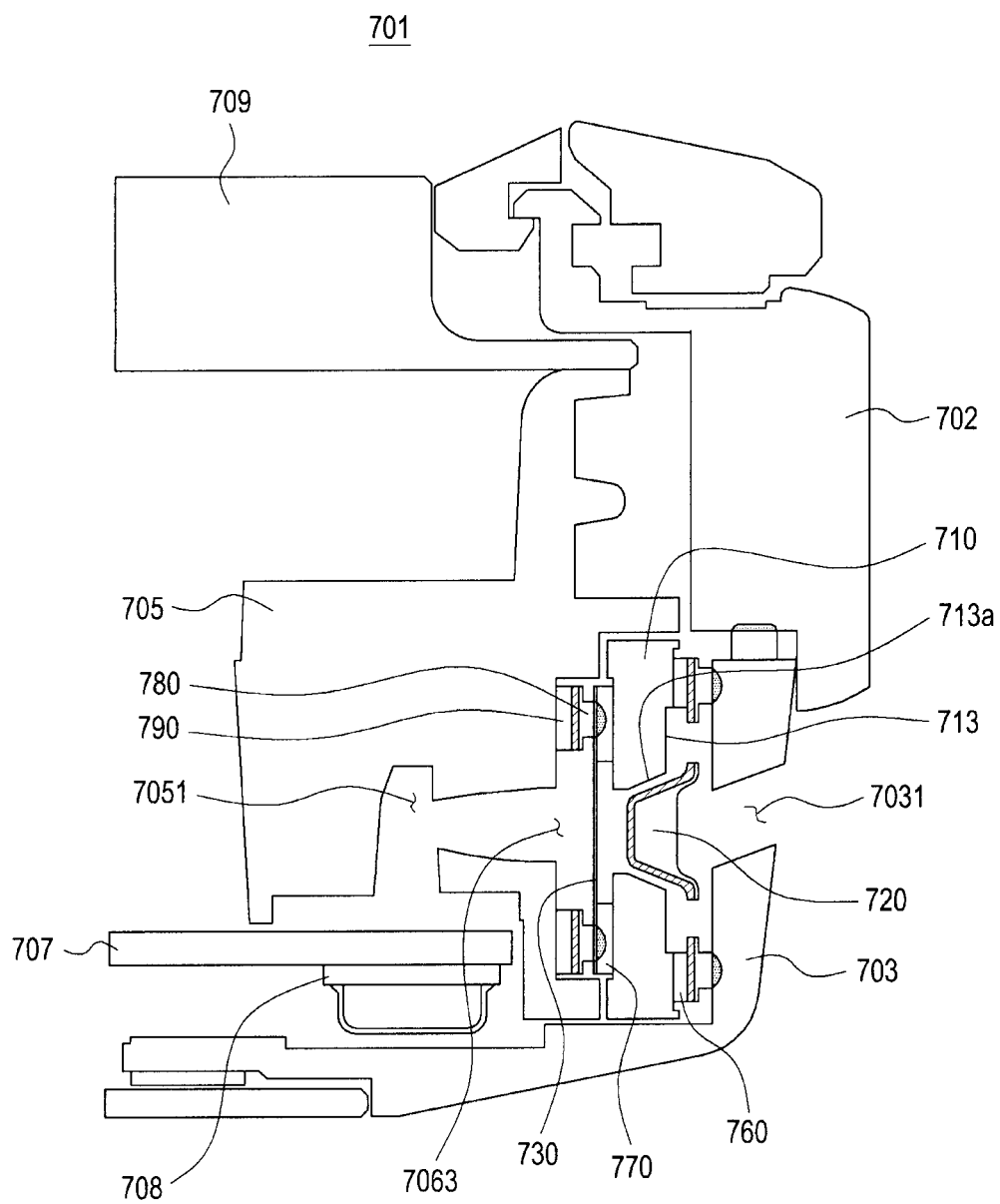
FIG. 18 is a side cross-sectional view illustrating a state in which the waterproof structure 700 and the support structure 705 are coupled to each other.

FIG. 17 is an exploded perspective view illustrating the waterproof structure 700 according to various embodiments in a disassembled state. FIG. 18 is a side cross-sectional view illustrating a state in which the waterproof structure 700 and the support structure 705 are coupled to each other.

The housings 702 and 703, the display device 709, the support structure 705, and the waterproof structure 700 of the electronic device of FIGS. 15A to 18 may be partly or wholly equal to the housings 602 and 603, the display device 609, the support structure 605, and the waterproof structure 600 of the electronic device 601 of FIGS. 12A to 14. Since the embodiment of FIGS. 15A to 18 is mostly applicable to the configuration of the previous embodiment (the embodiment of FIGS. 12A to 14), differences therebetween (e.g., the assembly portion 7069 of the support structure 705 and the hook 715 of the bracket 710) will be mainly described.

Referring to FIGS. 15A to 18, the electronic device 701 may include the housings 702 and 703, the display device 709, an audio module 708, and a main circuit board 707. According to an embodiment, the housings 702 and 703 may include a first housing 702 that covers the front and side faces, and a second housing 703 that covers the rear and side faces and includes a first through hole 7031.

According to various embodiments, the electronic device may include a support structure 705 including a second through hole 7063, and a waterproof structure 700 including gaskets 720 and 780 disposed between the support structure 705 and the second housing 703.

According to various embodiments, the support structure 705 may include a conduit 7051 communicating with the inside through the second through hole 7063, and may include a seating portion 7061, on which the waterproof structure 700 is seated, along the periphery of the second through hole 7063. As another example, both sides of the support structure 705 may include assembly portions 7069, to which hooks 715 of the bracket 710 may be coupled.

According to an embodiment, the second through hole 7063 may be configured such that inside sound waves and/or outside sound waves may propagate therethrough. The conduit 7051 is a path for connecting the sound of an audio module 708 (e.g., a microphone or a speaker) mounted in the inside of the electronic device to the outside of the electronic device. One end of the conduit 6051 is connected to the second through hole 7063 and the audio module 708 may be positioned a region adjacent to the other end of the conduit 6051. According to an embodiment, the seating portion 7061 may be formed in a shape corresponding to the shape of the rear face of the waterproof structure 700 including the gaskets 720 and 780.

According to an embodiment, the assembly portions 7069 may be formed on the side faces of the seating portion 7061, and, simultaneously when the bracket 710 is seated on the seating portion 7061, the hooks 715 may be inserted into the assembly portions 7069, inducing fitting to the assembly portions. Due to the physical coupling of the bracket 710 and the support structure 705, the adhesive member between the bracket and the support structure, which is utilized in any other embodiment (e.g., the embodiment of FIGS. 12A-14) may be omitted.

According to various embodiments, the waterproof structure 700 may include a bracket 710 including at least one hole 711, a plurality of gaskets 720 and 780 disposed on the both faces of the bracket 710, and a membrane 730 disposed on the rear face of the bracket 710. As another example, the waterproof structure 700 may include one or more adhesive members 760, 770, and 790 disposed between the gaskets 720 and 780 and the bracket 710 and/or between the bracket 710 and the membrane 730.

According to various embodiments, the bracket 710 may include at least one hole 711 connected to the conduit 7051, and may include seating faces 713, on which the gaskets 720 and 780 are seated, along the periphery of the hole 711. The at least one hole 711 may be formed to penetrate the bracket 710 in the central region of the bracket 710. The seating faces 713 may be formed in a shape corresponding to the shape of the rear faces of the gaskets 720 and 780 (e.g., a closed curve). The circumferential face adjacent to the hole 711 may be formed as an inclined face 713a. For example, the inclined face 713a may be a face on which the protrusion of the first gasket 720, protruding in the fourth (−X) direction, abuts, and when the inclined face 713a is disposed to be in contact with the protrusion, it is possible to seal the gap between the inside of the support structure 705 and the outside of the electronic device 200 such that the water pressure applied from the outside is not transferred to the audio module 708. The inclined face 713a may be formed inward to have a predetermined inclination (e.g., between 0 and 90 degrees), and may increase the surface area to be in contact with the edge portion the protrusion of the first gasket 720, thereby providing a higher sealing force.

According to an embodiment, one or more hooks 715 may be disposed on the outer face of the bracket 710. The hooks 715 may induce fitting to the assembly portions 7069 of the support structure 705, thereby coupling the bracket 710 to the support structure 705. The hooks 715 may include inclined faces rising from the rear face to the front face so as to be easily coupled to but not to be disengaged. According to an embodiment, two or more hooks 715 may be formed in addition to both sides in order to facilitate coupling to the support structure 705, and may be variously formed.

According to an embodiment, the gaskets 720 and 780 may include a first gasket 720 disposed between the bracket 710 and the outer wall of the second housing 703 and a second gasket 780 disposed between the bracket 710 and the seating portion 7061 of the support structure 705.

According to various embodiments, the membrane 730 is located between the second gasket 780 and the bracket 710 and may provide a watertight function capable of blocking an external fluid or the like. For example, the membrane 730 may be disposed on a conduit directed to the audio module 708 disposed in the lower end of the support structure 705 and may include a material such as Gore-Tex.

According to various embodiments, the waterproof structure 700 may include adhesive members 760, 770, and 790 for bonding the bracket 710, the gaskets 720 and 780, the membrane 730, etc. to each other.

Figure 19A:
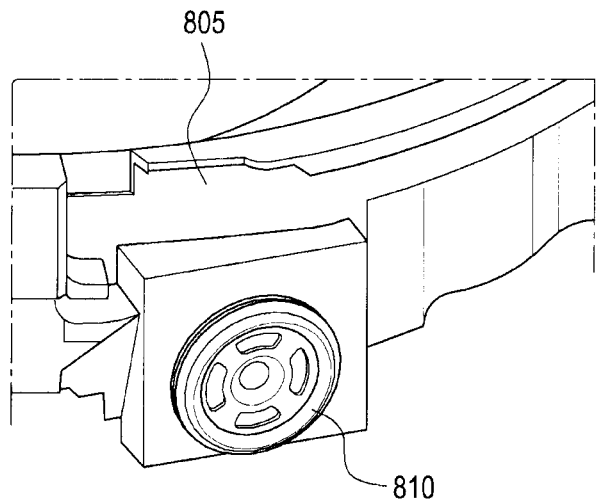
FIG. 19A is a view illustrating a waterproof structure 800 including a first gasket 810, in which the waterproof structure 800 is viewed from the outside of the support structure 805.
Figure 19B:
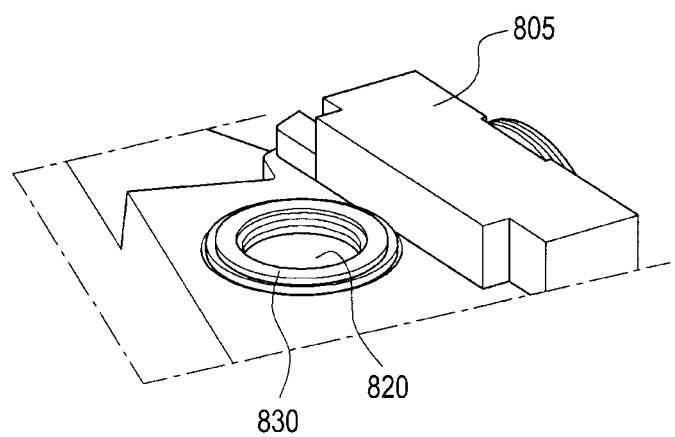
FIG. 19B is a view illustrating the waterproof structure 800 including a second gasket 820 in which the waterproof structure 800 is viewed from the inside of the support structure 805.

FIGS. 19A and 19B are views illustrating a coupling region of a waterproof structure 800 including gaskets 810 and 820 and a support structure 805 according to various embodiments. FIG. 19A is a view illustrating a waterproof structure 800 including a first gasket 810, in which the waterproof structure 800 is viewed from the outside of the support structure 805, and FIG. 19B is a view illustrating the waterproof structure including a second gasket 820 in which the waterproof structure 800 is viewed from the inside of the support structure 805.

Figure 20:
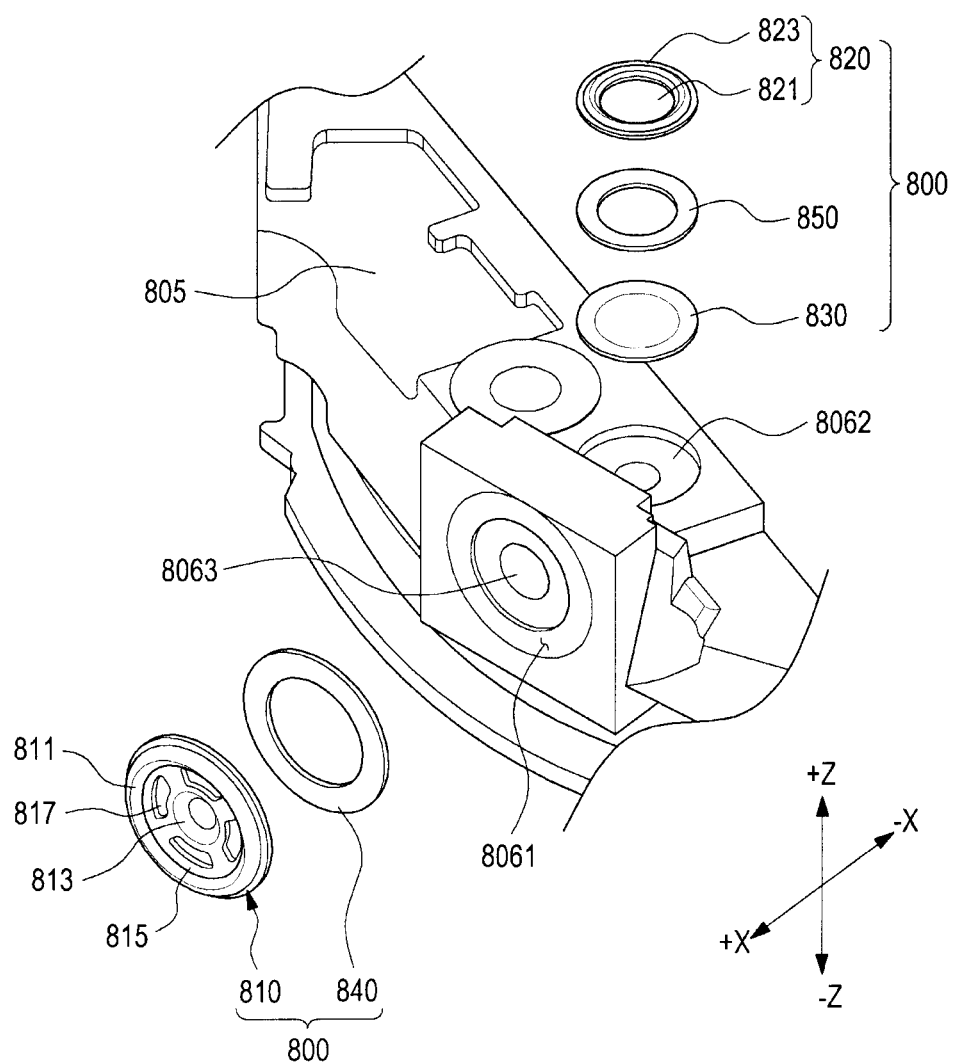
FIG. 20 is an exploded perspective view illustrating the waterproof structure 800 according to various embodiments in a disassembled state.
Figure 21:
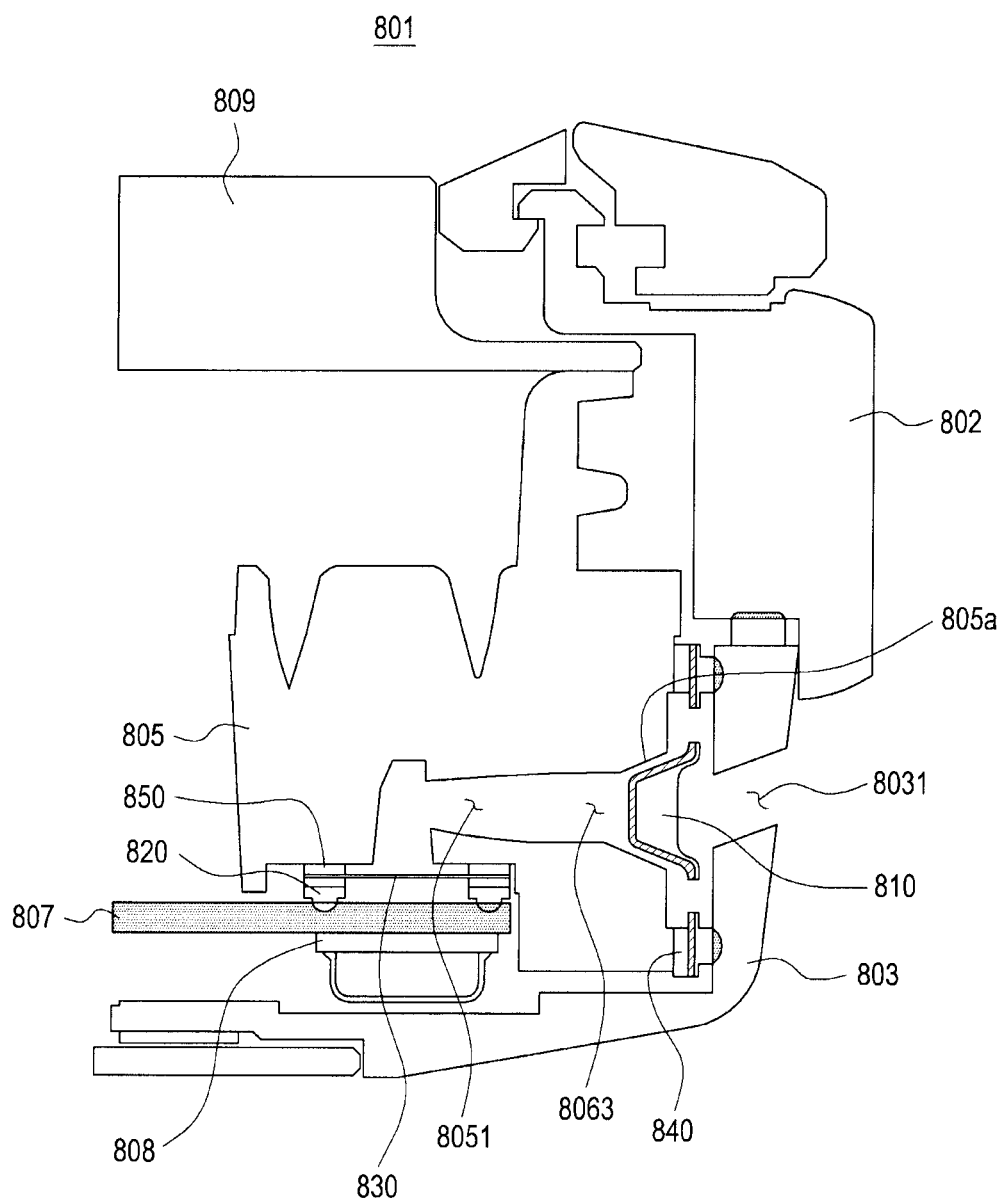
FIG. 21 is a side view illustrating an electronic device including the waterproof structure 800 according to various embodiments.

FIG. 20 is an exploded perspective view illustrating the waterproof structure 800 according to various embodiments in a disassembled state. FIG. 21 is a side view illustrating an electronic device including the waterproof structure 800 according to various embodiments.

The housings 802 and 803, the display device 809, and the support structure 805 of the electronic device 801 of FIGS. 19A to 21 may be partly or wholly equal to the housings 602 and 603, the display device 609, the support structure 605, and the waterproof structure 600 of the electronic device 601 of FIGS. 12A to 14.

Referring to FIGS. 19A to 21, the electronic device 801 may include the housings 802 and 803, the display device 809, an audio module 808, and a main circuit board 807. According to an embodiment, the housings 802 and 803 may include a first housing 802 that covers the front and side faces, and a second housing 803 that covers the rear and side faces and includes a first through hole 8031.

According to various embodiments, the electronic device may include a support structure 805 including a second through hole 8063, and a waterproof structure 800 including gaskets 810 and 820 disposed to be seated in the support structure 805.

According to various embodiments, the support structure 805 may include a conduit 8051 communicating with the inside through the second through hole 8063, and may include seating portions 8061 and 8062, on which the waterproof structure 800 is seated, along the periphery of the opposite ends of the conduit.

According to an embodiment, the second through hole 8063 may be configured such that inside sound waves and/or outside sound waves may propagate therethrough. The conduit 8051 is a path for connecting an audio module 808 (e.g., a microphone or a speaker) mounted in the inside of the electronic device to the outside of the electronic device. One end of the conduit 8051 is connected to the second through hole 811 and the microphone 808 may be positioned a region adjacent to the other end of the conduit 8051.

According to an embodiment, the seating portion 8061 may include a first seating portion 8061 formed on a first face facing the outer face of the support structure 805, and a second seating portion 8062 formed on a second face oriented in a direction different from the first face. The first seating portion 8061 and the second seating portion 8062 may be formed in the opposite ends of the conduit 8051 of the support structure 805 and the waterproof structures 800, each including the gasket 810 or the gasket 820, may be seated on the first seating portion 8061 and the second seating portion 8062, respectively.

According to an embodiment, the first seat portion 8061 may be formed in a shape corresponding to the rear face shape of the first gasket 810. For example, the first seating portion 8061 may have a shape recessed in the fourth (−X) direction opposite the third (+X) direction so as to accommodate the first gasket 810 disposed to face the third (+X) direction. As another example, the second seating portion 8062 may be formed in a shape corresponding to the rear face shape of the membrane 830. For example, the second seating portion 8062 may have a shape recessed in the second (−Z) direction opposite the first (+Z) direction so as to accommodate the second gasket 820 and the membrane 830 disposed to face the first (+Z) direction.

According to an embodiment, the first seating portion 8061 may be formed in a shape corresponding to the shape of the rear face of the waterproof structure 800 including the first gasket 810. The circumferential face of the first seating portion 8061 adjacent to the second through hole 8063 may be formed as an inclined face 805*a*. For example, the inclined face 805*a* may be a face on which the protrusion of the first gasket 810, protruding in the fourth (−X) direction, abuts. When the inclined face 805*a* is disposed to be in contact with the protrusion of the first gasket 810, it is possible to seal the gap between the inside of the support structure 805 and the outside of the electronic device such that the water pressure applied from the outside is not transferred to the audio module 808. The inclined face 805*a* may be formed inward to have a predetermined inclination (e.g., between 0 and 90 degrees), and may increase the surface area to be in contact with the edge portion the protrusion of the first gasket 810, thereby providing a higher sealing force.

As another example, the audio module 808 may be disposed adjacent to the second seating portion 8062. For example, the audio module 808 may be disposed on the second seating portion 8062 in the second (−Z) direction.

According to various embodiments, the waterproof structure 800 may include a first gasket 810, which is disposed on the first seating portion 8061 of the support structure 805, and a second gasket 820 and a membrane 830, which are disposed on the second seating portion 8062 of the support structure 805. As another example, the waterproof structure 800 may include one or more adhesive members 840 and 850 disposed between the gaskets 810 and 820 and the support structure 805 and/or between the gaskets 810 and 820 and the membrane 830.

According to various embodiments, the first gasket 810 may be located between the second housing 803 and the support structure 805, and may include a flexible material so as to provide a variable property to an external pressure (e.g., resilience). For example, the first gasket 810 may be seated on the first seating portion 8061 of the bracket 810 and may include an outer rim 811, a recess portion 813, a connection portion 815, and at least one opening 817.

According to an embodiment, the outer rim 811 may be fixedly located between the first seating portion 8061 and a portion of the outer wall of the second housing 803. For example, the outer rim 811 may have a closed curved shape protruding in the third (+X) direction and may be disposed to overlap at least a portion of the inner wall of the second housing 803 (e.g., the peripheral portion of the first through hole 8031). The outer rim 811 is a flexible elastomer and is capable of providing sealing between the second housing 803 and the first seating portion 8061, thereby preventing a fluid from entering the inside of the electronic device.

According to an embodiment, the recess portion 813 is movably inserted between the first through hole 8131 of the second housing 803 and the second through hole 8063 of the support structure 805, and may be recessed toward the second through hole 8063. As another example, the recess portion 813 may be disposed on the conduit 8051 formed from the first through hole 8031 to the second through hole 8063. The recess portion 813 may be formed to have a size corresponding to the second through hole 8063 such that, when no external pressure is applied, the recess portion 813 may be spaced apart from the peripheral portion of the second through hole 8063 by a predetermined distance and when an external pressure is applied, the recess portion 813 may be elastically moved and positioned to be in contact with the peripheral portion of the second through hole 8063. In an embodiment, the shape of the recess portion 813 is circular but not limited thereto. The recess portion 813 may be formed in various shapes such as a square, a triangle, or the like so as to correspond to the shape of the second through hole 8063. The recess portion 813 may have a sloped face formed to have a predetermined inclination (e.g., between 0 degrees and 90 degrees) on the side face of the protrusion so as to correspond to the inclined face 805*a* of the support structure 805.

According to an embodiment, the connection portion 815 may be disposed between the outer rim 815 and the recess portion 813 to connect the outer rim 815 and the recess portion 813. The connection portion 815 may include a flexible material, and the portion adjacent to the recess portion 813 may be elastically moved as an external pressure is applied thereto. The connection portion 815 may include at least one opening 817. The opening 817 is capable of providing a ventilation function between the conduit in the support structure 805 and the outside of the electronic device and a passage function through which the sound of the audio module such as a microphone or a speaker is propagated to the outside.

According to various embodiments, the second gasket 820 may be fixedly disposed on the second seating portion 8062. The second gasket 820 may include a flexible material to provide a variable property to an external pressure (e.g., resilience), and may include an opening 821 and a ring-shaped outer rim 823 in the peripheral portion of the opening 821 so as not to block the conduit 8051 formed in the support structure 805. For example, the outer rim 823 may have a closed curve shape protruding in the second (−Z) direction and may overlap at least a portion of the membrane 830 disposed to face the outer rim 823.

According to various embodiments, the membrane 830 is located between the second gasket 820 and the second seating portion 8062 and may provide a watertight function capable of blocking an external fluid or the like. For example, the membrane 830 may be disposed on a conduit 8051 directed to the audio module 808 disposed in the lower end of the support structure 805 and may include a material such as Gore-Tex. The membrane 830 is a thin film, and an adhesive member 850 may be disposed on the front or rear face of the membrane 830 in order to fixedly dispose the membrane 630 on the seating portion 8062 in the support structure 805.

According to various embodiments, the waterproof structure 800 may include adhesive members 840 and 850 for bonding facing members, among the seating portions 8061 and 8062, the gaskets 810 and 820 and the membrane 830, to each other. The first adhesive member 840 may be disposed between the first seating portion 8061 and the first gasket 810 so as to bond the support structure 805 and the first gasket 810 to each other. As another example, the second adhesive member 850 may be disposed between the membrane 830 and the second gasket 820 so as to bond the membrane 830 and the second gasket 820 to each other. For example, the first adhesive member 840 and the second adhesive member 850 may have a ring shape corresponding to the shape of the edge faces of the first and second gaskets 810 and 820.

According to an embodiment, a film member (not illustrated) may be disposed on the rear face of the first gasket 810 and/or the rear face of the second gasket 820. For example, the film member may be disposed between the first gasket 810 and the first adhesive member 840, or may be disposed between the second gasket 820 and the second adhesive member 850. The film member is capable of providing a function of increasing the adhesive force of the adhesive members 840 and 850 to the first gasket 810 and/or the second gasket 820, which are made of an elastic material.

Figure 22A:
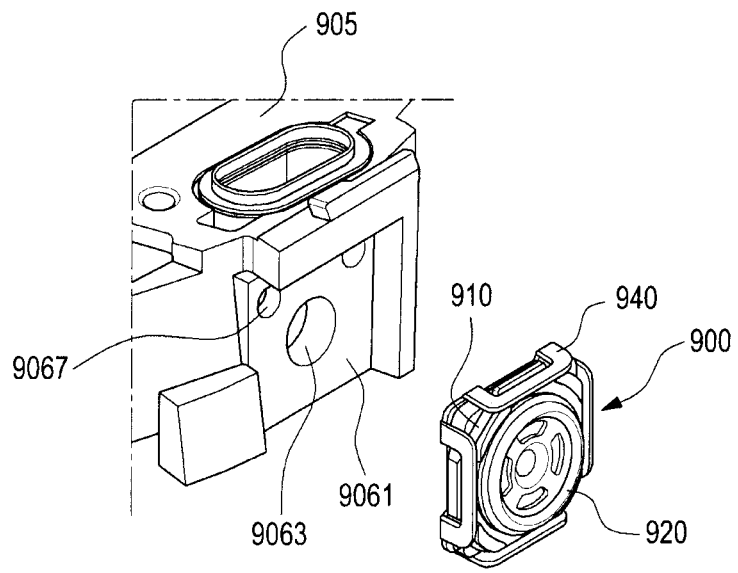
FIG. 22A is a view illustrating a waterproof structure 900, which is viewed from the outside of a support structure 905
Figure 22B:
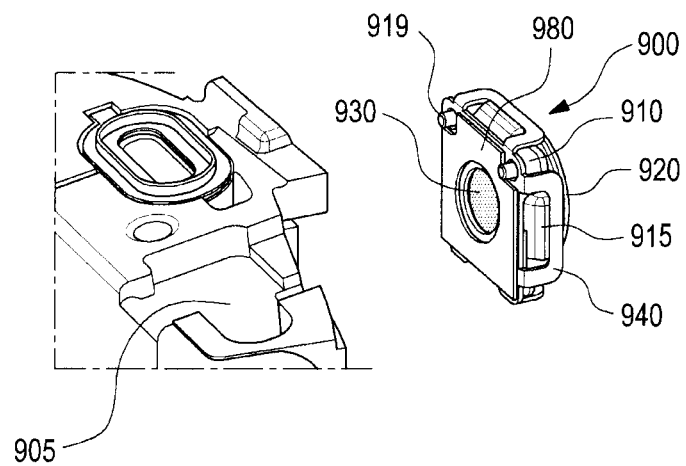
FIG. 22B is a view illustrating the waterproof structure 900, which is viewed from the inside of the support structure 905.

FIGS. 22A and 22B are views illustrating one side of a waterproof structure 900 including a gasket 920 and a support structure 905 according to various embodiments. FIG. 22A is a view illustrating a waterproof structure 900, which is viewed from the outside of a support structure 905 and FIG. 22B is a view illustrating the waterproof structure 900, which is viewed from the inside of the support structure 905.

Figure 23:
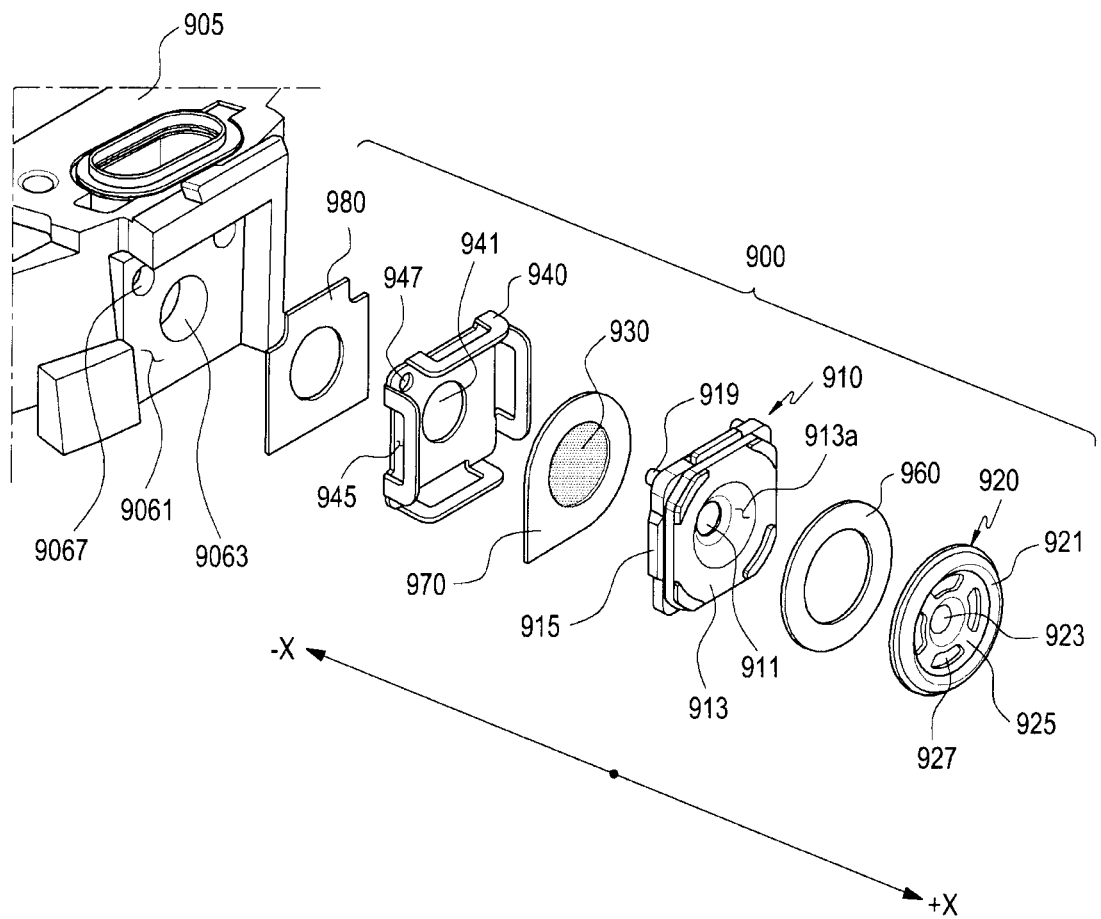
FIG. 23 is an exploded perspective view illustrating the waterproof structure 900 according to various embodiments in a disassembled state.
Figure 24:
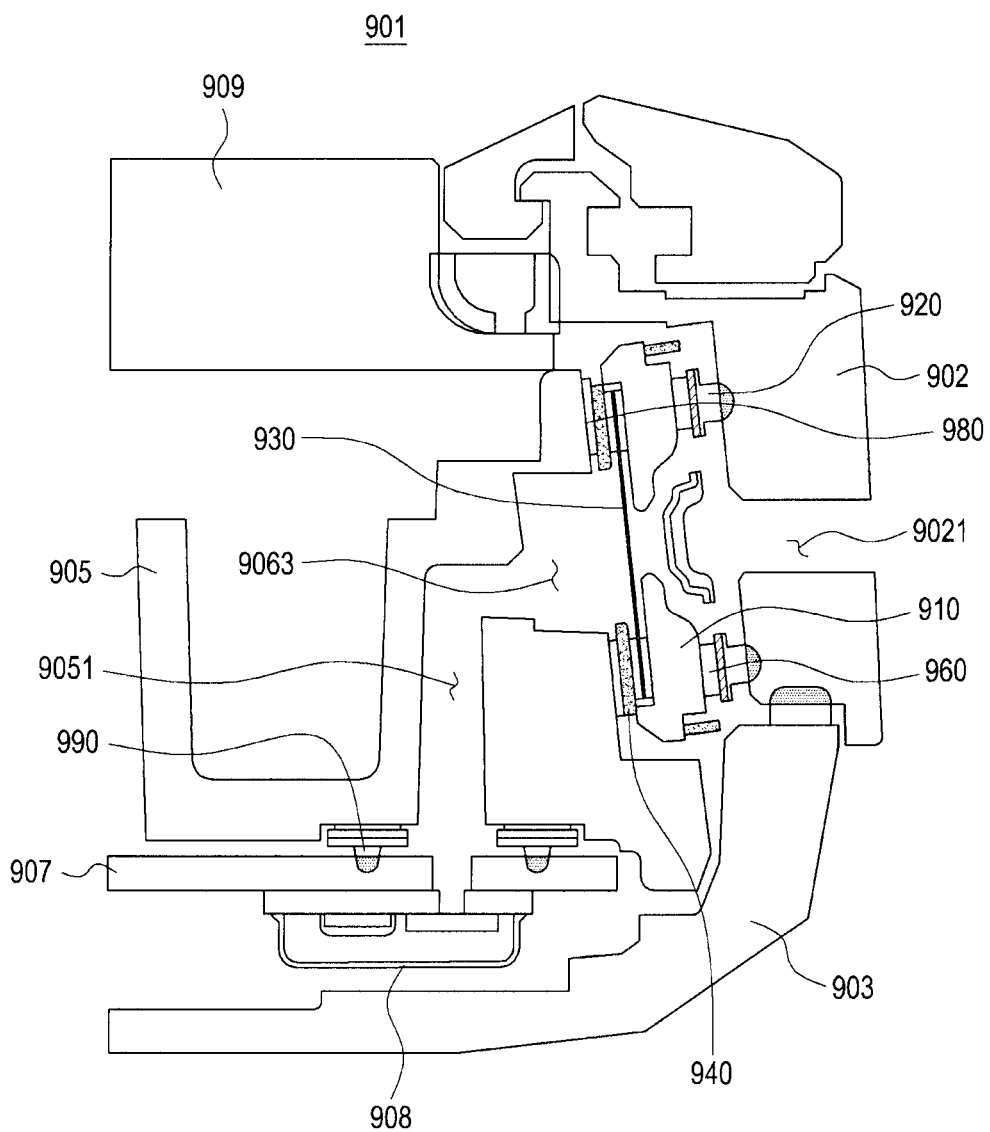
FIG. 24 is a side view illustrating an electronic device including the waterproof structure 900 according to various embodiments.

FIG. 23 is an exploded perspective view illustrating the waterproof structure 900 according to various embodiments in a disassembled state. FIG. 24 is a side view illustrating an electronic device including the waterproof structure 900 according to various embodiments.

The housings 902 and 903, the display device 909, the support structure 905, and the waterproof structure 900 of the electronic device of FIGS. 22A to 24 may be partly or wholly equal to the housing 410, the display device 440, the support structure 470, and the waterproof structure 480 of the electronic device 400 of FIG. 8.

Referring to FIGS. 22A to 24, the electronic device may include the housings 902 and 903, the display device 909, an audio module 908, and a main circuit board 907. According to an embodiment, the housings 902 and 903 may include a first housing 902 that covers the front and side faces, and a second housing 903 that covers the rear and side faces and includes a first through hole. As another example, the housings 902 and 903 may include a first housing 902 that covers the front and side faces and includes a first through hole 9021 and a second housing 903 that covers the rear and side faces According to various embodiments, the electronic device may include a support structure 905 including a second through hole 9063, and a waterproof structure 900 including a gasket 920 disposed between the support structure 905 and the first housing 902.

According to various embodiments, the support structure 905 may include a conduit 9051 communicating with the inside through the second through hole 9063, and may include a seating portion 9061, on which the waterproof structure 900 is seated, along the periphery of the second through hole 9063. As another example, at least one groove 9067 may be formed inside the seating portion 9061.

According to an embodiment, the second through hole 9063 may be configured such that inside sound waves and/or outside sound waves may propagate therethrough. The conduit 9051 is a path for connecting an audio module 908 (e.g., a microphone or a speaker) mounted in the inside of the electronic device to the outside of the electronic device. One end of the conduit 9051 is connected to the second through hole 9063 and the audio module may be positioned a region adjacent to the other end of the conduit 9051. As another example, a waterproof structure including a gasket 990 may be disposed at the inlet of the conduit 9051 connected to the audio module 908 so as to seal a gap between the support structure 905 and the circuit board 907. The gasket 990 and the structure where the gasket is seated may be partly or wholly the same as the second gasket 820 and the structure where the second gasket 820 is seated, in FIGS. 19 to 21.

According to an embodiment, the seating portion 9061 may be formed in a shape corresponding to the shape of the rear face of the waterproof structure 900 including the gasket 920. For example, substantially a great part of the region of the seating portion 9061 may be disposed to face the bracket cover 940 of the waterproof structure 900, and a protrusion 919 protruding from the rear face of the bracket 910 may be fixedly inserted into at least one groove 9067 formed in a partial region of the seating portion 9061.

According to various embodiments, the waterproof structure 900 may include the bracket 910 including at least one hole 911, the gasket 920 disposed on one face of the bracket 910, and a membrane 930 disposed on the rear face of the bracket 910. As another example, the waterproof structure 900 may include the bracket cover 940 that protects the membrane 930 and is disposed to cover a partial region of the bracket 910. As another example, the waterproof structure 900 may include one or more adhesive members 960, 970, and 980 disposed between the gasket 920 and the bracket 910 and/or between the bracket cover 940 and the membrane 930.

According to various embodiments, the bracket 910 may include at least one hole 911 connected to the second through hole 9063, and may include a seating face 913, on which the gasket 920 is seated, along the periphery of the hole 911. The at least one hole 911 may be formed to penetrate the bracket 910 in the central region of the bracket 910, for example. The seating face 913 may be formed in a shape corresponding to the shape of the rear face of the gasket 920 (e.g., a closed curve). The circumferential face adjacent to the hole 911 may be formed as an inclined face 913a. For example, the inclined face 913a may be a face on which the protrusion of the gasket 920, protruding in the fourth (−X) direction, abuts. When the inclined face 913a is disposed to be in contact with the protrusion, it is possible to seal the gap between the inside of the support structure 905 and the outside of the electronic device such that the water pressure applied from the outside is not transferred to the audio module 908. The inclined face 913a may be formed inward to have a predetermined inclination (e.g., between 0 and 90 degrees), and may increase the surface area to be in contact with the edge portion of the protrusion of the gasket 920, thereby providing a higher sealing force.

According to an embodiment, one or more hooks 915 may be disposed on the outer face of the bracket 910. The hooks 915 may pass through the openings 945 of the bracket cover 940, thereby inducing fitting to the bracket cover 940. The hooks 915 may include inclined faces rising from the rear face to the front face so as to be easily coupled to but not to be disengaged. According to an embodiment, two or more hooks 915 may be formed in addition to both sides in order to facilitate coupling to the support structure 905, and may be variously formed.

According to an embodiment, the rear face of the bracket 910 may include at least one protrusion 919 so as to be supported on the seating face 913 of the support structure 905 without swaying while the bracket 1010 is seated thereon. For example, the protrusion 919 protrudes from the rear face of the bracket 910 in the fourth (−X) direction and is capable of being fitted into the groove 9067 in the support structure 905 through the hole 947 formed in the bracket cover 940.

According to various embodiments, the gasket 920 may be located between the bracket 910 and the outer wall of the first housing 902, and may include a flexible material so as to provide a variable property to an external pressure (e.g., resilience). For example, the gasket 920 may be fixedly disposed by being seated on the seating face 913 of the bracket 910. The gasket 920 may include an outer rim 921, a recess portion 923, a connection portion 925, and at least one opening 927. The structure of the outer rim 921, the recess portion 923, the connection portion 925, and the opening 927 may be the same as or similar to the embodiment of the gasket 620 of FIGS. 12A to 14.

According to various embodiments, the membrane 930 is located between the bracket 910 and the bracket cover 940 and may provide a watertight function capable of blocking an external fluid or the like. For example, the membrane 930 may be disposed on a conduit 9051 directed to the audio module 908 disposed in the lower end of the support structure 905 and may include a material such as Gore-Tex. The membrane 930 is a thin film, and an adhesive member 970 may be disposed on the front or rear face of the membrane 930 in order to fixedly dispose the membrane 930 on one face of the bracket 910 or the bracket cover 940.

According to various embodiments, the bracket cover 940 may be formed to enclose the rear and side faces of the bracket 910, and the membrane 930 may be inserted therein so as to protect the bracket cover 940. The center of the bracket cover 940 may be provided with a hole 941 formed in the same line as the center line of the second through hole 9063 and the side face thereof may have openings 945 through which the hooks 915 of the bracket 910 pass. As another example, a corner region of the bracket cover 940 may include at least one hole 947 through which the protrusion 919 of the bracket 910 is capable of passing.

According to various embodiments, the waterproof structure 900 may include adhesive members 960, 970, and 980 for bonding the bracket 910, the gasket 920, the membrane 930, the bracket cover 940, etc. to each other. The first adhesive member 960 may be disposed between the bracket 910 and the gasket 920 so as to bond one face of the bracket 910 and the gasket 920 to each other. As another example, the second adhesive member 970 may be disposed on the front face or the rear face of the membrane 930 and may bond the membrane 930 to the bracket 910 and the bracket cover 940 to be located between the bracket 910 and the bracket cover 940. As another example, the third adhesive member 980 may be disposed between the bracket cover 940 and the seating portion 9061 of the support structure 905 so as to bond the bracket cover 940 to the support structure 905. For example, the first adhesive member 960 may have a ring shape corresponding to the shape of the edge face of the gasket 920, and the second adhesive member 970 may have a ring shape to correspond to the shape of the edge face of the membrane 930. The third adhesive member 980 may have a rectangular shape with a circular opening formed in the central region thereof to correspond to the edge shape of the bracket cover 940.

According to an embodiment, a film member (not illustrated) may be disposed on the rear face of the gasket. For example, the film member is disposed between the gasket 920 and the first adhesive member 960, and may provide a function of increasing the adhesive force of the adhesive member 960 for the gasket 920, which is made of an elastic material. The film member may be formed of a material including silicon.

Figure 25A:
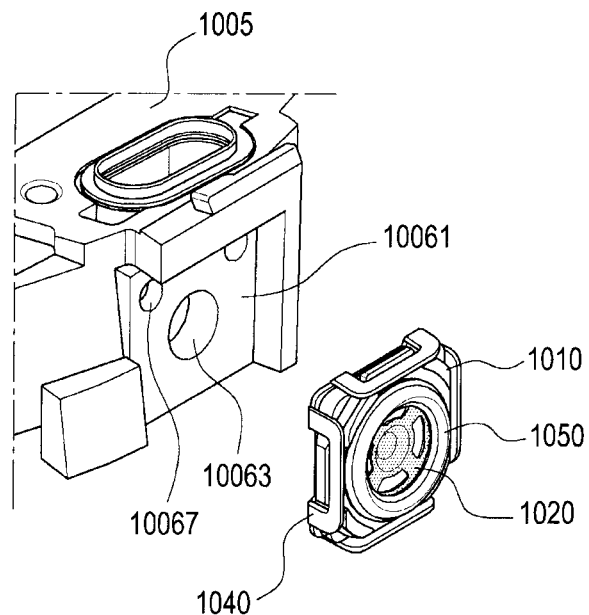
FIG. 25A is a view illustrating a waterproof structure 1000, which is viewed from the outside of a support structure 1005.
Figure 25B:
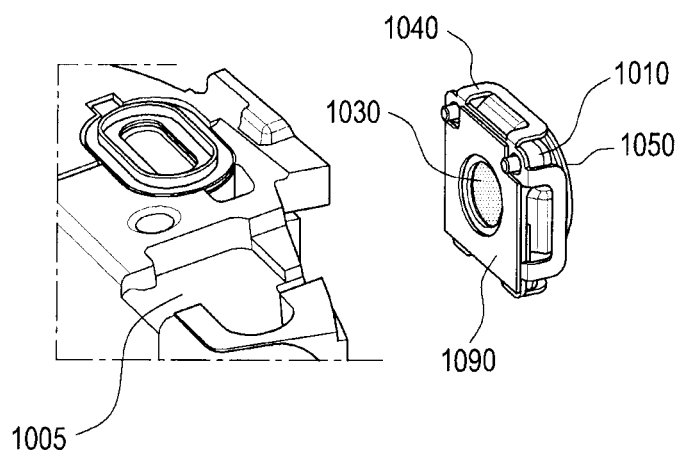
FIG. 25B is a view illustrating the waterproof structure 1000, which is viewed from the inside of the support structure 1005.

FIGS. 25A and 25B are views illustrating one side of a waterproof structure 1000 including a gasket 1020 and a support structure 1005 according to various embodiments. FIG. 25A is a view illustrating a waterproof structure 1000, which is viewed from the outside of a support structure 1005, and FIG. 25B is a view illustrating the waterproof structure 1000, which is viewed from the inside of the support structure 1005.

Figure 26:
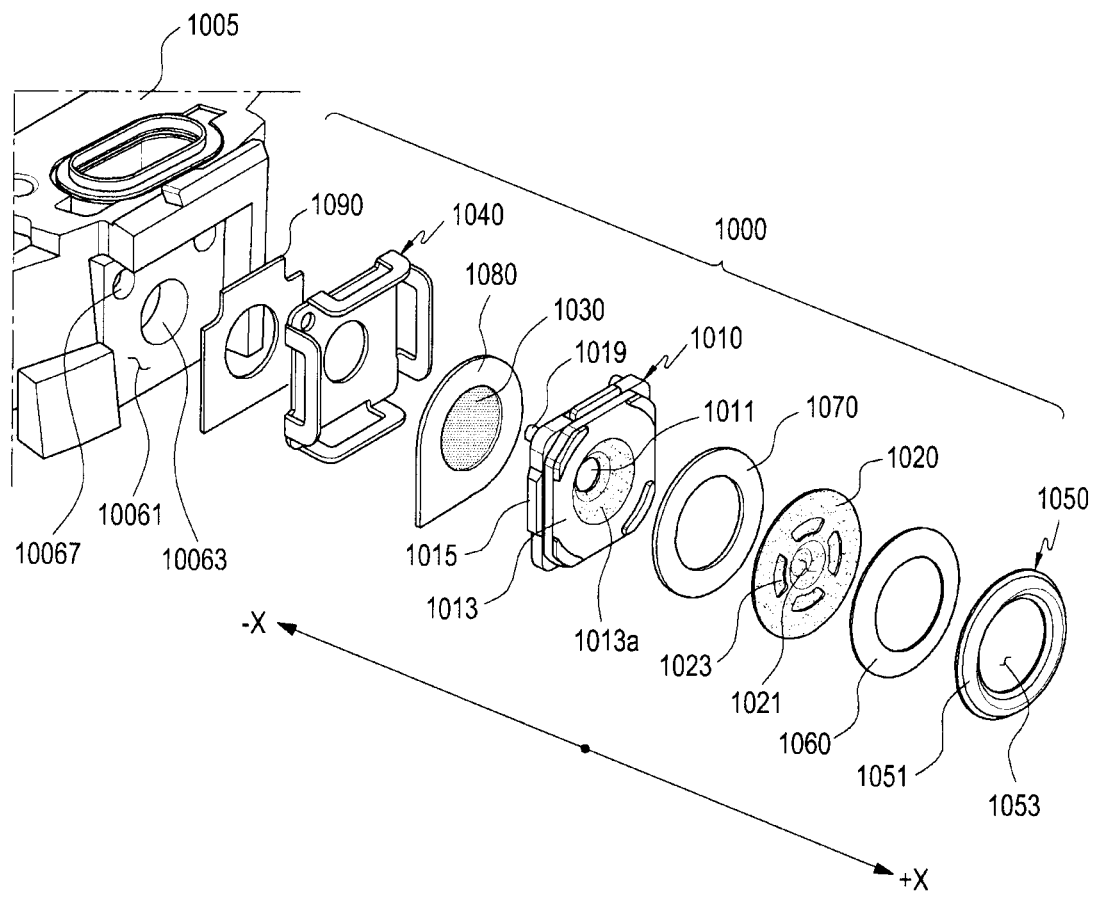
FIG. 26 is an exploded perspective view illustrating the waterproof structure 1000 according to various embodiments in a disassembled state.
Figure 27:
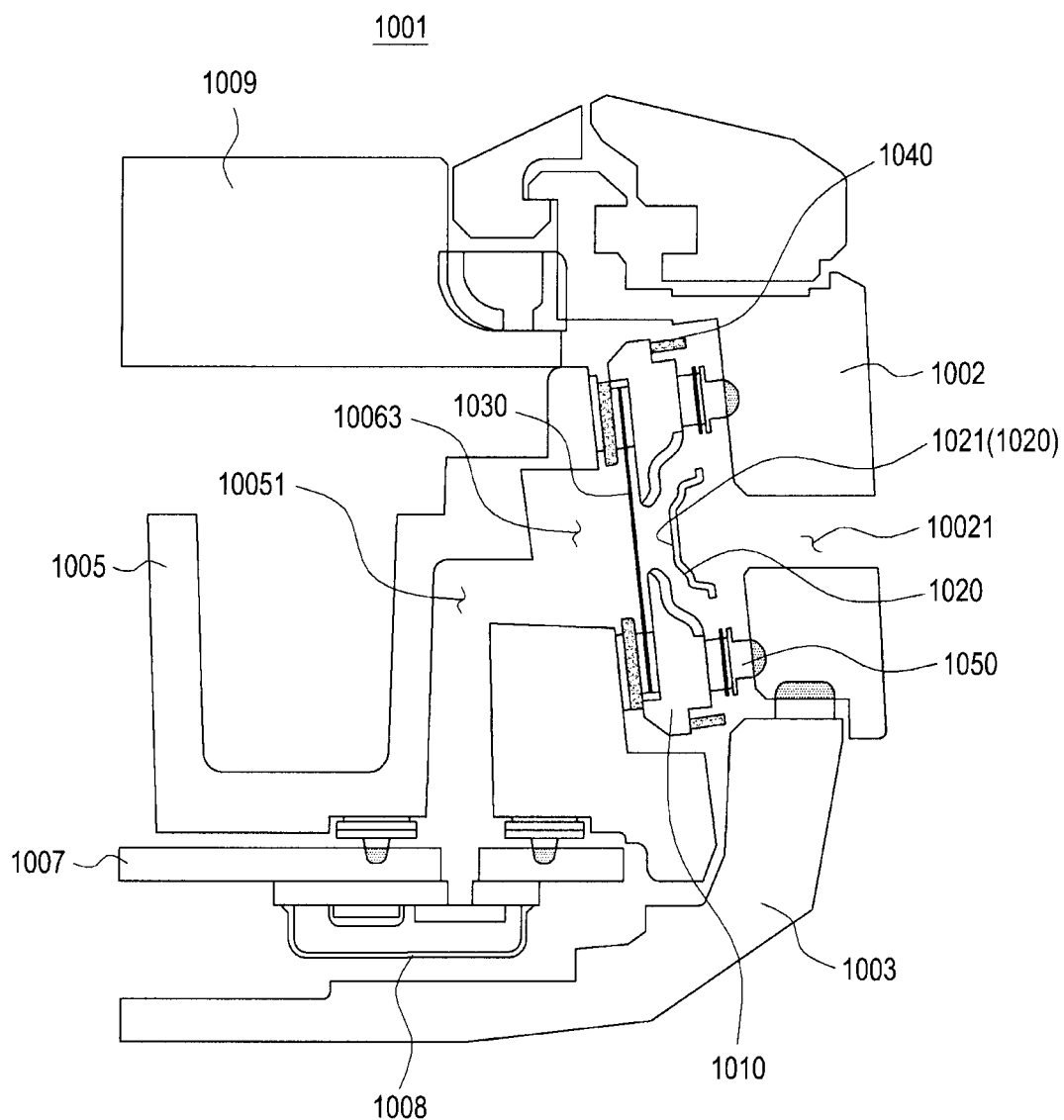
FIG. 27 is a side view illustrating an electronic device including the waterproof structure 1000 according to various embodiments.

FIG. 26 is an exploded perspective view illustrating the waterproof structure 1000 according to various embodiments in a disassembled state. FIG. 27 is a side view illustrating an electronic device including the waterproof structure 1000 according to various embodiments.

The housings 1002 and 1003, the display device 1009, the support structure 1005, and the waterproof structure 1000 of the electronic device 1001 of FIGS. 25A to 27 may be partly or wholly equal to the housings 902 and 903, the display device 909, the support structure 905, and the waterproof structure 900 of the electronic device 901 of FIGS. 22A to 24. Since the embodiment of FIGS. 25A to 27 is mostly applicable to the configuration of the previous embodiment (the embodiment of FIGS. 22A to 24), differences therebetween (e.g., a bracket 1010, a metal gasket 1020, and an elastic member 1050) will be mainly described.

Referring to FIGS. 25A to 27, the electronic device may include the housings 1002 and 1003, the display device 1009, an audio module 1008, and a main circuit board 1007. According to an embodiment, the housings 1002 and 1003 may include a first housing 1002 that covers the front and side faces, and a second housing 1003 that covers the rear and side faces and includes a first through hole. As another example, the housings 1002 and 1003 may include a first housing 1002 that covers the front and side faces and includes a first through hole 10021 and a second housing 1003 that covers the rear and side faces.

According to various embodiments, the electronic device may include a support structure 1005 including a second through hole 10063, and a waterproof structure 1000 including a gasket 1020 disposed between the support structure 1005 and the first housing 1002.

According to various embodiments, the support structure 1005 may include a conduit 10051 communicating with the inside through the second through hole 10063, and may include a seating portion 10061, on which the waterproof structure 1000 is seated, along the periphery of the second through hole 10063. As another example, at least one groove 10067 may be formed inside the seating portion 10061.

According to various embodiments, the waterproof structure 1000 may include the bracket 1010 including at least one hole 1011, the gasket 1020 disposed on one face of the bracket 1010, and a membrane 1030 disposed on the rear face of the bracket 1010. As another example, the waterproof structure 1000 may include the bracket cover 1040 that protects the membrane 1030 and is disposed to cover a partial region of the bracket 1010. As another example, the waterproof structure 1000 may include an elastic member 1050 that is disposed to face the gasket 1020 and overlaps the first housing 1002, thereby performing a sealing function. According to an embodiment, the gasket 1020 may include a metal material and may prevent the bracket 1010 and the elastic member 1050 from being pushed. As another example, the waterproof structure 1000 may include one or more adhesive members 1060, 1070, 1080, and 1090 disposed between the gasket 1020 and the bracket 1010 and/or between the bracket cover 1040 and the membrane 1030.

According to an embodiment, the bracket 1010 may include at least one hole 1011 connected to the second through hole 10063, and may include a seating face 1013, on which the gasket 1020 is seated, along the periphery of the hole 1011. The at least one hole 1011 may be formed to penetrate the bracket 1010 in the central region of the bracket 1010. The seating face 1013 may be formed in a shape corresponding to the shape of the rear face of the gasket 1020 (e.g., a closed curve). The peripheral region of the hole 1011 may be formed of an elastic material including a flexible material. The elastic region 1013a may provide a variable property to an external pressure (e.g., resilience). The peripheral face (e.g., the elastic region 1013a) adjacent to the hole 1011 may be formed as an inclined face. For example, the inclined face may be a face on which the protrusion of the metal gasket 1020, protruding in the fourth (−X) direction, abuts. When the inclined face is disposed to be in contact with the protrusion, it is possible to seal the gap between the inside of the support structure 1005 and the outside of the electronic device such that the water pressure applied from the outside is not transferred to the audio module 1008. The elastic region 1013a may be formed inward to have a predetermined inclination (e.g., between 0 and 90 degrees), and may increase the surface area to be in contact with the edge portion the protrusion of the gasket 1020, thereby providing a higher sealing force. As another example, the elastic region 1013a may be an uneven inclined face corresponding to the shape of the uneven protrusion of the metal gasket 1020.

According to an embodiment, one or more hooks 1015 may be disposed on the outer face of the bracket 1010. The hooks 1015 may pass through the openings in the bracket cover 1040, thereby inducing the fitting to the assembly portion of the support structure 1005. The hooks 1015 may include inclined faces rising from the rear face to the front face so as to be easily coupled to but not to be disengaged. According to an embodiment, the rear face of the bracket 1010 may include at least one protrusion 1019 so as to be supported on the seating face 10061 of the support structure 1005 without swaying while the bracket 1010 is seated thereon. For example, the protrusion 1019 protrudes from the rear face of the bracket 1010 in the fourth (−X) direction and is capable of being fitted into the groove in the support structure 1005 through the hole formed in the bracket cover 1040.

According to various embodiments, the metal gasket 1020 is positioned between the elastic member 1050 and the bracket 1010, and may prevent the centers of the holes 1011 from being deviated due to the variable property of the elastic material of the elastic member 1050 and the elastic region 1013a of the bracket 1010. The metal gasket 1020 may include a recess 1021 formed in the central portion thereof and at least one opening 1023 in the periphery of the recess 1021.

According to an embodiment, the recess 1021 may be recessed toward the second through hole 10069 so as to be disposed closely to the elastic region 1013a of the bracket 1010. For example, the recess 1021 is formed in the central region of the gasket 1020 such that one face of the recess, oriented in the third (+X) direction, may form a concave groove, and a convex protrusion may be formed on another face, oriented in the fourth (−X) direction opposite the third (+X) direction. The recess 1021 may be formed to have a size corresponding to the hole 1011 of the bracket such that, when no external pressure is applied, the recess 1021 may be spaced apart from the peripheral portion of the hole 1011 by a predetermined distance and when an external pressure is applied, the recess 1021 may be elastically moved and positioned to be in contact with the peripheral portion of the hole 1011. For example, when an external pressure is applied, the protrusion provides a valve function to block the second through hole 10069 in the support structure 1005, so that it is possible to prevent the pressure from being transferred to the audio module 1008 disposed in the inside. In an embodiment, the shape of the recess 1021 is circular but not limited thereto. The recess 1021 may be formed in various shapes such as a square, a triangle, or the like so as to correspond to the shape of the hole 1011. The recess 1021 may have a sloped face formed to have a predetermined inclination (e.g., between 0 degrees and 90 degrees) on the side face of the protrusion so as to correspond to the inclined face 1113a of the bracket 1010.

According to an embodiment, the opening 1023 is capable of providing a ventilation function between the conduit 10051 in the support structure 1005 and the outside of the electronic device and a passage function through which the sound of the audio module such as a microphone or a speaker is propagated to the outside. For example, the opening 1023 may be included in a plural number radially around the recess 1021 to be connected to the external environment in various directions, and may be formed to surround the recess 1021.

According to various embodiments, the elastic member 1050 may be located between the bracket 1010 and the outer wall of the first housing 1002, and may include a flexible material so as to provide a variable property to an external pressure (e.g., resilience). For example, the elastic member 1050 may be seated on and bonded to one face of the metal gasket 1020. The elastic member 1050 may include an outer rim 1051 and a hole 1053. According to an embodiment, the outer rim 1051 may be fixedly located between the metal gasket 1020 and a portion of the outer wall of the first housing 1002. For example, the outer rim 1051 may have a closed curved shape protruding in the third (+X) direction and may be disposed to overlap at least a portion of the inner wall of the first housing 1002 (e.g., the peripheral portion of the first through hole 10021). The outer rim 1051 is a flexible elastomer and is capable of providing sealing between the first housing 1002 and the bracket 1010, thereby preventing a fluid from entering the inside of the electronic device.

According to various embodiments, the membrane 1030 is located between the bracket 1010 and the bracket cover 1040 and may provide a watertight function capable of blocking an external fluid or the like. For example, the membrane 1030 may be disposed on a conduit 10051 directed to the audio module 1008 disposed in the lower end of the support structure 1005 and may include a material such as Gore-Tex. According to various embodiments, the bracket cover 1040 may be formed to enclose the rear and side faces of the bracket 1010, and the membrane 1030 may be inserted therein so as to protect the bracket cover 1040. In the center of the bracket cover 1040, a hole may be formed in the same line as the center of the second through hole 10063. The side face of the bracket cover 1040 may include at least one opening through which the hook 1015 of the bracket 1010 passes. As another example, a corner region of the bracket cover 1040 may include at least one hole through which the protrusion 1019 of the bracket 1010 is capable of passing.

According to various embodiments, the waterproof structure 1000 may include adhesive members 1060, 1070, 1080, and 1090 for bonding the bracket 1010, the gasket 1020, the membrane 1030, the bracket cover 1040, the elastic member 1050, etc. to each other.

Figure 28A:
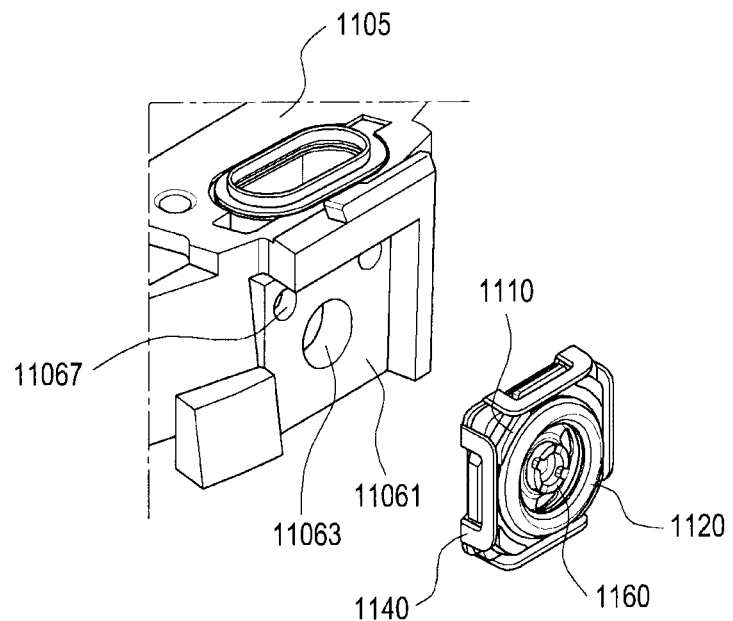
FIG. 28A is a view illustrating a waterproof structure 1100, which is viewed from the outside of a support structure 1105
Figure 28B:
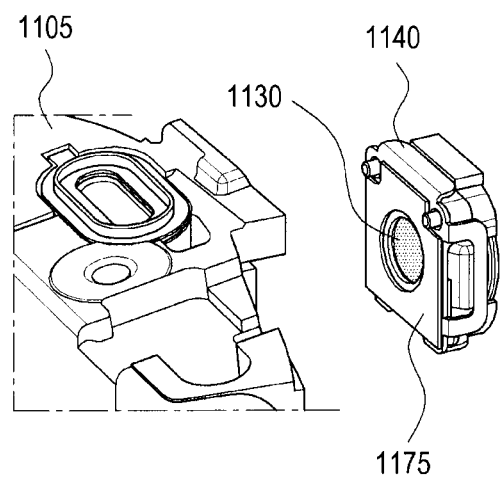
FIG. 28B is a view illustrating the waterproof structure 1100, which is viewed from the inside of the support structure 1105.

FIGS. 28A and 28B are views illustrating one side of a waterproof structure 1100 including a gasket 1160 and a support structure 1105 according to various embodiments. FIG. 28A is a view illustrating a waterproof structure 1100, which is viewed from the outside of a support structure 1105 and FIG. 28B is a view illustrating the waterproof structure 1100, which is viewed from the inside of the support structure 1105.

Figure 29:
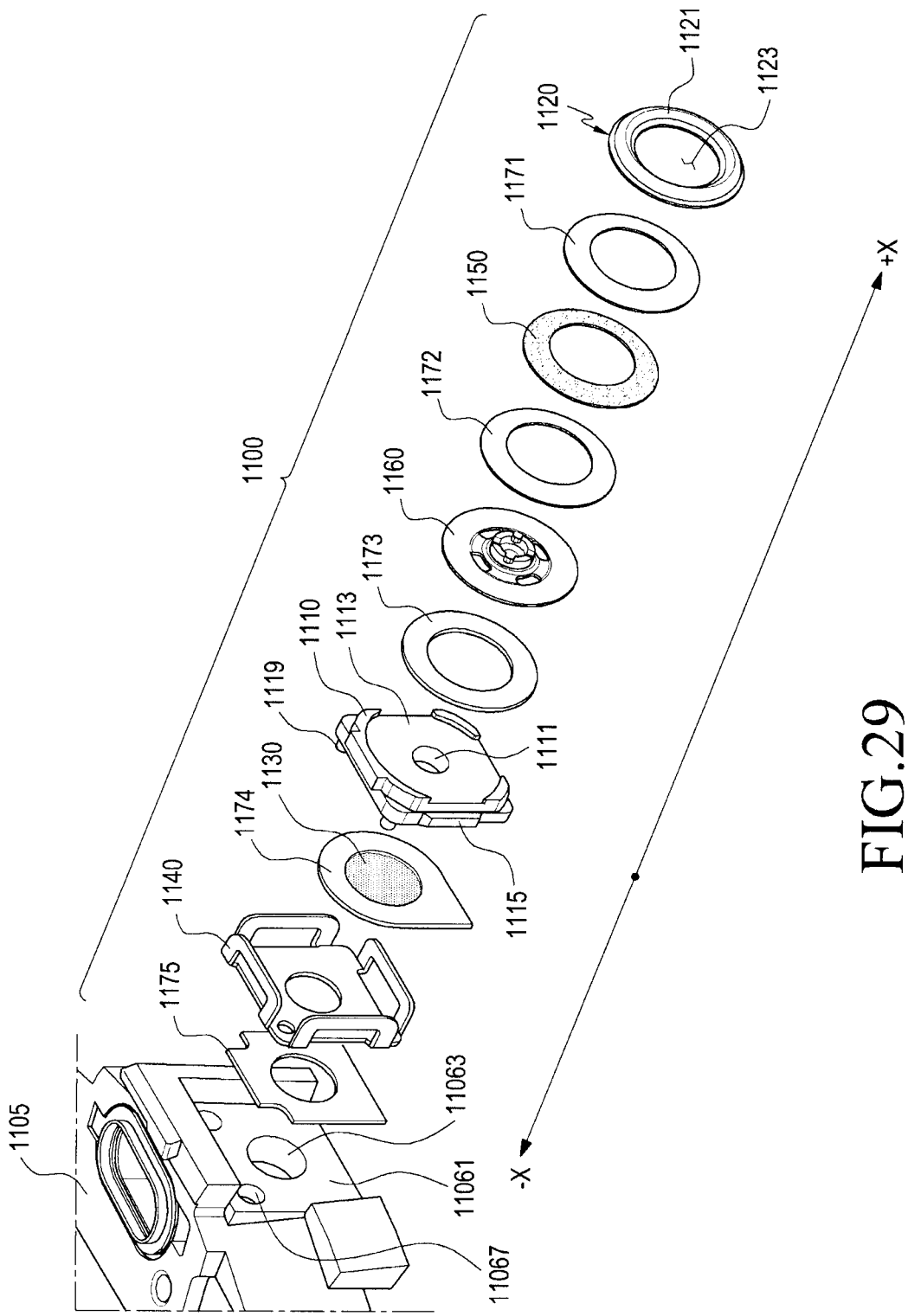
FIG. 29 is an exploded perspective view illustrating the waterproof structure 1100 according to various embodiments in a disassembled state.
Figure 30:
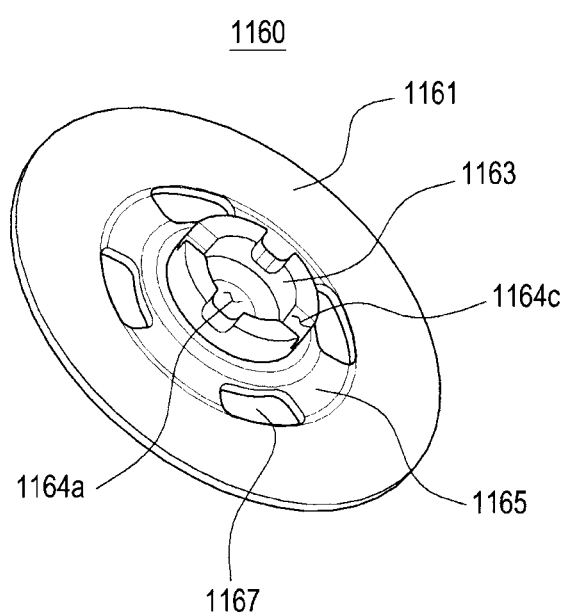
FIG. 30 is a perspective view illustrating a gasket 1160 of the waterproof structure 1100 according to various embodiments.
Figure 31:
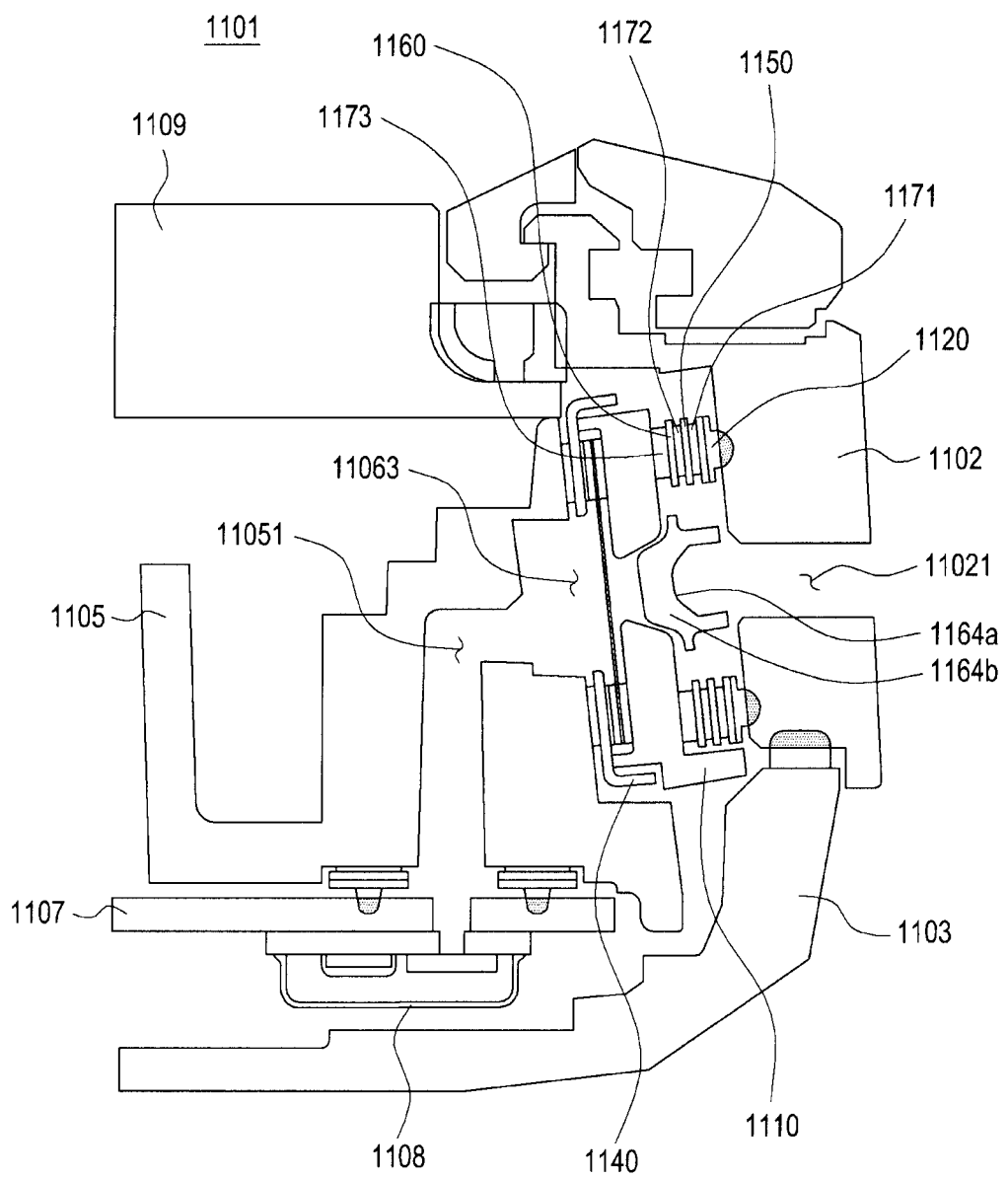
FIG. 31 is a side view illustrating an electronic device including the waterproof structure 1100 according to various embodiments.

FIG. 29 is an exploded perspective view illustrating the waterproof structure 1100 according to various embodiments in a disassembled state, and FIG. 30 is a perspective view illustrating a gasket 1160 of the waterproof structure 1100 according to various embodiments; FIG. 31 is a side view illustrating an electronic device including the waterproof structure 1100 according to various embodiments.

The housings 1102 and 1103, the display device 1109, the support structure 1105, and the waterproof structure 1100 of the electronic device 1101 of FIGS. 29 to 31 may be partly or wholly equal to the housings 1002 and 1003, the display device 1009, the support structure 1005, and the waterproof structure 1100 of the electronic device of FIGS. 25A to 27. Since the embodiment of FIGS. 29 to 31 is mostly applicable to the configuration of the previous embodiment (the embodiment of FIGS. 25A to 27), differences therebetween (e.g., a bracket 1110, a metal plate 1150, and a gasket 1160) will be mainly described.

Referring to FIGS. 29 to 31, the electronic device may include the housings 1102 and 1103, the display device 1109, an audio module 1108, and a main circuit board 1107. According to an embodiment, the housings 1102 and 1103 may include a first housing 1102 that covers the front and side faces, and a second housing 1103 that covers the rear and side faces and includes a first through hole. As another example, the housings 1102 and 1103 may include a first housing 1102 that covers the front and side faces and includes a first through hole 11021 and a second housing 1103 that covers the rear and side faces.

According to various embodiments, the electronic device may include a support structure 1105 including a second through hole 11063, and a waterproof structure 1100 including an elastic member 1120 disposed between the support structure 1105 and the first housing 1102.

According to various embodiments, the support structure 1105 may include a conduit 11051 communicating with the inside through the second through hole 11063, and may include a seating portion 11061, on which the waterproof structure 1100 is seated, along the periphery of the second through hole 11063. As another example, at least one groove 11067 may be formed inside the seating portion 11061.

According to various embodiments, the waterproof structure 1100 may include a bracket 1110 including at least one hole 1111, an elastic member 1120 disposed on one face of the bracket 1110, a membrane 1130 disposed on the rear face of the bracket 1110, and a bracket cover 1140 disposed to protect the membrane 1130 and to cover a partial region of the bracket 1110. As another example, the waterproof structure 1100 may include a metal plate 1150 disposed between the elastic member 1120 and the bracket 1110 so as to prevent the elastic member 1120 from being pushed, and a gasket 1160 configured to open/close at least one hole 1111 depending on an external pressure. As another example, the waterproof structure 1100 may include one or more adhesive members 1171, 1172, 1173, 1174, and 1175 disposed between the elastic member 1120 and the bracket 1110 and/or between the bracket cover 1140 and the membrane 1130.

According to an embodiment, the bracket 1110 may include at least one hole 1111 connected to the second through hole 11063, and may include a seating face 1113, on which the elastic member 1120 is seated, along the periphery of the hole 1111. The at least one hole 1111 may be formed to penetrate the bracket 1110 in the central region of the bracket 1110. The seating face 1113 may be formed in a shape corresponding to the shape of the rear face of the gasket 1160 (e.g., a closed curve). The circumferential face adjacent to the hole 1111 may be formed as an inclined face 1113a. For example, the inclined face 1113a may be a face on which the protrusion of the gasket 1160, protruding in the fourth (−X) direction, abuts. When the inclined face 1113a is disposed to be in contact with the protrusion, it is possible to seal the gap between the inside of the support structure 1105 and the outside of the electronic device such that the water pressure applied from the outside is not transferred to the audio module 1108. The inclined face 1113a may be formed inward to have a predetermined inclination (e.g., between 0 and 90 degrees), and increasing the amount of surface area in contact with the edge portion of the protrusion of the elastic member 1120, thereby providing improved sealing force. As another example, the inclined face 1113a may be a stepped or uneven inclined face corresponding to the shape of a stepped and uneven protrusion of the metal gasket 1160.

According to an embodiment, one or more hooks 1115 may be disposed on the outer face of the bracket 1110. The hooks 1115 may pass through the openings in the bracket cover 1140, thereby inducing fitting to the assembly portion of the support structure 1105. The hooks 1115 may include inclined faces rising from the rear face to the front face so as to be easily coupled to but not to be disengaged. According to an embodiment, the rear face of the bracket 1110 may include at least one protrusion 1119 so as to be supported on the seating face 11019 of the support structure 1105 without swaying while the bracket 1010 is seated thereon. For example, the protrusion 1119 protrudes from the rear face of the bracket 1110 in the fourth (−X) direction and is capable of being fitted into the groove 11067 in the support structure 1105 through the hole formed in the bracket cover 1140.

According to an embodiment, the gasket 1160 may be located between the seat face 1113 on the bracket 1110 and the metal plate 1150, and may include a flexible material so as to provide a variable property to an external pressure (e.g., resilience). The gasket 1160 may include an outer rim 1161, a recess portion 1163, and a connection portion 1165 including at least one opening 1167.

According to an embodiment illustrated in FIG. 30, the outer rim 1161 of the gasket 1160 may be fixedly located between the bracket 1110 and a portion of the metal plate 1150. For example, the outer rim 1161 is a flexible elastomer having a ring-shaped plate structure and is capable of providing sealing between the first housing 1102 and the bracket 1110, thereby preventing a fluid from entering the inside of the electronic device.

According to an embodiment, the recess portion 1163 is movably inserted between the first through hole 11021 of the first housing 1102 and the hole 1111 of the bracket 1110 and may be recessed toward the hole 1111. For example, the recess portion 1163 is formed in the central region of the gasket 1160 such that one face of the recess portion 1613, oriented in the third (+X) direction, may form a concave groove 1164a, and a convex protrusion 1164b may be formed on another face, oriented in the fourth (−X) direction opposite the third (+X) direction. The recess portion 1163 may be disposed between the first through hole 11021 and the second through hole 11063. The recess portion 1163 may be formed to have a size corresponding to the hole 1111 of the bracket 1110 such that, when no external pressure is applied, the recess 1021 may be spaced apart from the peripheral portion of the hole 1111 by a predetermined distance and when an external pressure is applied, the recess 1021 may be elastically moved and positioned to be in contact with the peripheral portion of the hole 1111. For example, when an external pressure is applied, the convex protrusion 1164b provides a valve function to block the second through hole 11063 in the support structure 1105, so that it is possible to prevent the pressure from being transferred to the audio module 1108 disposed in the inside.

As another example, at least one trough 1164c may be formed on the outer wall of the recess portion 1163. The at least one trough 1164c is a concave structure oriented in the fourth (−X) direction, and may form a passage, through which sound waves or the like transmitted from the outside pass before passing to the opening 1167 of the connection portion 1165 via the first through hole 11021. In an embodiment, the shape of the recess portion 1163 is circular but not limited thereto. The recess portion 523 may be formed in various shapes such as a square, a triangle, or the like so as to correspond to the shape of the hole 1111. The recess portion 1163 may have an inclined face formed to have a predetermined inclination (e.g., between 0 degrees and 90 degrees) on the side face of the protrusion 1164b so as to correspond to the inclined face 1113a of the bracket 1110.

According to an embodiment, the connection portion 1165 may be disposed between the outer rim 1161 and the recess portion 1163 to connect the outer rim 1161 and the recess portion 1163. The connection portion 1165 may include a flexible material, and the portion adjacent to the recess portion 1163 may be elastically moved as an external pressure is applied thereto. For example, the connection portion 1165 may form an inclined face such that the outer rim 1161 and the recess portion 1163 form different heights. For example, the inclined face may have a constant slope or be formed in a plurally stepped shape.

As another example, the connection portion 1165 may include at least one opening 1167. The opening 1167 is capable of providing a ventilation function between the conduit in the support structure 1105 and the outside of the electronic device and a passage function through which the sound of the audio module such as a microphone or a speaker is propagated to the outside. For example, the opening 1167 may be included in a plural number radially around the recess portion 1163 to be connected to the external environment in various directions, and may be formed to surround the periphery of the recess portion 1163.

According to various embodiments, the elastic member 1120 may be located between the bracket 1110 and the outer wall of the first housing 1102, and may include a flexible material so as to provide a variable property to an external pressure (e.g., resilience). For example, the elastic member 1120 may be seated on and bonded to one face of the metal plate 1150. The elastic member 1120 may include, for example, an outer rim 1121 and a hole 1123.

According to various embodiments, the metal plate 1150 is positioned between the elastic member 1120 and the gasket 1160, and may prevent the centers of the holes from being deviated due to the variable property of the elastic material of the elastic member 1120 and the gasket 1160. The center of the metal plate 1150 may be formed in a ring shape including an opening.

According to various embodiments, the membrane 1130 is located between the bracket 1110 and the bracket cover 1140 and may provide a watertight function capable of blocking an external fluid or the like. According to various embodiments, the bracket cover 1140 may be formed to enclose the rear and side faces of the bracket 1110, and the membrane 1130 may be inserted therein so as to protect the bracket cover 1040. In the center of the bracket cover 1140, a hole may be formed in the same line as the center of the second through hole 11063. As another example, the side face of the bracket cover 1140 may include an opening through which the hook 1115 of the bracket 1110 passes. As another example, a corner region of the bracket cover 1140 may include at least one hole through which the protrusion 1119 of the bracket 1110 is capable of passing.

According to various embodiments, the waterproof structure 1100 may include adhesive members 1171, 1172, 1173, 1174, and 1175 for bonding the bracket 1110, the elastic member 1120, the membrane 1130, the bracket cover 1140, etc. to each other.

Figure 32A:
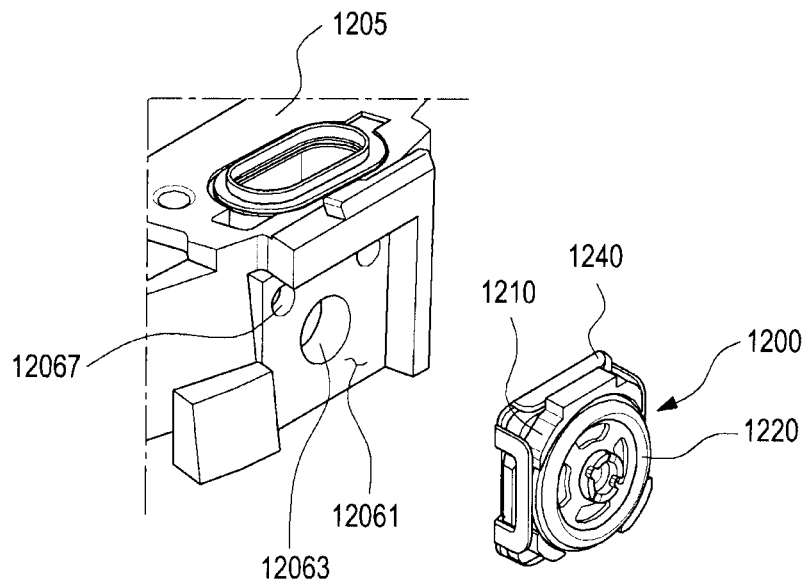
FIG. 32A is a view illustrating a waterproof structure 1200, which is viewed from the outside of a support structure 1205
Figure 32B:
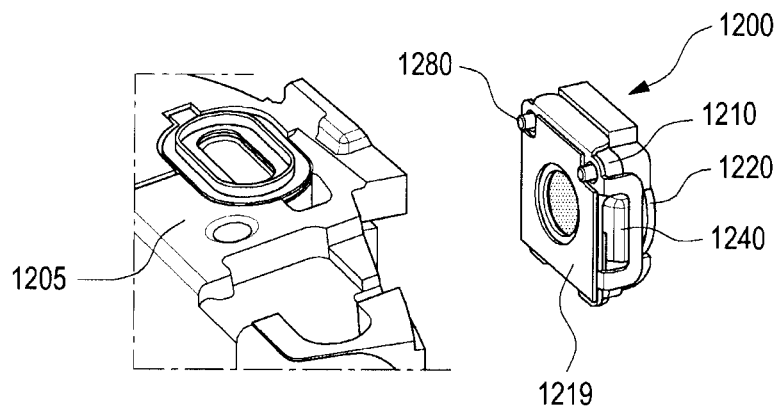
FIG. 32B is a view illustrating the waterproof structure 1200, which is viewed from the inside of the support structure 1205.

FIGS. 32A and 32B are views illustrating one side of a waterproof structure 1200 including a gasket 1220 and a support structure 1205 according to various embodiments. FIG. 32A is a view illustrating a waterproof structure 1200, which is viewed from the outside of a support structure 1205 and FIG. 32B is a view illustrating the waterproof structure 1200, which is viewed from the inside of the support structure 1205.

Figure 33:
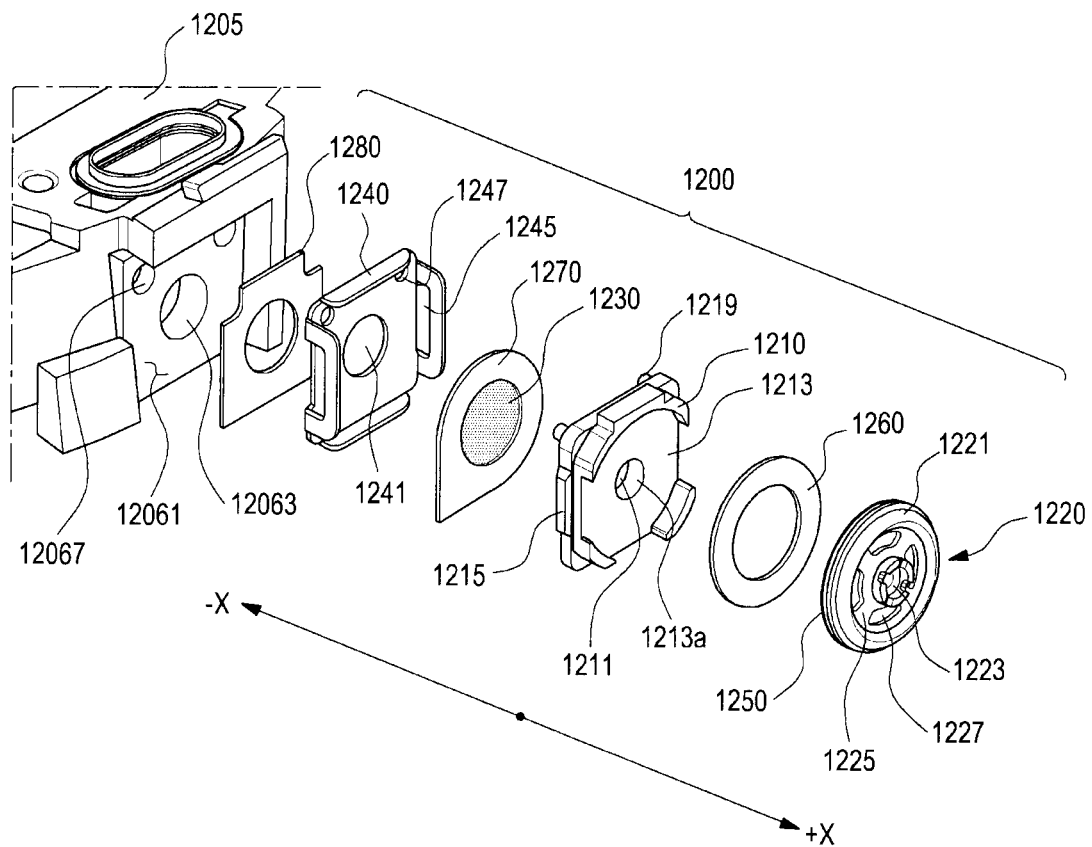
FIG. 33 is an exploded perspective view illustrating the waterproof structure 1200 according to various embodiments in a disassembled state.
Figure 34:
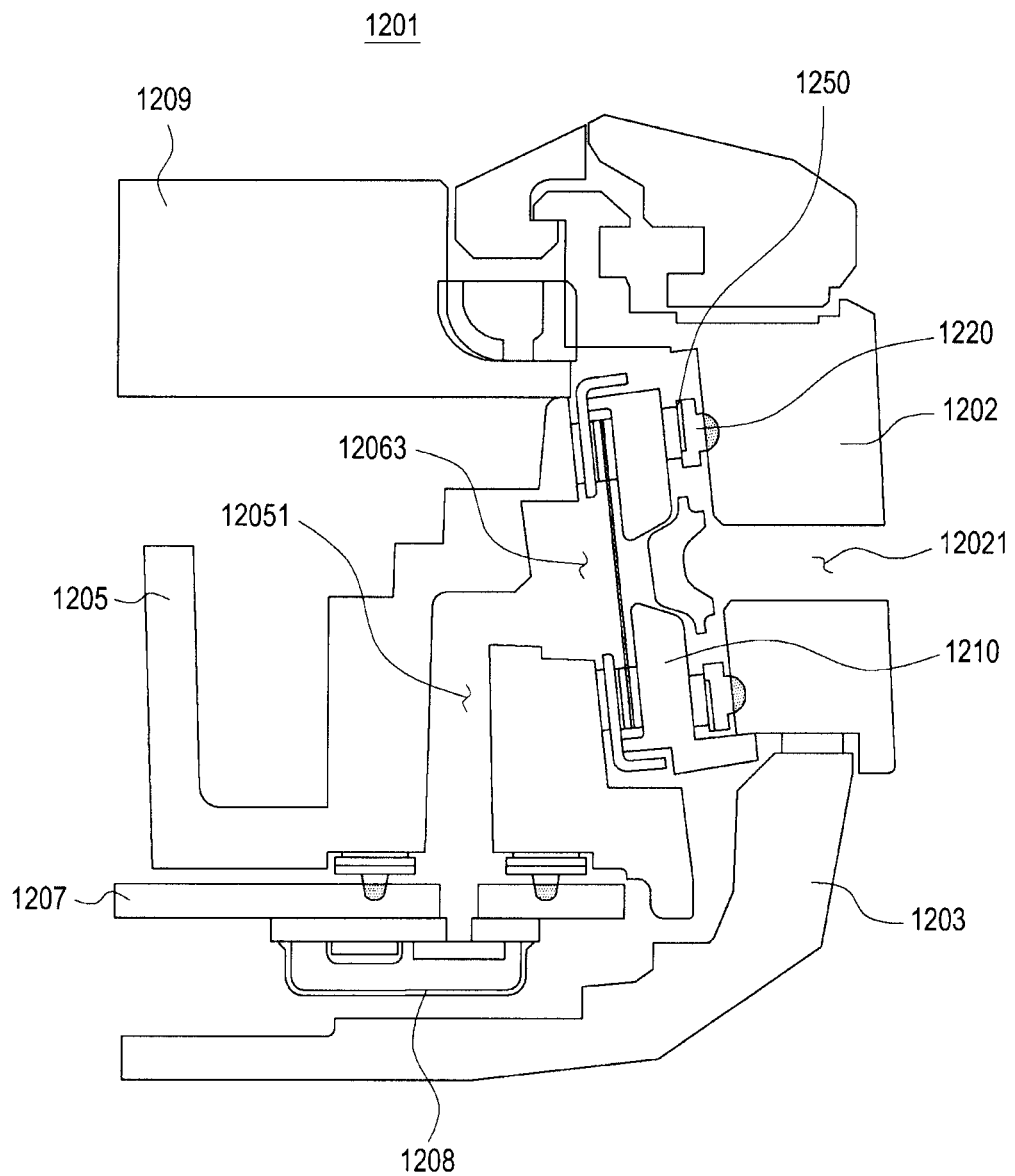
FIG. 34 is a side view illustrating an electronic device including the waterproof structure 1200 according to various embodiments.

FIG. 33 is an exploded perspective view illustrating the waterproof structure 1200 according to various embodiments in a disassembled state. FIG. 34 is a side view illustrating an electronic device including the waterproof structure 1200 according to various embodiments.

The housings 1202 and 1203, the display device 1209, the support structure 1205, and the waterproof structure 1200 of the electronic device 1201 of FIGS. 32A to 34 may be partly or wholly equal to the housings 902 and 903, the display device 909, the support structure 905, and the waterproof structure 900 of the electronic device 901 of FIGS. 22A to 24. Since an embodiment of FIGS. 32A to 34 is mostly applicable to the configuration of the previous embodiment (the embodiment of FIGS. 22A to 24), differences therebetween (e.g., a bracket 1210 and a gasket 1220 will be mainly described.

Referring to FIGS. 32A to 34, the electronic device may include the housings 1202 and 1203, the display device 1209, an audio module 1208, and a main circuit board 1207. According to an embodiment, the housings 1202 and 1203 may include a first housing 1202 that covers the front and side faces, and a second housing 1203 that covers the rear and side faces and includes a first through hole. As another example, the housings 1202 and 1203 may include a first housing 1202 that covers the front and side faces and includes a first through hole 12021 and a second housing 1203 that covers the rear and side faces.

According to various embodiments, the electronic device may include a support structure 1205 including a second through hole 12063, and a waterproof structure 1200 including a gasket 1220 disposed between the support structure 1205 and the first housing 1202.

According to various embodiments, the support structure 1205 may include a conduit 12051 communicating with the inside through the second through hole 12063, and may include a seating portion 12061, on which the waterproof structure 1200 is seated, along the periphery of the second through hole 12063. As another example, at least one groove 12067 may be formed inside the seating portion 12061.

According to various embodiments, the waterproof structure 1200 may include the bracket 1210 including at least one hole 1211, the gasket 1220 disposed on one face of the bracket 1210, and a membrane 1230 disposed on the rear face of the bracket 1210. As another example, the waterproof structure 1200 may include the bracket cover 1240 that protects the membrane 1230 and is disposed to cover a partial region of the bracket 1210. As another example, the waterproof structure 1200 may include one or more adhesive members 1260, 1270, and 1280 disposed between the gasket 1220 and the bracket 1210 and/or between the bracket cover 1240 and the membrane 1230.

According to various embodiments, the bracket 1210 may include at least one hole 1211 connected to the second through hole 12063, and may include a seating face 1213, on which the gasket 1220 is seated, along the periphery of the hole 1211. The at least one hole 1211 may be formed to penetrate the bracket 1210 in the central region of the bracket 1210, for example. The seating face 1213 may be formed in a shape corresponding to the shape of the rear face of the gasket 1220 (e.g., a closed curve). The circumferential face adjacent to the hole 1211 may be formed as an inclined face 1213a. For example, the inclined face 1213a may be a face on which the protrusion of the gasket 1220, protruding in the fourth (-X) direction, abuts. When the inclined face 913a is disposed to be in contact with the protrusion, it is possible to seal the gap between the inside of the support structure 1205 and the outside of the electronic device such that the water pressure applied from the outside is not transferred to the audio module 1208. The inclined face 1213a may be formed inward to have a predetermined inclination (e.g., between 0 and 90 degrees), and may increase the surface area to be in contact with the edge portion the protrusion of the gasket 1220, thereby providing a higher sealing force.

According to an embodiment, one or more hooks 1215 may be disposed on the outer face of the bracket 1210. The hooks 1215 may pass through the openings 1245 of the bracket cover 1240, thereby inducing fitting to the bracket cover 1240.

According to an embodiment, the rear face of the bracket 1210 may include at least one protrusion 1219 so as to be supported on the seating face 1213 of the support structure 1205 without swaying while the bracket 1010 is seated thereon. For example, the protrusion 1219 protrudes from the rear face of the bracket 1210 in the fourth (-X) direction and is capable of being fitted into the groove 12067 in the support structure 1205 through the hole 1247 formed in the bracket cover 1240.

According to various embodiments, the gasket 1220 may be located between the bracket 1210 and the outer wall of the first housing 1202, and may include a flexible material so as to provide a variable property to an external pressure (e.g., resilience). For example, the gasket 1220 may be fixedly disposed by being seated on the seating face 1213 of the bracket 1210. The gasket 1220 may include an outer rim 1221, a recess portion 1223, a connection portion 1225, and at least one opening 1227.

The structure of the outer rim 1221, the recess portion 1223, the connection portion 1225, and the opening 1227 may be the same as or similar to the embodiment of the gasket 1160 of FIG. 30.

According to an embodiment, a metal plate 1250 may be disposed on the rear face of the gasket 1220. The metal plate 1250 is capable of preventing the centers of the holes from being deviated from each other due to the variable property of the elastic material of the gasket 1220. The metal plate 1250 may be formed in a shape including an opening at the center thereof (e.g., a ring shape). According to an embodiment, the gasket 1220 and the metal plate 1250 may be manufactured separately from each other and then bonded to each other, or may be formed integrally.

According to various embodiments, the membrane 1230 is located between the bracket 1210 and the bracket cover 1240 and may provide a watertight function capable of blocking an external fluid or the like. For example, the membrane 1230 may be disposed on a conduit 12051 directed to the audio module 1208 disposed in the lower end of the support structure 1205 and may include a material such as Gore-Tex. The membrane 1230 is a thin film, and an adhesive member 1270 may be disposed on the front or rear face of the membrane 930 in order to fixedly dispose the membrane 930 on one face of the bracket 1210 or the bracket cover 1240.

According to various embodiments, the bracket cover 1240 may be formed to enclose the rear and side faces of the bracket 1210, and the membrane 1230 may be inserted therein so as to protect the bracket cover 1040. The center of the bracket cover 1240 may be provided with a hole 1241 formed in the same line as the center line of the second through hole 12063 and the side face thereof may have openings 1245 through which the hooks 1215 of the bracket 1210 pass. As another example, a corner region of the bracket cover 1240 may include at least one hole 1247 through which the protrusion 1219 of the bracket 1210 is capable of passing.

According to various embodiments, the waterproof structure 1200 may include adhesive members 1260, 1270, and 1280 for bonding the bracket 1210, the gasket 1220, the membrane 1230, the bracket cover 1240, etc. to each other.

Figure 35:
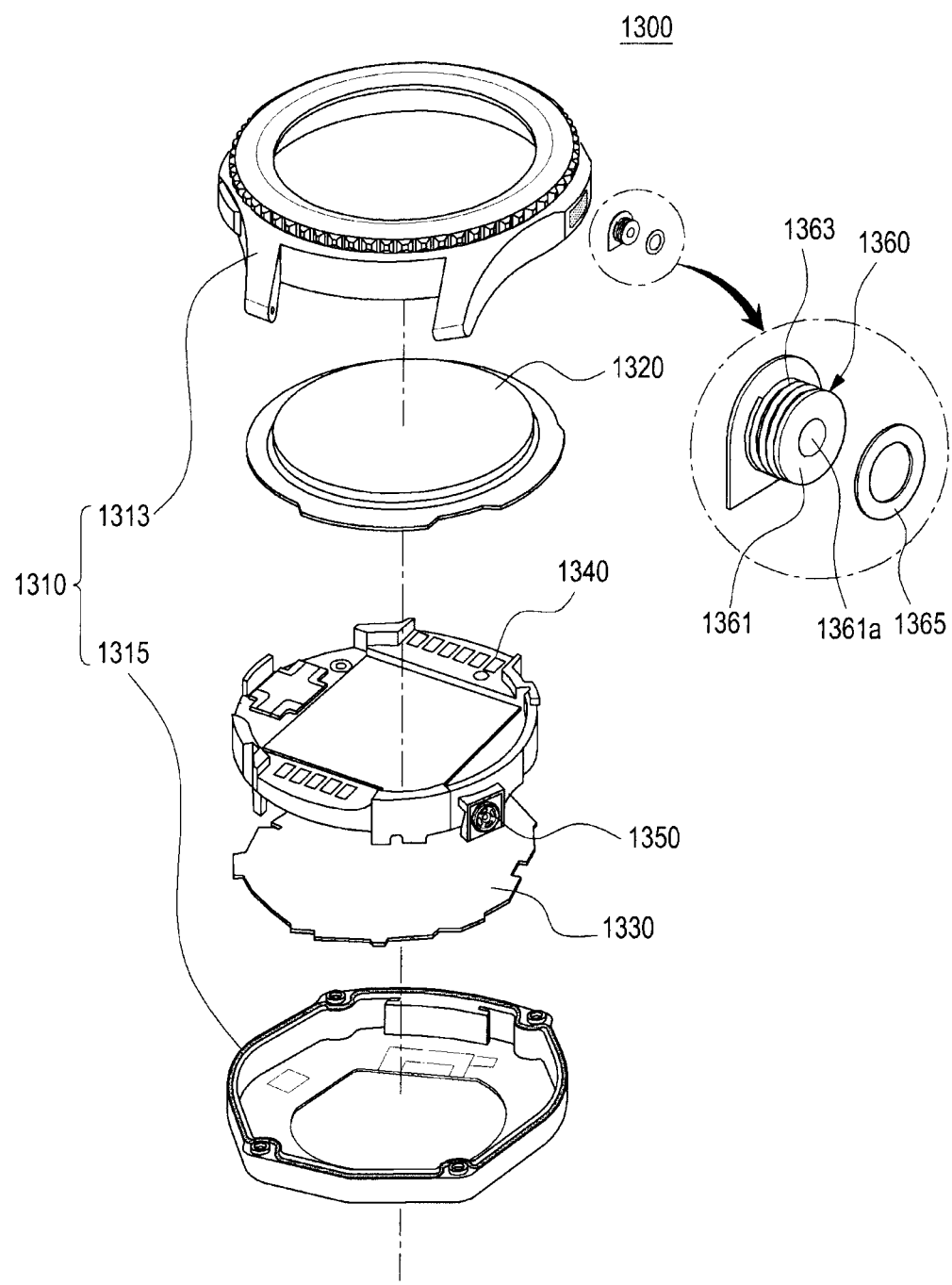
FIG. 35 is an exploded perspective view illustrating the internal structure of an electronic device 1300 according to one of various embodiments.
Figure 36:
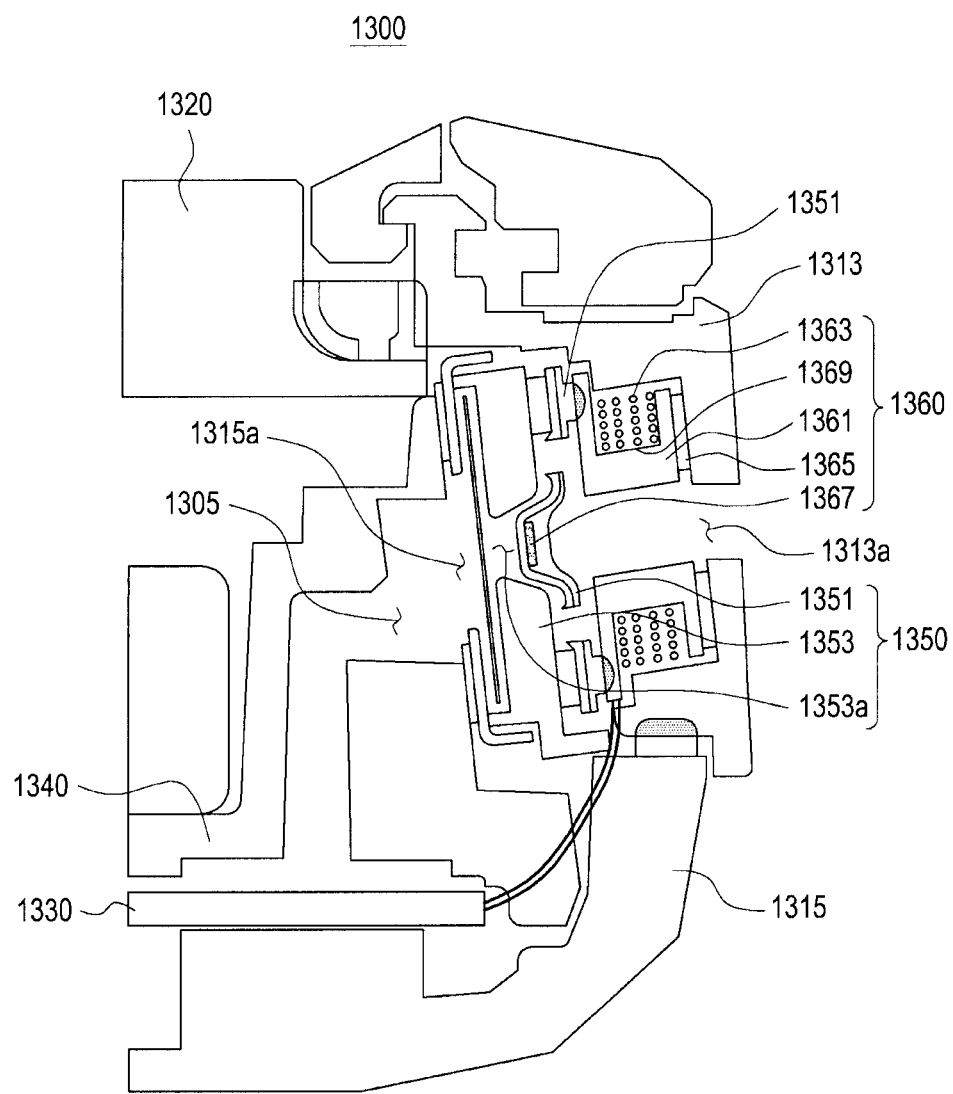
FIG. 36 is a side view illustrating an electronic device including a waterproof structure 1350 and an electromagnetic module 1360 according to various embodiments.

FIG. 35 is an exploded perspective view illustrating the internal structure of an electronic device 1300 according to one of various embodiments. FIG. 36 is a side view illustrating an electronic device including a waterproof structure 1350 and an electromagnetic module 1360 according to various embodiments.

According to one of various embodiments, an electronic device 1300 may include a housing 1310, a display device 1320, an electronic component, a main circuit board 1330, a support structure 1340, or a waterproof structure 1350. The housing 1310, the display device 1320, the electronic component, and the main circuit board 1330 of the electronic device 1300 illustrated in FIGS. 32 and 33 may be partly or wholly the same as the housing 210, the display device 240, and the main circuit board 260 illustrated in FIG. 3.

Referring to FIGS. 35 and 36, the housing 1310 of the electronic device 1300 may include a first housing 1313 that covers the front and side faces, and a second housing 1315 that covers the rear and side faces and includes a first through hole. As another example, the housing 1310 may include a first housing 1313 that covers the front and side faces and includes a first through hole 1313a and a second housing 1315 that covers the rear and side faces.

According to various embodiments, the electronic device 1300 may include a support structure 1340 including a second through hole 1315a, and a waterproof structure 1350 including a gasket 1351 disposed between the support structure 1340 and the first housing 1313. According to an embodiment of FIGS. 35 and 36, since the support structure 1340 and the waterproof structure 1350 are mostly applied to the configurations of the previous embodiments, the differences (e.g., an electromagnet module 1360) will be mainly described.

According to various embodiments, the electromagnet module 1360 is located between the first housing 1313 and the waterproof structure 1350, and is capable of removing the fluid (e.g., water) introduced into a conduit between the first through hole 1313a and the second through hole 1315a. The electromagnet module 1360 may include a metal bracket 1361, a coil 1363, and an adhesive member 1365.

According to an embodiment, the metal bracket 1361 may include at least one hole 1361a connected to the second through hole 1315a, and may include a recess region 1369, on which the coil 1303 is wound and seated, along the periphery of the hole 1361a. The at least one hole 1361a may be formed to penetrate the metal bracket 1361 in the central region of the metal bracket 1361. The recessed region 1369 may be formed in a ring shape such that the coil 1363 is capable of being spirally wound therearound. As another example, one side of the metal bracket 1361 may be provided with an electric wire that is capable of being electrically connected to the main circuit board 1330 disposed inside the housing. One face of the metal bracket 1361 faces the first housing 1313 and the other face of the metal bracket 1361 overlaps the protruding portion of the gasket 1351 of the waterproof structure 1350.

According to an embodiment, the coil 1363 may include, for example, an enamel coil, and may be repeatedly wound in a recess region of the metal bracket 1361 so as to form an electromagnet. A magnet 1367 may be disposed in the central region of the gasket 1350 so as to form an electromagnetic force in the formed electromagnet.

According to an embodiment, the electromagnet module 1360 may include an adhesive member 1365 for bonding the metal bracket 1361 to the inner face of the first housing 1313. For example, the adhesive member 1365 may be in the form of a ring corresponding to the shape of the edge face of the metal bracket 1361. Hereinafter, the operation of the electromagnet module will be described.

According to various embodiments, the electromagnet module 1360 may be operated so as to open and close the conduit 1305 of the support structure 1340 before a substance, such as a fluid, flows into the inside of the electronic device 1300. According to an embodiment, the electronic device 1300 may operate the electromagnet module 1360 based on a switch, a sensor, or the like. For example, when the user turns on the switch or a substance such as fluid is detected by the sensor mounted in the electronic device 1300, current is capable of flowing in the coil 1363 of the electromagnet module 1360, and a magnetic force directed toward the magnet 1367 is capable being generated. The magnet 1367 is capable of moving the gasket 1351 toward the hole 1353a of the bracket 1353 by the generated magnetic force, thereby preventing the fluid from flowing into the conduit 1305. The electronic device 1300 is capable of releasing the operation of the electromagnet module 1360 based on the switch of the electromagnet module 1360 or the sensor.

According to various embodiments, the electromagnet module 1360 is capable of removing a substance such as a fluid or the like when the substance has already flowed into a region inside the electronic device 1300. For example, since the portion where the gasket 1351 having the waterproof structure blocks the fluid flowing into the conduit 1305 is the second through hole 1315a in the support structure 1340, a part of the fluid or the like may be introduced between the housing 1310 and the supporting structure 1340. When the electromagnet module 1360 is operated, current is capable of flowing in the coil 1363 and heat may be generated by the resistance due to an increase in the amount of current flowing in the coil. The heat generated through the coil 1363 is capable of being transferred to the metal bracket 1361 surrounding the coil 1363 and the temperature rise of the metal bracket 1361 is capable of evaporating the fluid around the waterproof structure. When all of the fluid is evaporated, the electronic device 1300 may deactivate the electromagnet module 1360 using the switch of the electromagnet module 1360 or a sensor of the electronic device.

According to various embodiments, an electronic device (e.g., the electronic device 200 of FIG. 2A) may include: a housing (e.g., the housing 210 of FIG. 3) including an outer wall (e.g., the outer wall 2151 of FIG. 4), an inner space (e.g., the inner space 2153 of FIG. 4) at least partially defined by the outer wall, and a first through hole (e.g., the first through hole 2155 of FIG. 4) formed in the inner space through the outer wall; an audio module (e.g., the audio module 250 of FIG. 3) located in the inner space adjacent to the first through hole; a support structure (e.g., the support structure 270 of FIG. 5A) located in the inner space between the audio module and the first through hole and including a second through hole (e.g., the second through hole 271 of FIG. 5A); and a waterproof structure located in the inner space between the support structure and the outer wall and including a flexible gasket (e.g., the gasket 300 of FIG. 5A). The gasket may include: an outer rim (e.g., the outer rim 310 of FIG. 5A) fixed between the support structure and a portion of the outer wall around the first through hole; a recess portion (e.g., the recess portion 320 of FIG. 5A) interposed and moveable between the first through hole and the second through hole, such that the recessed portion is recessed toward the second through-hole; and a connection portion (e.g., the connection portion 330 of FIG. 5A) formed between the rim and the recess portion, such that the connection portion includes at least one opening (e.g., the opening 331 of FIG. 5A) around the recess portion, such that the opening and the second through-hole form at least part of a sound path between the audio module and the first through-hole when no liquid from outside the housing presses against the recess portion.

According to various embodiments, the audio module of the electronic device includes a sound generating membrane located in the inner space.

According to various embodiments, the connection portion may be located between the support structure and a portion of the outer wall around the first through hole while being spaced apart from the support structure and a portion of the outer wall.

According to various embodiments, the recess portion may block the second through hole when the fluid compresses the recess portion from the outside of the housing.

According to various embodiments, the support structure may include a seating face formed around the second through hole and configured to seat thereon a waterproof structure including the gasket, and the seating face may include an inclined face inclined toward an inner conduit.

According to various embodiments, the waterproof structure (e.g., the waterproof structure 500 of FIG. 10) may further include: a bracket (e.g., the bracket 510 of FIG. 10) provided with a seating face (e.g., the seating face 513 of FIG. 10), on which the flexible gasket (e.g., the gasket 520 of FIG. 10) is seated, and including at least one hole connected to the inner conduit of the support structure; and a membrane (e.g., the membrane 530 of FIG. 10) located opposite the gasket with the bracket interposed therebetween and having a size different from a size of the gasket.

According to various embodiments, the seating face of the bracket is formed adjacent to a periphery of the hole and includes an inclined face inclined toward the hole, and when the fluid outside the housing compresses the recess portion, a protrusion protruding toward the second through hole of the recess portion may come into close contact with the inclined face to block the hole of the bracket.

According to various embodiments, the electronic device may further include: an adhesive member (e.g., the adhesive members 540, 550, and 560 of FIG. 10) disposed on one face of the gasket or the membrane so as to bond the gasket or the membrane to the bracket.

According to various embodiments, the support structure (e.g., the support structure 605 of FIG. 13) may include a seating portion (e.g., the seating portion 606 of FIG. 13) formed around the second through hole (e.g., the second through hole 6063 of FIG. 13) and configured to seat thereon at least a portion of the waterproof structure, and the seating portion may include: a first seating face (e.g., the first seating face 6061 of FIG. 13) configured to dispose thereon an auxiliary gasket (e.g., the gasket 680 of FIG. 13) that includes an opened central portion and an outer rim protruding toward the first through hole; and a second seating face (e.g., second seating face 6062 of FIG. 13) configured such that the bracket (e.g., the bracket 610 of FIG. 13), in which the gasket (e.g., the gasket 620 of FIG. 13) and the membrane (e.g., membrane 630 of FIG. 13) are coupled, is inserted into and seated on the second seating face.

According to various embodiments, the bracket (e.g., the bracket 710 of FIG. 17) may include, on a side face thereof, at least one hook (e.g., the hook 715 of FIG. 17) protruding outwardly, and the at least one hook may be fitted to at least one assembly portion disposed on a side face of the seating portion of the support structure.

According to various embodiments, the electronic device may further include: a bracket cover (e.g., the bracket cover 840 of FIG. 23) disposed between the bracket (e.g., the bracket 910 of FIG. 23) and the support structure (e.g., the support structure 905 of FIG. 23), and formed to surround the rear and side faces of the bracket, the bracket cover being configured to protect the membrane (e.g., the membrane 930 of FIG. 23) inserted therein; and the bracket cover includes a hole (e.g., the hole 841 of FIG. 23) formed in the central region and on a same line as the center of the second through hole, and at least one opening (e.g., the opening 945 of FIG. 23) disposed in the outer region, a hook (e.g., the hook 915 of FIG. 23) of the bracket passing through and being coupled to the opening.

According to various embodiments, the electronic device may further include at least one hole recessed inwardly around the second through-hole of the support structure, and at least one protrusion protruding from the rear face of the bracket may penetrate the bracket cover so as to induce fitting to the at least one hole of the support structure, thereby supporting the waterproof structure.

According to various embodiments, the electronic device may further include: an elastic member disposed between the gasket and a portion of the outer wall around the first through hole and having an outer rim, protruding toward the first through hole, being disposed to overlap with a portion of the outer wall.

According to various embodiments, the gasket may include a metal material, the bracket may include at least one hole connected to the conduit and an elastic region, on which the gasket is seated, along the periphery of the hole, and the resilient region may include an inclined face recessed toward the center of the bracket and may provide a variable property to an external pressure in a seated state.

According to various embodiments, the recess portion (e.g., the recess portion 1163 of FIG. 30) of the gasket (e.g., the gasket 1160 of FIG. 30) may include a groove recessed toward the second through hole and an outer wall surrounding a periphery of the groove, and the outer wall may include at least one trough (e.g., the trough 1164c of FIG. 30) that is stepped toward the second through hole.

According to various embodiments, the waterproof structure may further include a metal plate disposed between the gasket and the elastic member so as to prevent the gasket from being pushed, and the metal plate and the elastic member may include at least one hole, through which the recess portion of the gasket passes.

According to various embodiments, an electronic device may include: a housing including at least one first through hole exposed to an outside; an audio module disposed within the housing; a support structure disposed adjacent to the audio module and including a second through hole corresponding to the first through hole; and a waterproof structure disposed on a seating portion formed around the second through hole of the support structure. The waterproof structure may include: a bracket including at least one hole connected to a conduit connected to an inside of the support structure; a flexible gasket including an outer rim disposed to perform sealing along a periphery of the first through hole and a recess portion made of an elastic material and at least partially inserted into the hole of the bracket to be movable by being compressed by an external fluid; and a membrane disposed opposite the flexible gasket with the bracket interposed therebetween.

According to various embodiments, the seating face formed adjacent to a periphery of the hole of the bracket may include an inclined face inclined to a center of the hole, and when the fluid outside the housing compresses the recess portion, a protrusion protruding toward the conduit of the recess portion may come into close contact with the inclined face to block the hole of the bracket.

According to various embodiments, the electronic device may further include: a bracket cover formed to enclose the rear and side faces of the bracket and configured to protect the membrane inserted therein; the bracket cover may include a hole formed in the central region and on a same line as the center of the second through hole, and at least one opening disposed in the outer region, a hook, disposed on a side face the bracket, passing through and being coupled to the opening.

According to various embodiments, the electronic device may further include: an adhesive member disposed on one face of the gasket or the membrane so as to bond the gasket and the membrane to the bracket; and a film member disposed between the adhesive member and the gasket so as to reinforce an adhesive force between the adhesive member and the gasket.

While the present disclosure has been shown and described with reference to certain embodiments thereof, it will be apparent to those skilled in the art that the camera lens module according to the present disclosure is not limited to these embodiments, and various changes in form and details may be made therein without departing from the present disclosure as defined by the appended claims.

What is claimed is:

1. An electronic device, comprising:
a housing including an outer wall at least partially defining an inner space, the outer wall defining a first through hole allowing access into the inner space;
an audio module disposed within the inner space;
a support structure disposed within the inner space between the audio module and the first through hole, wherein the support structure includes a second through-hole; and
a waterproof structure disposed within the inner space between the support structure and the outer wall, wherein the waterproof structure includes a flexible gasket,
wherein the flexible gasket includes:
an outer rim fixed between the support structure and a portion of the outer wall as to circumferentially surround the first through hole;
a recess portion movably interposed between the first through hole and the second through hole, wherein the recess portion is oriented towards the second through-hole; and
a connection portion formed between the rim and the recess portion, wherein the connection portion includes at least one opening is around the recess portion, such that the at least one opening and the second through-hole form at least part of a path through which sound can propagate between the audio module and the first through hole in the absence of pressure applied against the recess portion by an external liquid.

2. The electronic device of claim 1, wherein the audio module includes a sound generating membrane located in the inner space.

3. The electronic device of claim 1, wherein the connection portion is disposed between the support structure and the portion of the outer wall surrounding the first through hole, the connection portion further disposed distally from the support structure and the portion of the outer wall.

4. The electronic device of claim 2, wherein the recess portion blocks the second through hole when pressure is applied against the recess portion by the external liquid.

5. The electronic device of claim 1, wherein the support structure includes a seating face formed around the second through hole, the seating face configured to receive seating of the waterproof structure including the flexible gasket, and the seating face includes an inclined face that is inclined towards an inner conduit of the support structure.

6. The electronic device of claim 1, wherein the waterproof structure further includes:
a bracket including a second seating face on which the flexible gasket is seated and including at least one hole connected to an inner conduit of the support structure; and
a membrane located opposite the flexible gasket such that the bracket is interposed between the membrane and the flexible gasket, the membrane including a size different from a size of the flexible gasket.

7. The electronic device of claim 6, wherein the seating face of the bracket is formed adjacent to a periphery of the hole and includes an inclined face inclined toward the hole, and
when the external liquid applies pressure to the recess portion as to compress the recess portion, a protrusion projecting toward the second through hole of the recess portion contacts the inclined face as to block the hole of the bracket.

8. The electronic device of claim 6, further comprising:
an adhesive member disposed on one face of the flexible gasket or the membrane, bonding the gasket or the membrane to the bracket.

9. The electronic device of claim 6, wherein the support structure includes a seating portion formed around the second through hole and configured to receiving seating of at least a portion of the waterproof structure, and
wherein the seating portion includes:
a first seating face configured to receive thereon an auxiliary gasket including an opened central portion and an outer rim protruding toward the first through hole; and
a second seating face configured to receive seating of the bracket, in which the gasket and the membrane are coupled, when the bracket is inserted into the second seating face.

10. The electronic device of claim 9, wherein the bracket includes at least one hook protruding outwardly, the at least one hook disposed on a side face of the bracket, and
wherein the at least one hook is fitted to at least one assembly portion disposed on a side face of the seating portion of the support structure.

11. The electronic device of claim 6, further comprising:
a bracket cover disposed between the bracket and the support structure, the bracket cover formed to enclose rear and side faces of the bracket as to protect the membrane when the membrane is inserted into the second seating face,
wherein the bracket cover includes a hole substantially aligned to a central axis of the second through hole, and at least one coupler is disposed on edges of the bracket cover such that a hook of the bracket passes through an opening in the coupler to secure the bracket cover to the bracket.

12. The electronic device of claim 11, wherein the support structure further includes at least one hole recessed inwardly around the second through-hole, and
wherein at least one protrusion protruding from the rear face of the bracket penetrates the bracket cover to couple to the at least one hole of the support structure, to provide support for the waterproof structure.

13. The electronic device of claim 12, further comprising:
an elastic member disposed between the flexible gasket and the portion of the outer wall, the elastic member disposed around the first through hole and having an outer rim protruding toward the first through hole, and disposed to overlap with a portion of the outer wall.

14. The electronic device of claim 13, wherein the gasket includes a metal material,
wherein the bracket further includes at least one hole connected to the inner conduit and includes an elastic region, on which the flexible gasket is seated along a periphery of the at least one hole, and
wherein the bracket further includes a resilient region including an inclined face recessed toward a center of the bracket and providing a variable property for adjusting to any pressure.

15. The electronic device of claim 13, wherein the recess portion of the flexible gasket includes a groove recessed toward the second through hole, and an outer wall surrounding a periphery of the groove, and
wherein the outer wall includes at least one trough stepped towards the second through hole.

16. The electronic device of claim 15, wherein the waterproof structure further includes a metal plate disposed between the flexible gasket and the elastic member so as to obstruct any pushing of the flexible gasket, and
wherein the metal plate and the elastic member include at least one hole, through which the recess portion of the flexible gasket passes.

17. An electronic device comprising:
a housing including at least one first through hole opening to an exterior of the electronic device;
an audio module disposed within the housing;
a support structure disposed adjacent to the audio module and including a second through hole corresponding to the first through hole; and
a waterproof structure disposed on a seating portion formed around the second through hole of the support structure,
wherein the waterproof structure includes:
a bracket including at least one hole connected to a conduit in communication with an interior of the support structure;
a flexible gasket including an outer rim disposed to provide a seal along a periphery of the first through hole, and a recess portion made of an elastic material at least partially inserted into the at least one hole of the bracket such that the recess portion is moveable according to compression by an external fluid; and a membrane disposed opposite the flexible gasket such that the bracket is interposed between the membrane and the flexible gasket.

18. The electronic device of claim 17, further comprising:
a seating face formed adjacent to a periphery of the at least one hole of the bracket, the seating face including an inclined face inclined towards a center of the at least one hole of the bracket, and
wherein when the external fluid causes compression of the recess portion, a protrusion of the flexible gasket protruding toward the conduit contacts the inclined face as to block the at least one hole of the bracket.

19. The electronic device of claim 17, further comprising:
a bracket cover enclosing rear and side faces of the bracket as to protect the membrane inserted into the bracket,
wherein the bracket cover includes a hole substantially aligned to a central axis of the second through hole, and at least one coupler is disposed on edges of the bracket cover such that a hook of the bracket passes through an opening in the coupler to secure the bracket cover to the bracket.

20. The electronic device of claim 19, further comprising:
an adhesive member disposed on one face of the flexible gasket or the membrane so as to bond the flexible gasket and the membrane to the bracket; and
a film member disposed between the adhesive member and the gasket so as to reinforce adhesion between the adhesive member and the flexible gasket.

* * * * *